(12) United States Patent
Wang et al.

(10) Patent No.: US 12,414,437 B2
(45) Date of Patent: Sep. 9, 2025

(54) DISPLAY MODULE, DISPLAY, AND TERMINAL

(71) Applicant: Huawei Technologies Co., Ltd., Shenzhen (CN)

(72) Inventors: Lei Wang, Dongguan (CN); Liangyu Pan, Dongguan (CN); Yujie Dong, Dongguan (CN); Rui Zhang, Wuhan (CN); Yuan Yan, Shenzhen (CN); Haiyan Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 447 days.

(21) Appl. No.: 18/003,632

(22) PCT Filed: Mar. 19, 2021

(86) PCT No.: PCT/CN2021/081850
§ 371 (c)(1),
(2) Date: Dec. 28, 2022

(87) PCT Pub. No.: WO2022/001208
PCT Pub. Date: Jan. 6, 2022

(65) Prior Publication Data
US 2023/0263021 A1  Aug. 17, 2023

(30) Foreign Application Priority Data
Jun. 29, 2020 (CN) .......................... 202010605443.9

(51) Int. Cl.
*H10K 59/121* (2023.01)
*H04M 1/02* (2006.01)
(Continued)

(52) U.S. Cl.
CPC ........ *H10K 59/121* (2023.02); *H04M 1/0264* (2013.01); *H10K 59/353* (2023.02);
(Continued)

(58) Field of Classification Search
CPC .... H10K 59/121; H10K 59/353; H10K 59/65; H10K 59/875; H10K 59/131;
(Continued)

(56) References Cited

U.S. PATENT DOCUMENTS

2018/0196536 A1*  7/2018  Li ........................ H10K 59/40
2021/0408200 A1   12/2021  Zhao et al.

FOREIGN PATENT DOCUMENTS

| CN | 109994536 A | 7/2019 |
| CN | 110444125 A | 11/2019 |
| CN | 110491918 A | 11/2019 |

* cited by examiner

Primary Examiner — James R Greece
Assistant Examiner — Jose M Diaz
(74) Attorney, Agent, or Firm — Conley Rose, P.C.

(57) ABSTRACT

A display system includes a substrate, a plurality of first signal lines and a plurality of second signal lines. The second signal lines and the first signal lines are extended in a same direction and are insulated from each other. At least one first subpixel array is also disposed on the substrate. A first signal line group is disposed between adjacent rows of subpixels in the first subpixel array, and the first signal line group includes one first signal line and one second signal line. The first signal line and the second signal line in at least one first signal line group on the substrate overlap in a region having a transparent subpixel.

20 Claims, 55 Drawing Sheets

(51) Int. Cl.
*H10K 59/131* (2023.01)
*H10K 59/35* (2023.01)
*H10K 59/65* (2023.01)
*H10K 59/80* (2023.01)

(52) U.S. Cl.
CPC .......... *H10K 59/65* (2023.02); *H10K 59/875* (2023.02); *H10K 59/131* (2023.02)

(58) Field of Classification Search
CPC . H10K 59/122; H04M 1/0264; G09G 3/3208; G09G 3/3275; G09G 2300/0426
See application file for complete search history.

DISPLAY MODULE, DISPLAY, AND TERMINAL

CROSS-REFERENCE TO RELATED APPLICATIONS

This is a U.S. National Stage of International Patent Application No. PCT/CN2021/081850 filed on Mar. 19, 2021, which claims priority to Chinese Patent application Ser. No. 202010605443.9 filed on Jun. 29, 2020. Both of the aforementioned applications are hereby incorporated by reference in their entireties.

TECHNICAL FIELD

This application relates to the field of display technologies, and in particular, to a display module, a display, and a terminal.

BACKGROUND

With development of display technologies, a terminal device with a high screen-to-body ratio becomes a more popular product type for consumers. An optical component needs to occupy a specific region on a display surface of the terminal device, to collect light on a side on which the display surface of the terminal device is located. Therefore, the optical component becomes a main factor that limits full-screen display of the terminal device.

For a terminal device including an organic light-emitting diode (organic light-emitting diode, OLED) display, because the OLED display is not completely opaque, to simplify a structure, a commonly used design is that an optical component is disposed on the back of the OLED display, and a light-receiving surface of the optical component faces the back of the OLED display. However, because transmittance of the OLED display is only approximately 3% to 5%, when the optical component is disposed on the back of the OLED display, performance of the optical component is affected because an amount of light emitted into the optical component is small.

Therefore, how to improve transmittance of the OLED display when the optical component is disposed on the back of the OLED display, to increase the amount of light received by the optical component becomes a technical problem that needs to be resolved by a person skilled in the art.

SUMMARY

Embodiments of this application provide a display module, a display, and a terminal, to resolve a problem of how to improve transmittance of an OLED display.

To achieve the foregoing objective, the following technical solutions are used in embodiments.

According to a first aspect, a display module is provided, and includes: a substrate; a plurality of first signal lines, disposed on the substrate and insulated from each other; a plurality of second signal lines, disposed on the substrate and insulated from each other, where the plurality of second signal lines and the plurality of first signal lines extend in a same direction, are insulated from each other, and are alternately disposed; and at least one first subpixel array, disposed on the substrate, where the first subpixel array includes a plurality of first light-emitting subpixels and a plurality of transparent subpixels, and the plurality of first light-emitting subpixels and the plurality of transparent subpixels are arranged in a mixed manner; a first signal line group is disposed between adjacent rows of subpixels in the first subpixel array, and the first signal line group includes one first signal line and one second signal line; and orthographic projections of the first signal line and the second signal line in at least one first signal line group on the substrate overlap in a region in which the transparent subpixel is located. In this embodiment of this application, structures of the first signal line and the second signal line are adjusted, so that the orthographic projections of the first signal line and the second signal line on the substrate overlap in the region in which the transparent subpixel is located, and an overlapping part of the orthographic projections of the first signal line and the second signal line does not form a diffraction grating. Therefore, based on the structures of the first signal line and the second signal line provided in this embodiment of this application, a quantity of diffraction gratings formed between the first signal line and the second signal line can be reduced, to reduce impact of the first signal line and the second signal line on light emitted into a display, and improve transmittance of the display. In addition, after the orthographic projections of the first signal line and the second signal line on the substrate overlap in the region in which the transparent subpixel is located, an area of the region in which the transparent subpixel is located may be increased, blocking of the region in which the transparent subpixel is located by the first signal line and the second signal line is reduced, and transmittance of the region in which the transparent subpixel is located is improved. Therefore, a daylighting effect of an optical component can be further improved.

Optionally, the first signal line includes at least one first sub-signal line and at least one second sub-signal line, the first sub-signal line and the second sub-signal line are disposed in parallel, and the first sub-signal line and the second sub-signal line are alternately connected along an extension direction of the first signal line; and in a same first signal line group, an orthographic projection of the second sub-signal line on the substrate overlaps an orthographic projection of the second signal line on the substrate, where the second sub-signal line is located in the region in which the transparent subpixel is located, and the second sub-signal line and the second signal line are disposed at different layers. Therefore, a short circuit between the second sub-signal line and the second signal line is avoided.

Optionally, the. second sub-signal line and the first sub-signal line are disposed at different layers. Therefore, the second sub-signal line may be jumpered to another film layer, to improve performance of insulating the second sub-signal line from the second signal line.

Optionally, the first sub-signal line and the second signal line are disposed at a same layer or at different layers. Therefore, the line is more flexible.

Optionally, the second sub-signal line and the first sub-signal line are disposed at a same layer; and in the same first signal line group, an orthographic projection of the first sub-signal line on the substrate and the orthographic projection of the second signal line on the substrate are disposed side by side. Therefore, the second sub-signal line and the first sub-signal line may be disposed at a same layer, and do not need to be jumpered to another film layer, to improve line flexibility.

Optionally, the display further includes a plurality of third signal lines that are insulated from each other and a plurality of fourth signal lines that are insulated from each other; the plurality of third signal lines and the plurality of fourth signal lines are parallel, are insulated from each other, and are alternately disposed on the substrate; and the second sub-signal line is disposed at a same layer as the third signal line and/or the fourth signal line, where the first signal line intersects the third signal line. Therefore, when the second sub-signal line is prepared, the third sub-signal line and the fourth signal line may be prepared in a same process, to simply a preparation process. In addition, the third sub-signal line and the fourth signal line are disposed at the same layer as the second sub-signal line, so that a quantity of insulation layers and a quantity of conducting layers between layers can be reduced, and the display is lightened and thin.

Optionally, the display further includes a plurality of third signal lines that are insulated from each other and a plurality of fourth signal lines that are insulated from each other; the plurality, of third signal lines and the plurality of fourth signal lines extend in a same direction, are insulated from each other, and are alternately disposed on the substrate; a second signal line group is disposed between adjacent rows of subpixels in the first subpixel array, and the second signal line group includes one third signal line and one fourth signal line; and orthographic projections of the third signal line and the fourth signal line in at least one second signal line group on the substrate overlap in the region in which the transparent subpixel is located, where the first signal line intersects the third signal line. Therefore, transmittance of the display is further improved.

Optionally, the third signal line includes at least one third sub-signal line and at least one fourth sub-signal line, the third sub-signal line and the fourth sub-signal line are disposed in parallel, and the third sub-signal line and the fourth sub-signal line are alternately connected along an extension direction of the third signal line; and in a same second signal line group, an orthographic projection of the fourth sub-signal line on the substrate overlaps an orthographic projection of the fourth signal line on the substrate, where the fourth sub-signal line is located in the region in which the transparent subpixel is located, and the fourth sub-signal line and the fourth signal line are disposed at different layers. Therefore, performance of insulating the fourth sub-signal line from the fourth signal line is improved.

Optionally, the fourth sub-signal line and the third sub-signal line are disposed at different layers. Therefore, performance of insulating the fourth sub-signal line from the third sub-signal line is improved.

Optionally, the third sub-signal line and the fourth signal line are disposed at a same layer or at different layers. Therefore, line layout flexibility is improved.

Optionally, the fourth sub-signal line and the third sub-signal line are disposed at a same layer; and in the same second signal line group, an orthographic projection of the third sub-signal line on the substrate and the orthographic projection of the fourth signal line on the substrate are disposed side by side. Therefore, the fourth sub-signal line and the third sub-signal line do not need to be jumpered to another film layer, to improve line flexibility.

Optionally, each fourth sub-signal line is located in the region in which the transparent subpixel is located, and adjacent fourth sub-signal lines are connected through the third sub-signal line; and an orthographic projection of the first signal line on the substrate does not overlap the orthographic projection of the fourth sub-signal line on the substrate, and crosses an orthographic projection of the third sub-signal line on the substrate. Therefore, one fourth sub-signal line is located in a region in which the transparent subpixel is located, and does not cross a signal line (for example, the first signal line) located at a boundary between two adjacent transparent subpixels.

Optionally, the fourth sub-signal line and the second signal line are disposed at a same layer. Therefore, when the second sub-signal line is prepared, the fourth sub-signal line may be prepared in a same process, to simply a preparation process. In addition, the fourth sub-signal line and the second sub-signal line are disposed at the same layer, so that a quantity of insulation layers and a quantity of conducting layers between layers can be reduced, and the display is lightened and thin.

Optionally, the fourth sub-signal line is disposed at a different layer from the first signal line and the second signal line; and the fourth sub-signal line penetrates, along an extension direction of the fourth sub-signal line, at least one region in which the transparent subpixel is located. Therefore, a quantity of fourth sub-signal lines can be reduced, to reduce complexity of the third signal line.

Optionally, each second sub-signal line is located in the region in which the transparent subpixel is located, and the first sub-signal line crosses a boundary between two adjacent transparent subpixels; and the orthographic projection of the third signal line on the substrate and/or the orthographic projection of the fourth signal line on the substrate do/does not overlap the orthographic projection of the second sub-signal line on the substrate, and cross/crosses the orthographic projection of the first sub-signal line on the substrate. Therefore, one second sub-signal line is located in a region in which the transparent subpixel is located, and does not cross signal lines (for example, the third signal line and the fourth signal line) located at a boundary between two adjacent transparent subpixels.

Optionally, when the first signal line includes at least one first sub-signal line and at least one second sub-signal line, the second sub-signal line is disposed at a same layer as the third signal line or the fourth signal line. Therefore, cabling flexibility is improved.

Optionally, when the first signal line includes at least one first sub-signal line and at least one second sub-signal line, the second sub-signal line is disposed at a different layer from the third signal line and the fourth signal line; and the second sub-signal line penetrates, along an extension direction of the second sub-signal line, at least one region in which the transparent subpixel is located. Therefore, a quantity of second sub-signal lines is reduced, to reduce complexity of the first signal line.

Optionally, the first signal line and the third signal line are mutually a grid line and a data line. Therefore, cabling flexibility is improved.

Optionally, the plurality of first light-emitting subpixels are grouped into a plurality of light-emitting pixels, and each light-emitting pixel includes at least three first light-emitting subpixels that are adjacent to each other and that are respectively used to display three primary colors; the plurality of transparent subpixels are grouped into a plurality of transparent pixels, where a quantity of transparent subpixels included in each transparent pixel is equal to a quantity of first light-emitting subpixels included in the light-emitting pixel, and a plurality of transparent subpixels in a same transparent pixel are adjacent to each other; and in the first subpixel array, the light-emitting pixels and the transparent pixels are arranged in a mixed manner. Therefore, a daylighting effect of the optical component can be improved.

Optionally, a same row of first light-emitting subpixels arranged along the extension direction of the first signal line is connected to a same first signal line and a same second signal line; and/or a same row of first light-emitting subpixels arranged along the extension direction of the third signal line is connected to a same third signal line and a same fourth signal line. Therefore, a drive signal may be transmitted from one side of the display to the first signal line and the second signal line, and/or the third signal line and the fourth signal line, that is, unilateral driving is implemented, and a structure is simple.

Optionally, the first light-emitting subpixel includes a drive circuit and a light-emitting component, and the drive circuit is connected to the first signal line, the second signal line, and the light-emitting component; and the light-emitting component includes a first cathode, a first anode, and an electroluminescent layer located between the first cathode and the first anode; and the transparent subpixel includes a second cathode, and the second cathode and the first cathode are of an integrated structure. Therefore, the first cathode and the second cathode are of an entire-layer structure, and patterning can be reduced.

Optionally, the first signal line and the second signal line each are a data line DL or a power voltage line ELVDD.

Optionally, if a pixel drive circuit of the display module is of a 7T1C structure, the first signal line and the second signal line are any two different signal lines in an enabling signal line EM, a first grid scanning signal line N-1, a second grid scanning signal line N, an initial signal line Vint, and a reverse power voltage line ELVSS.

Optionally, a pixel drive circuit of the display module is of a 2T1C structure, the first signal line and the second signal line each are any signal line in a second grid scanning signal line N, an initial signal line Vint, and a reverse power voltage line ELVSS.

Optionally, the third signal line and the fourth signal line are mutually a data line DL and a power voltage line ELVDD.

Optionally, if a pixel drive circuit of the display module is of a 7T1C structure, the third signal line and the fourth signal line are any two different signal lines in an enabling signal line EM, a first grid scanning signal line N-1, a second grid scanning signal line N, an initial signal line Vint, and a reverse power voltage line ELVSS.

Optionally, if a pixel drive circuit of the display module is of a 2T1C structure, the third signal line and the fourth signal line each are any signal line in a second grid scanning signal line N, an initial signal line Vint, and a reverse power voltage line ELVSS.

According to a second aspect of this application, a display is provided, and includes the display module described above.

According to a third aspect of this application, a terminal is provided, and includes the display described above. The terminal further includes an optical component. The optical component is disposed on the back of the display, a light-receiving surface of the optical component faces the display, and an orthographic projection of the optical component on the display is located in a region in which a first subpixel array is located. Therefore, the terminal uses the foregoing display, so that a daylighting effect of the optical component can be improved.

REFERENCE NUMERALS

1: Terminal; 2: Display; 3: Middle frame; 4: Housing; 5: Cover; 6: Optical component; 10: First signal line; 20: Second signal line; 100: First signal line group; 23: Substrate; 25: Pixel delimiting layer; 251: Retaining wall; 252: First opening.

DESCRIPTION OF EMBODIMENTS

The following describes technical solutions in embodiments of this application with reference to accompanying drawings in embodiments of this application. It is clear that the described embodiments are merely a part rather than all of embodiments of this application.

Terms such as "first" and "second" mentioned below are merely intended for a purpose of description, and shall not be understood as an indication or implication of relative importance or implicit indication of a quantity of indicated technical features. Therefore, a feature limited by "first" or "second" may explicitly or implicitly include one or more features. In the descriptions of this application, unless otherwise stated, "a plurality of" means two or more.

In addition, in this application, position terms such as "top" and "bottom" are defined relative to positions of components in the accompanying drawings. It should be understood that these position terms are relative concepts used for relative description and clarification, and may correspondingly change based on changes in the positions of the components in the accompanying drawings.

In this application, it should be noted that a term "connection" should be understood in a broad sense unless otherwise expressly specified and limited. For example, the "connection" may be a fixed connection, may be a detachable connection, may be an integral connection; may be a direct connection, or may be an indirect connection implemented by using a medium.

An embodiment of this application provides a terminal. The terminal may be a product having a display interface, such as a tablet computer, a mobile phone, an e-reader, a remote control, a personal computer (personal computer, PC), a notebook computer, a personal digital assistant (personal digital assistant, PDA), a vehicle-mounted device, a web television, a wearable device, or a television, and smart display wearable products such as a smart watch and a smart band. A specific form of the terminal is not specially limited in this embodiment of this application. For ease of description, an example in which the terminal is a mobile phone is used for description in the following embodiments.

Figure 1A:
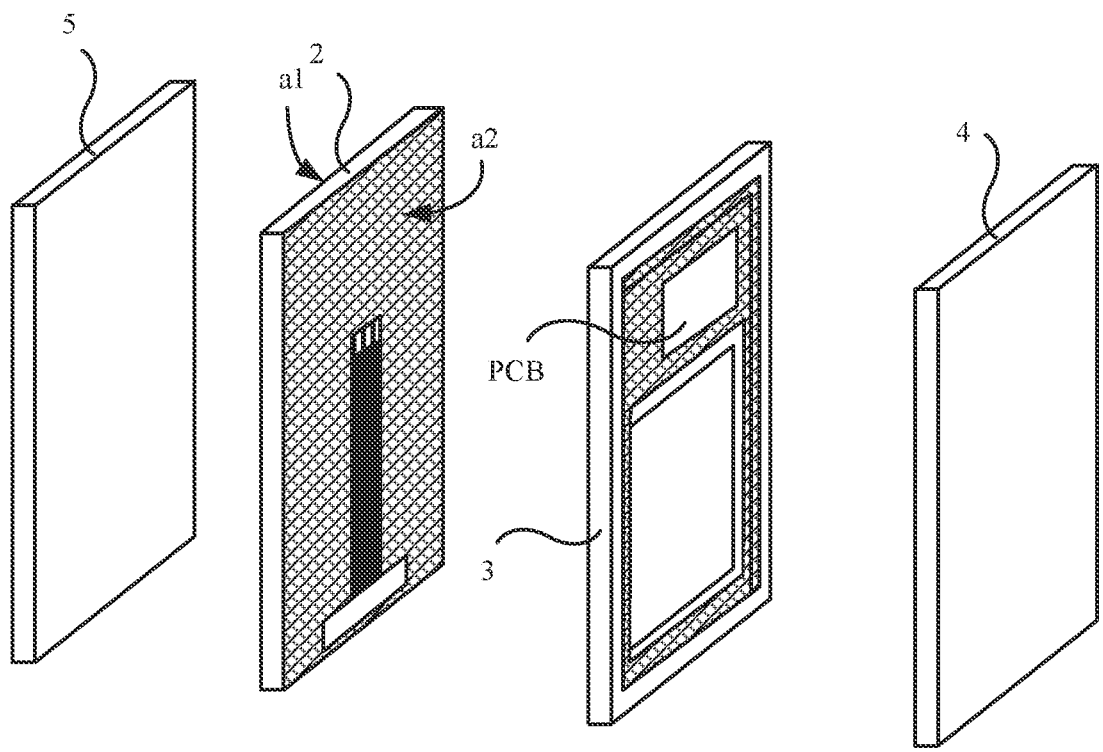
FIG. 1a is a schematic diagram of a disassembly structure of a terminal according to an embodiment of this application.

As shown in FIG. 1a, a terminal 1 mainly includes a display 2, a middle frame 3, a housing (or referred to as a battery cover or a rear housing) 4, and a cover 5.

The display 2 has a light-emitting surface a1 on which a display picture can be seen and a back surface a2 disposed opposite to the light-emitting surface a1, the back surface a2 of the display 2 is close to the middle frame 3, and the cover 5 is disposed on the light-emitting surface a1 of the display 2.

In a possible embodiment of this application, the display 2 is an organic light-emitting diode (organic light-emitting diode, OLED) display. Because an electroluminescent layer is disposed in each light-emitting subpixel of the OLED display, the OLED display can implement self-luminescence after receiving an operating voltage.

The cover 5 is located on a side on which the display 2 is away from the middle frame 3. For example, the cover 5 may be cover glass (cover glass, CG), and the cover glass may have specific resilience.

The middle frame 3 is located between the display 2 and the housing 4. A surface of the middle frame 3 that is away from the display 2 is used to install internal components, for example, a battery, a printed circuit board (printed circuit board, PCB), a camera (camera), and an antenna. After the housing 4 and the middle frame 3 are closed, the internal components are located between the housing 4 and the middle frame 3.

Figure 1B:
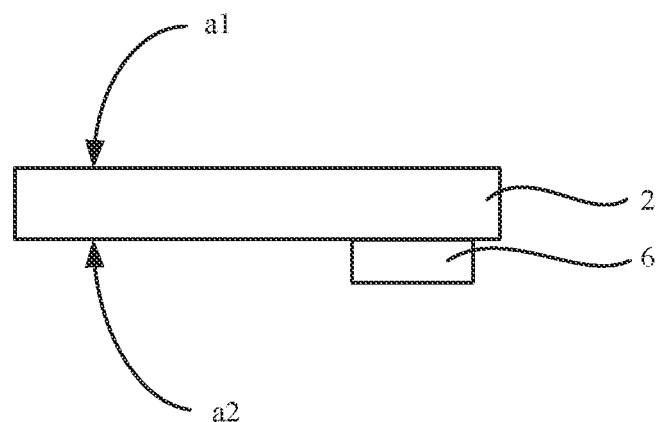
FIG. 1b is a schematic diagram of a structure of a display having an optical component according to an embodiment of this application.

On this basis, as shown in FIG. 1b, the terminal 1 further includes an optical component 6. The optical component 6 is disposed on a side of the back surface a2 that is of the display 2 and that is opposite to the light-emitting surface a1, a light-receiving surface of the optical component 6 faces the display 2, and the optical component 6 may be electrically connected to the PCB.

The optical component 6 is a component including a photosensor, and there may be one or more optical components 6. The optical component 6 may include, for example, one or more of a front-facing camera, a fingerprint sensor, an optical proximity sensor, a time of flight (time of flight, TOF) sensor, an iris recognition sensor, or a facial recognition sensor. Herein, the front-facing camera is a camera configured to collect an image on a side on which a display surface of the terminal 1 is located.

Figure 2A:
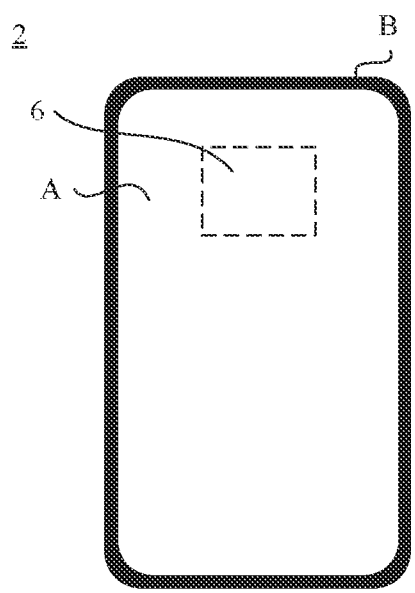
FIG. 2a is a schematic diagram of a structure of a display according to an embodiment of this application.

For a region in which the optical component 6 is disposed, as shown in FIG. 2a, the display 2 is divided into a display region A.

In a possible embodiment, the display 2 further includes a surrounding region B located around the display region A. In another possible embodiment, the display 2 does not have a surrounding region B.

A relative location relationship and shapes of the display region A and the surrounding region B are not limited. In this embodiment of this application, an example in which the surrounding region B surrounds the display region A for one circle is used for description.

It may be understood that the optical component 6 included in the terminal 1 implements a specific function by collecting light emitted to the optical component 6 through the display 2. However, the display 2 transmits light only through the display region A. Therefore, as shown in FIG. 2a, an orthographic projection of the optical component 6 on the display 2 is located in the display region A of the display 2.

Figure 2B:
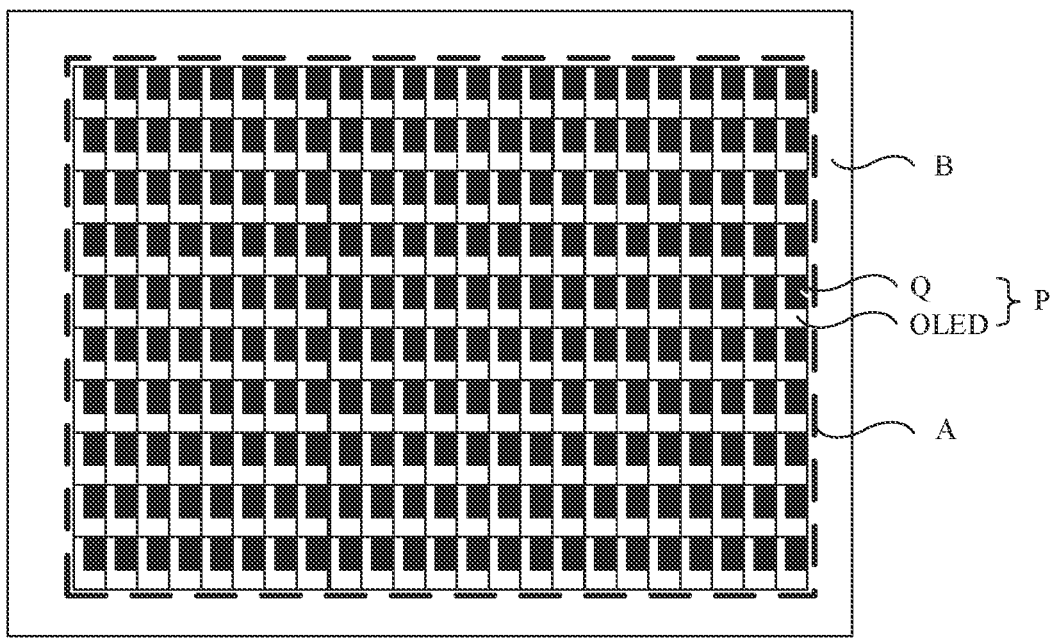
FIG. 2b is a schematic diagram of a structure of another display according to an embodiment of this application.

In a possible embodiment, as shown in FIG. 2b, the display region A includes a plurality of light-emitting subpixels (subpixel) P, and each light-emitting pixel includes at least three light-emitting subpixels P that are respectively used to display three primary colors. For example, each light-emitting pixel includes a red subpixel, a green subpixel, and a blue subpixel. Alternatively, for example, each light-emitting pixel includes a red subpixel, two green subpixels, and a blue subpixel.

For ease of description, in this application, an example in which the plurality of light-emitting subpixels P are arranged in a matrix form is used for description. It may be understood that a shape and an arrangement manner of the light-emitting subpixel P shown in this application are merely for description, and are not limited.

In addition, a drive circuit Q and an OLED (light-emitting component) electrically connected to the drive circuit Q are disposed in each light-emitting subpixel P, and the drive circuit Q is configured to control the OLED to perform displaying.

Figure 2C:
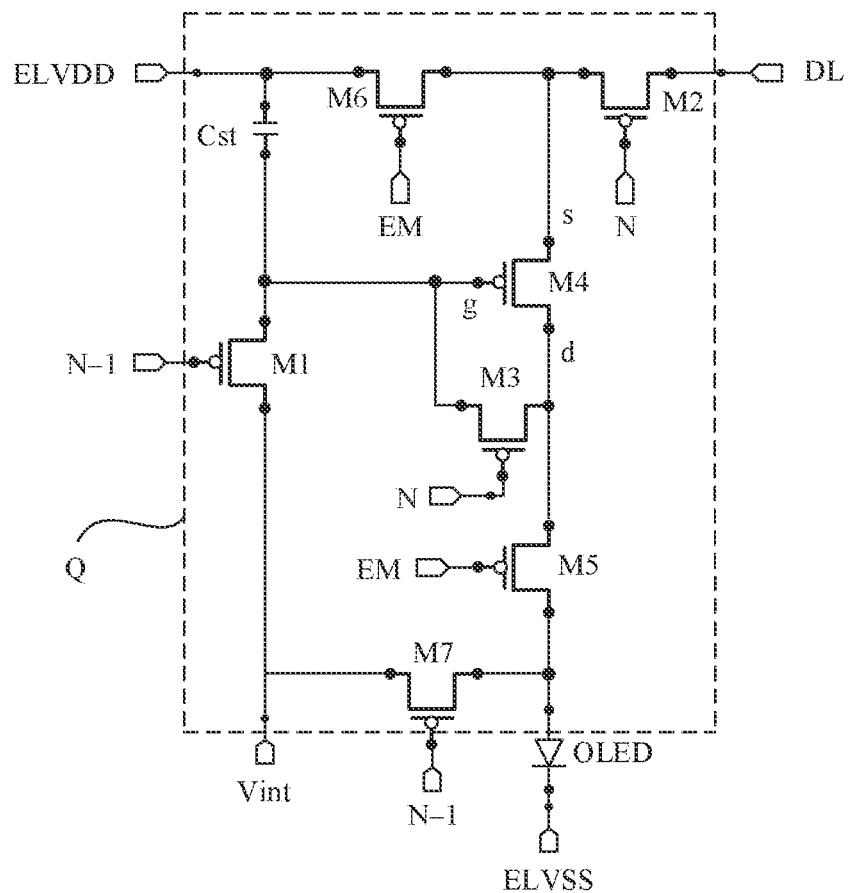
FIG. 2c is a circuit diagram of a light-emitting subpixel in FIG. 2b.

For example, in a possible embodiment, as shown in FIG. 2c, the drive circuit Q includes a capacitor Cst, a plurality of switch transistors (M1, M2, M3, M5, M6 and M7), and a drive transistor M4. That is, a 7T1C structure is used.

Figure 2D:
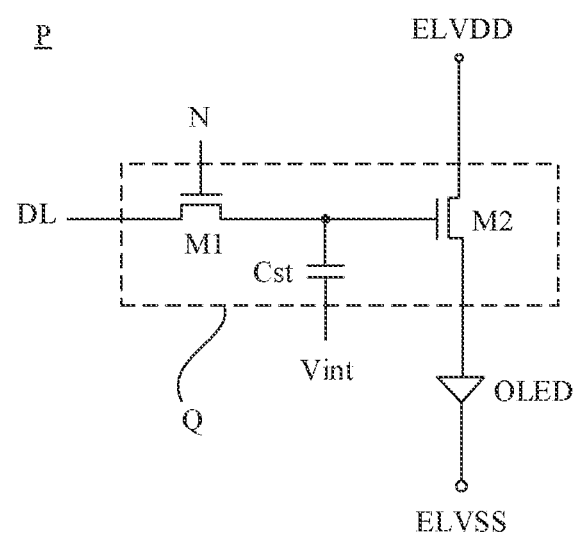
FIG. 2d is another circuit diagram of a light-emitting subpixel in FIG. 2b.

In another possible embodiment, as shown in FIG. 2d, the drive circuit Q includes a capacitor Cst, a switch transistor M1, and a drive transistor M2. That is, a 2T1C structure is used.

Certainly, the drive circuit Q may alternatively be of another structure. The drive circuit Q shown in FIG. 2c and FIG. 2d in this embodiment of this application is merely for description.

Figure 2E:
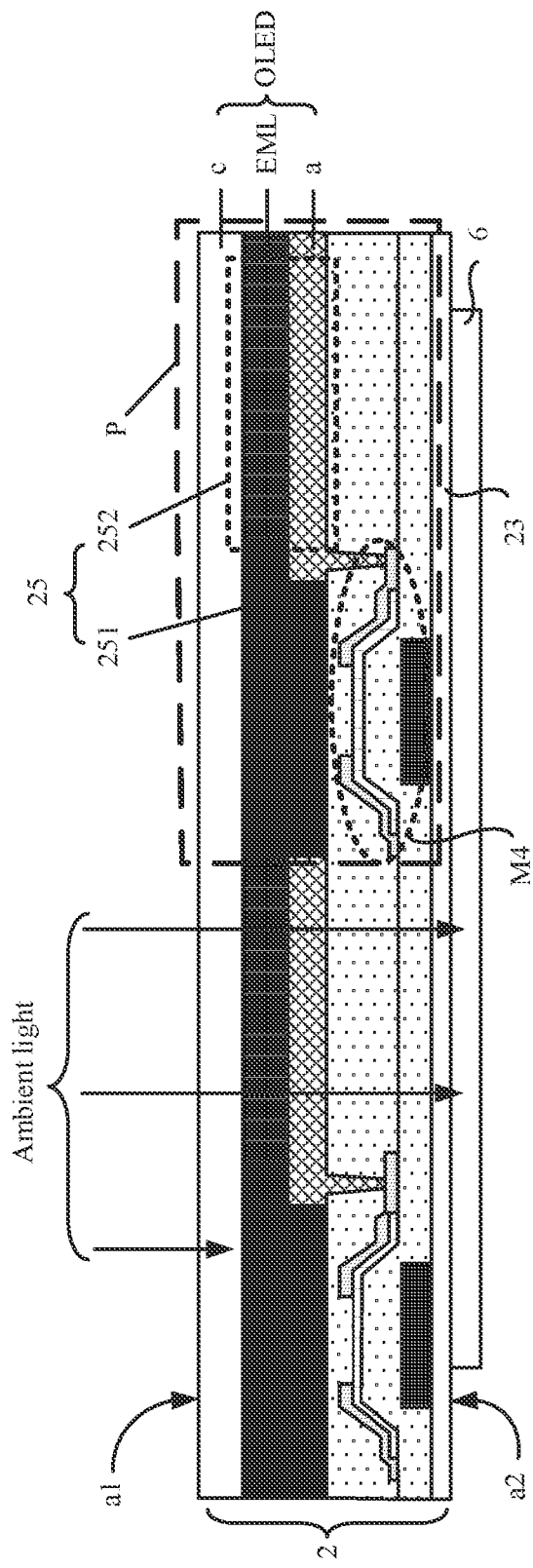
FIG. 2e is a schematic diagram of a partial structure of a display having an optical component according to an embodiment of this application.

For a manner in which the drive circuit Q and the OLED are disposed in the display 2 in a stacked manner, as shown in FIG. 2e, the display 2 includes a substrate 23 and the light-emitting subpixel P disposed on the substrate 23. FIG. 2e shows that two light-emitting subpixels P are disposed on the substrate 23.

The drive circuit Q in the light-emitting subpixel P includes the drive transistor M4 shown in FIG. 2e. Another transistor in the drive circuit Q and the drive transistor M4 are synchronously formed and disposed at a same layer.

As shown in FIG. 2e, the OLED in the light-emitting subpixel P is disposed on a side on which the drive transistor M4 is away from the substrate 23. The OLED includes an anode a, an electroluminescent layer (emitting material layer, EML), and a cathode c that are sequentially, disposed in a direction away from the substrate 23.

The anode a is electrically connected to a second electrode of the drive transistor M4, and receives a drive current $I_{sd}$ generated by the drive transistor M4. The electroluminescent layer EML emits light under driving of the drive current $I_{sd}$. A pixel delimiting layer 25 is disposed between adjacent light-emitting subpixels P, and the pixel delimiting layer 25 is configured to prevent light emitted by the adjacent light-emitting subpixels P from being mixed.

Figure 2F:
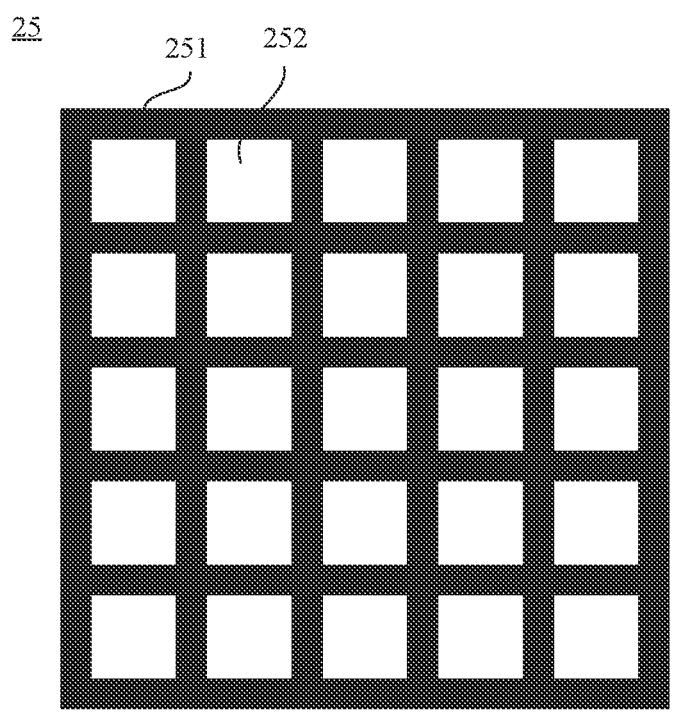
FIG. 2f is a schematic diagram of a structure of a pixel delimiting layer FIG. 2e.

As shown in FIG. 2f, the pixel delimiting layer 25 includes a plurality of horizontal and vertical crossing retaining walls 251 and a plurality of first openings 252 enclosed by the plurality of horizontal and vertical crossing retaining walls 251, and one first opening 252 corresponds to one light-emitting subpixel P.

As shown in FIG. 2e, the drive circuit Q is located on a side on which the retaining wall 251 is close to the substrate 23, and the OLED is located in the first opening 252.

As shown in FIG. 2e, the optical component 6 included in the terminal 1 is disposed on a side on which the backlight surface a2 of the display 2 is located, and implements the specific function by collecting light emitted to the optical component 6 through the display 2. However, because the retaining wall 251 has a light absorption effect, the light cannot pass through the retaining wall 251 and be emitted to the optical component 6, which affects a daylighting effect of the optical component 6.

Based on this, to improve a daylighting effect of the optical component 6 and improve detection precision of the optical component 6, the light-emitting subpixels P in the display 2 are re-arranged, and an area of the retaining wall 251 is reduced by reducing a quantity of drive circuits Q, to reduce a light absorption effect of the retaining wall 251.

Figure 3:
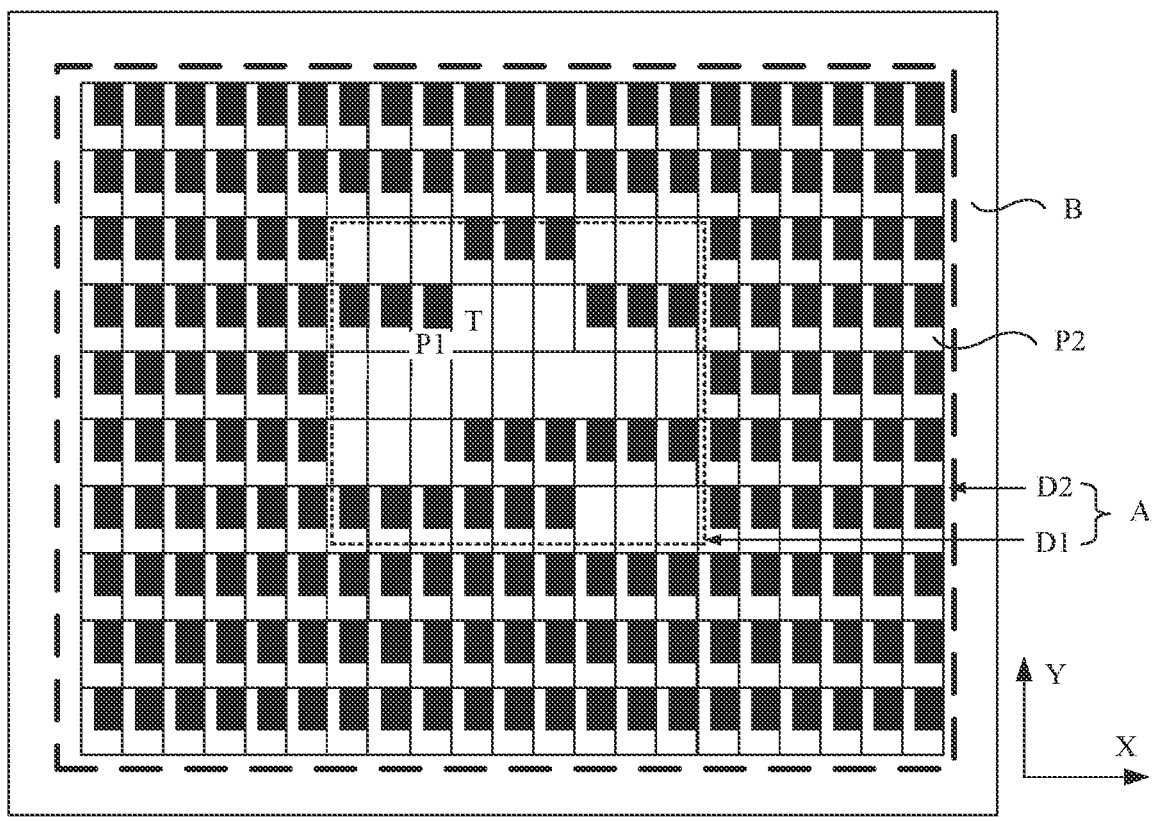
FIG. 3 is a schematic diagram of a structure of another display according to an embodiment of this application.
Figure 4A:
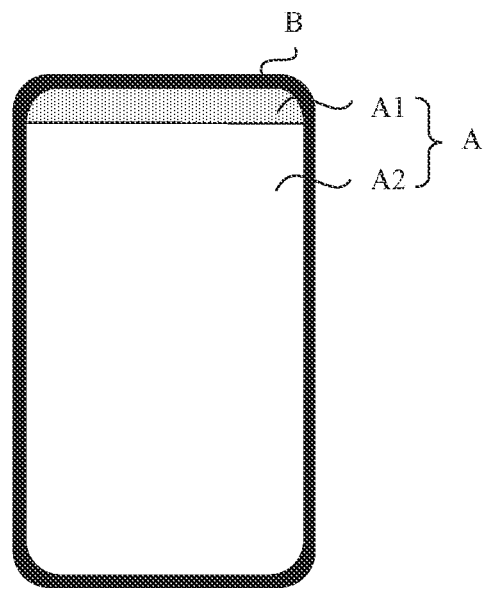
FIG. 4a to FIG. 4d each are a schematic diagram of a structure in which a first display region of a display is disposed on a side of a second display region according to an embodiment of this application.
Figure 4B:
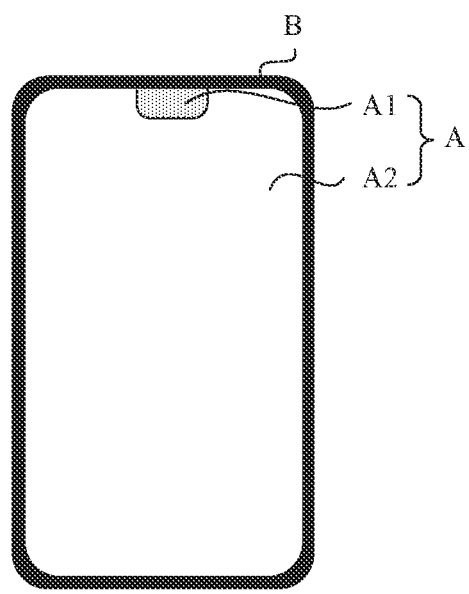
Figure 4C:
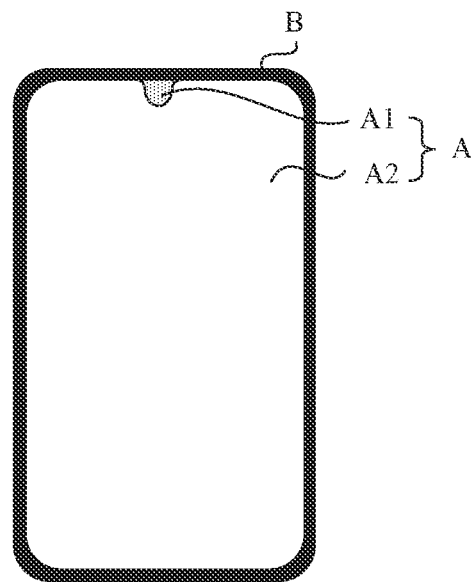
Figure 4D:
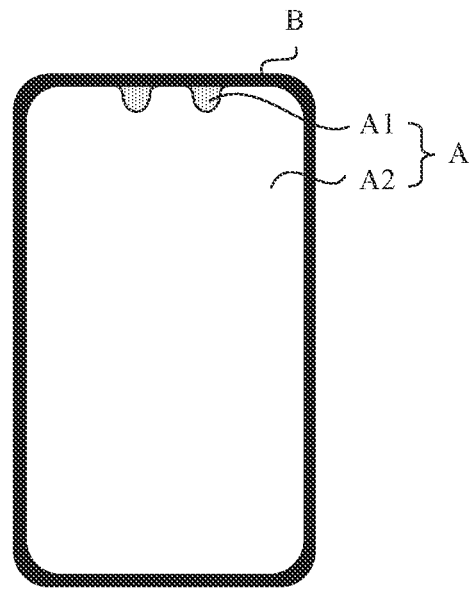

In another possible embodiment, as shown in FIG. 3, the display 2 includes at least one first subpixel array (low-density subpixel array) D1 and at least one second subpixel array (high-density subpixel array) D2 that are disposed on the substrate 23.

The first subpixel array D1 includes a plurality of first light-emitting subpixels P1 and a plurality of transparent subpixels T, and the plurality of first light-emitting subpixels P1 and the plurality of transparent subpixels T are arranged in a mixed manner.

An arrangement manner of the plurality of first light-emitting subpixels P1 and the plurality of transparent subpixels T is not limited. For example, three first light-emitting subpixels P1 used to respectively display the three primary colors may be a light-emitting pixel, and at least one transparent subpixel T is disposed between adjacent light-emitting pixels.

Alternatively, three first light-emitting subpixels P1 used to respectively display the three primary colors may be a light-emitting pixel, three transparent subpixels T may be a transparent pixel, and at least one transparent pixel is disposed between adjacent light-emitting pixels. A quantity of transparent subpixels T included in each transparent pixel is equal to a quantity of first light-emitting subpixels P1 included in the light-emitting pixel, and a plurality of transparent subpixels T in a same transparent pixel are adjacent to each other.

In this way, the light-emitting pixels and the transparent pixels in the first subpixel array D1 are arranged in a mixed manner.

The second subpixel array D2 includes a plurality of second light-emitting subpixels 2. In a possible embodiment, the second subpixel array 172 includes only the second light-emitting subpixel P2.

In another possible embodiment, the second subpixel array D2 may further include the transparent subpixel T, but a ratio of the transparent subpixel T to the second light-emitting subpixel P2 in the second subpixel array D2 is less than a ratio of the transparent subpixel T to the first light-emitting subpixel P1 in the first subpixel array D1. That is, a proportion of the transparent subpixel T in the second subpixel array D2 is less than a proportion of the transparent subpixel T in the first subpixel array D1, that is, transmittance of a region in which the second subpixel array D2 is located is poorer than transmittance of a region in which the first subpixel array D1 is located.

It should be noted that structures of the first light-emitting subpixel P1 and the second light-emitting subpixel P2 displaying light of a same color may be the same or different, and both the first light-emitting subpixel P1 and the second light-emitting subpixel P2 are used to display the three primary colors.

For a relative location relationship between subpixels in the first subpixel array D1 and the second subpixel array D2, as shown in FIG. 3, subpixels arranged in a row along a horizontal direction X are referred to as subpixels in a same row. Subpixels arranged in a row along a vertical direction Y are referred to as subpixels in a same column.

In some embodiments, as shown in FIG. 3, along the horizontal direction X, a row of subpixels in the first subpixel array D1 and a row of subpixels in the second subpixel array D2 are located in a same row. FIG. 3 is used as an example. A third row of second light-emitting subpixel P2 in the second subpixel array D2 and a first row of subpixels in the first subpixel array D1 are located in a same row, and form a third row of subpixels from top to bottom in the display 2.

Along the vertical direction Y, a column of subpixels in the first subpixel array D1 and a column of subpixels in the second subpixel array D2 are located in a same column. FIG. 3 is used as an example. A seventh column of second light-emitting subpixels P2 in the second subpixel array D2 and a first column of subpixels in the first subpixel array D1 are located in a same column, to form a seventh column of subpixels from left to right in the display 2.

That is, subpixels in the first subpixel array D1 and subpixels in the second subpixel array D2 in the display 2 are arranged in an array.

For a distribution manner of the first subpixel array D1 and the second subpixel array D2, in this embodiment of this application, the display region A may include a first display region and a second display region, and the region in which the first subpixel array D1 is located is the first display region, and the region in which the second subpixel array D2 is located is the second display region. A relative location relationship between and shapes of the first display region and the second display region are not limited.

In some embodiments, as shown in FIG. 4a to FIG. 4d, a first display region A1 is located on a side of a second display region A2.

In some embodiments, as shown in FIG. 5a to FIG. 5f, the second display region A2 surrounds the first display region A1.

Figure 5A:
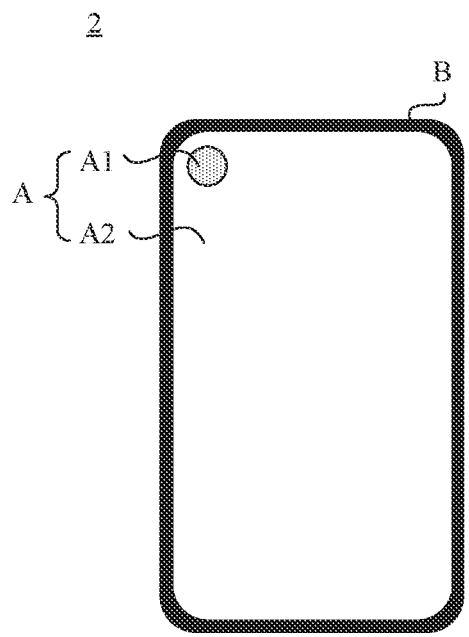
FIG. 5a to FIG. 5f each are a schematic diagram of a structure in which a second display region of a display surrounds a first display region according to an embodiment of this application.
Figure 5B:
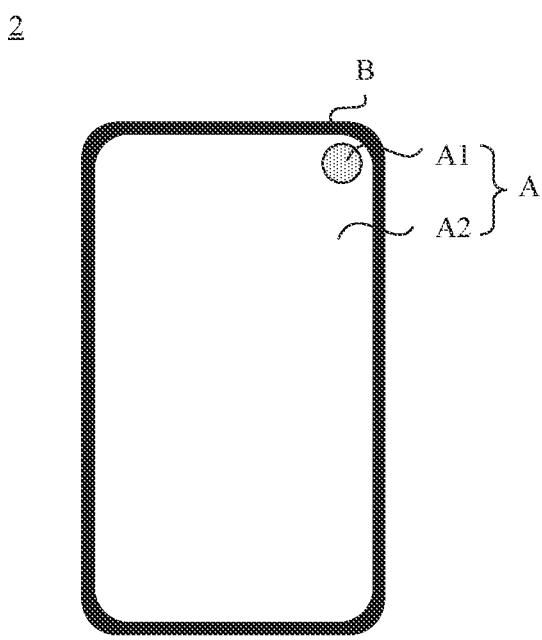
Figure 5C:
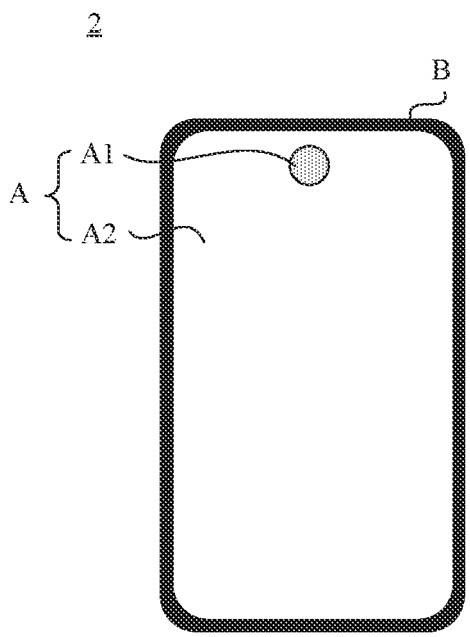
Figure 5D:
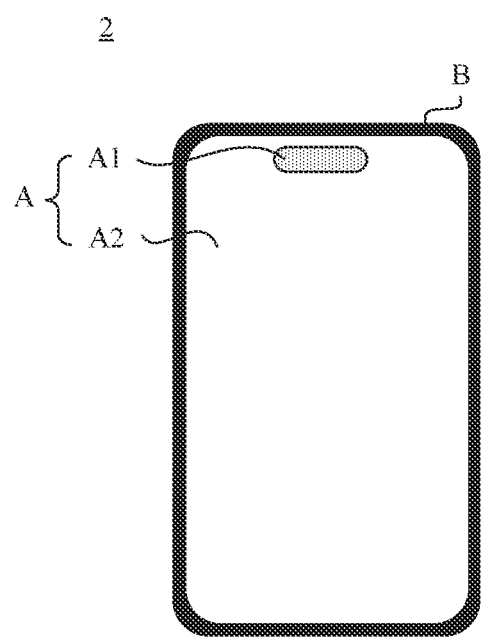
Figure 5E:
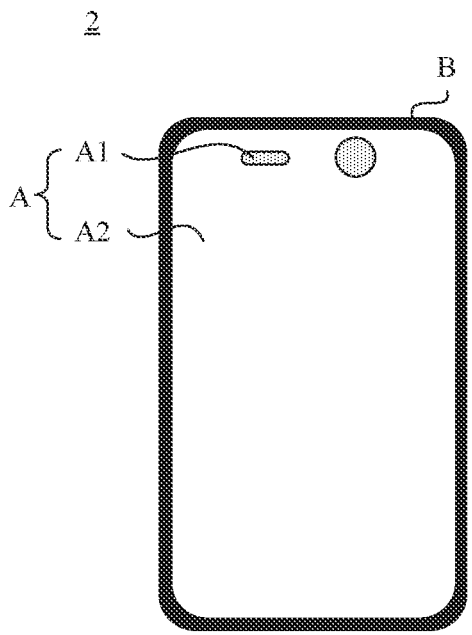
Figure 5F:
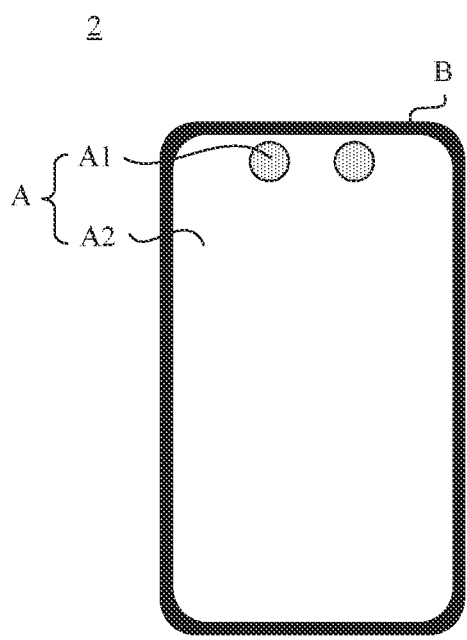

The first display region A1 may be one region shown in FIG. 5a to FIG. 5d, or may be a plurality of regions shown in FIG. 5e and FIG. 5f. When the first display region A1 is the plurality of regions, a first subpixel array D1 is disposed in each region.

Figure 6A:
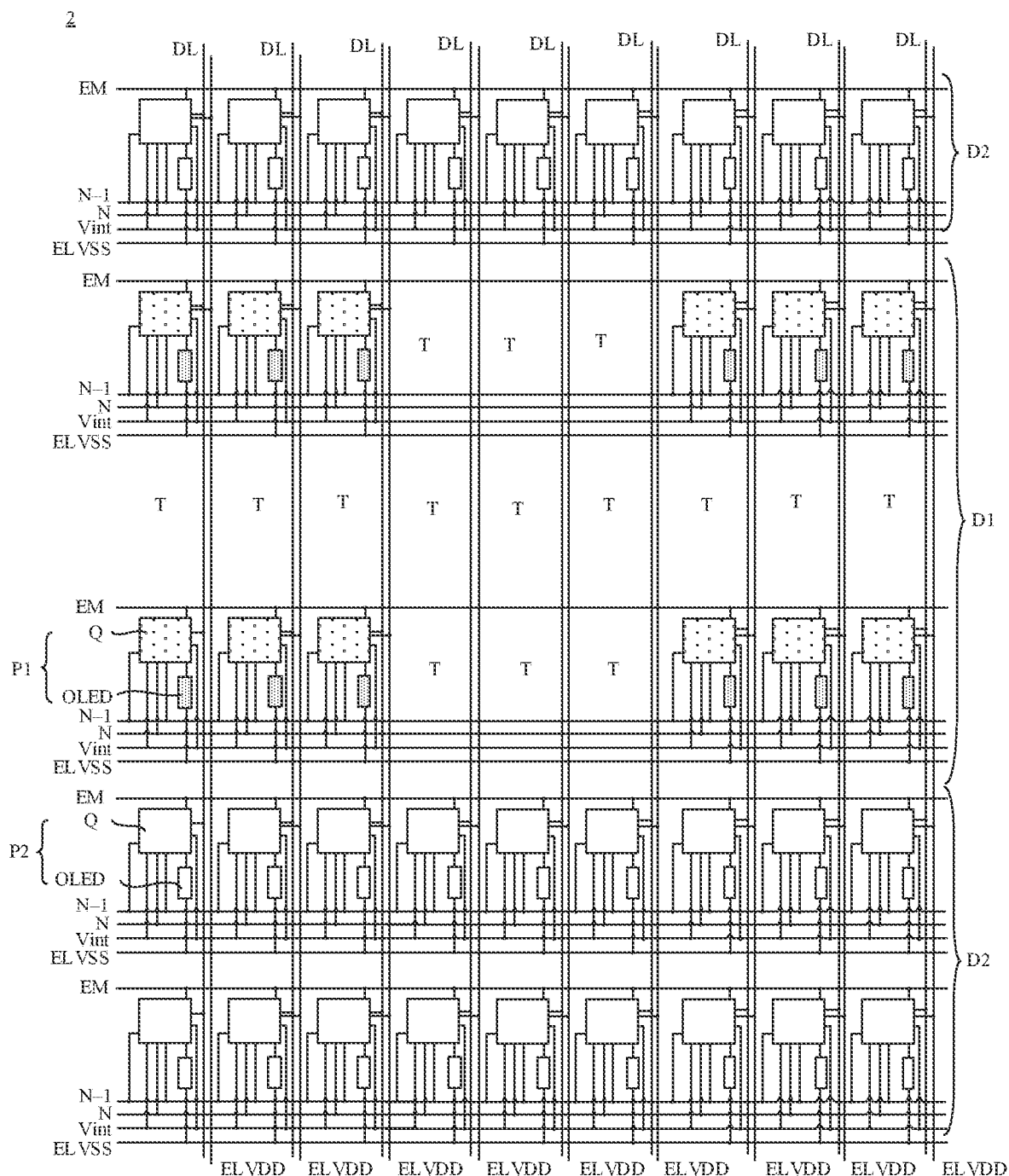
FIG. 6a is a schematic diagram of a structure of another display according to an embodiment of this application.

For a structure of subpixels in the first subpixel array D1, as shown in FIG. 6a, each first light-emitting subpixel P1 includes a drive circuit Q and an OLED electrically connected to the drive circuit Q, and the drive circuit Q is configured to drive the OLED to emit light of the three primary colors. The transparent subpixel T is of a transparent structure and does not emit light.

In some embodiments, the transparent subpixel T does not include the drive circuit Q or the OLED.

In some other embodiments, the light-emitting component OLED includes a first cathode, a first anode, and an electroluminescent layer located between the first cathode and the first anode. The transparent subpixel T does not include the drive circuit Q, but the transparent subpixel T includes a second cathode, and the second cathode and the first cathode are of an integrated structure. Therefore, the first cathode and the second cathode are of an entire-layer structure, and patterning can be reduced.

For a structure of subpixels in the second subpixel array D2, as shown in FIG. 6a, each second light-emitting subpixel P2 includes a drive circuit Q and an OLED electrically connected to the drive circuit Q, and the drive circuit Q is configured to drive the OLED to emit light of the three primary colors.

Transmittance of light in a region in which the first subpixel array D1 is located, that is, the first display region A1 is greater than transmittance of light in a region in which the second subpixel array D2 is located, that is, the second display region A2, the orthographic projection of the optical component 6 on the display 2 is located in the region in which the first subpixel array D1 is located (the first display region A1).

A structure of the drive circuit Q is not limited. In some embodiments, the drive circuit Q may be, for example, the same as the drive circuit Q shown in FIG. 2c. For example, the drive circuit Q is the 7T1C structure.

In some embodiments, the drive circuit Q may be, for example, the same as the drive circuit Q shown in FIG. 2d. For example, the drive circuit Q is the 2T1C structure.

Figure 6B:
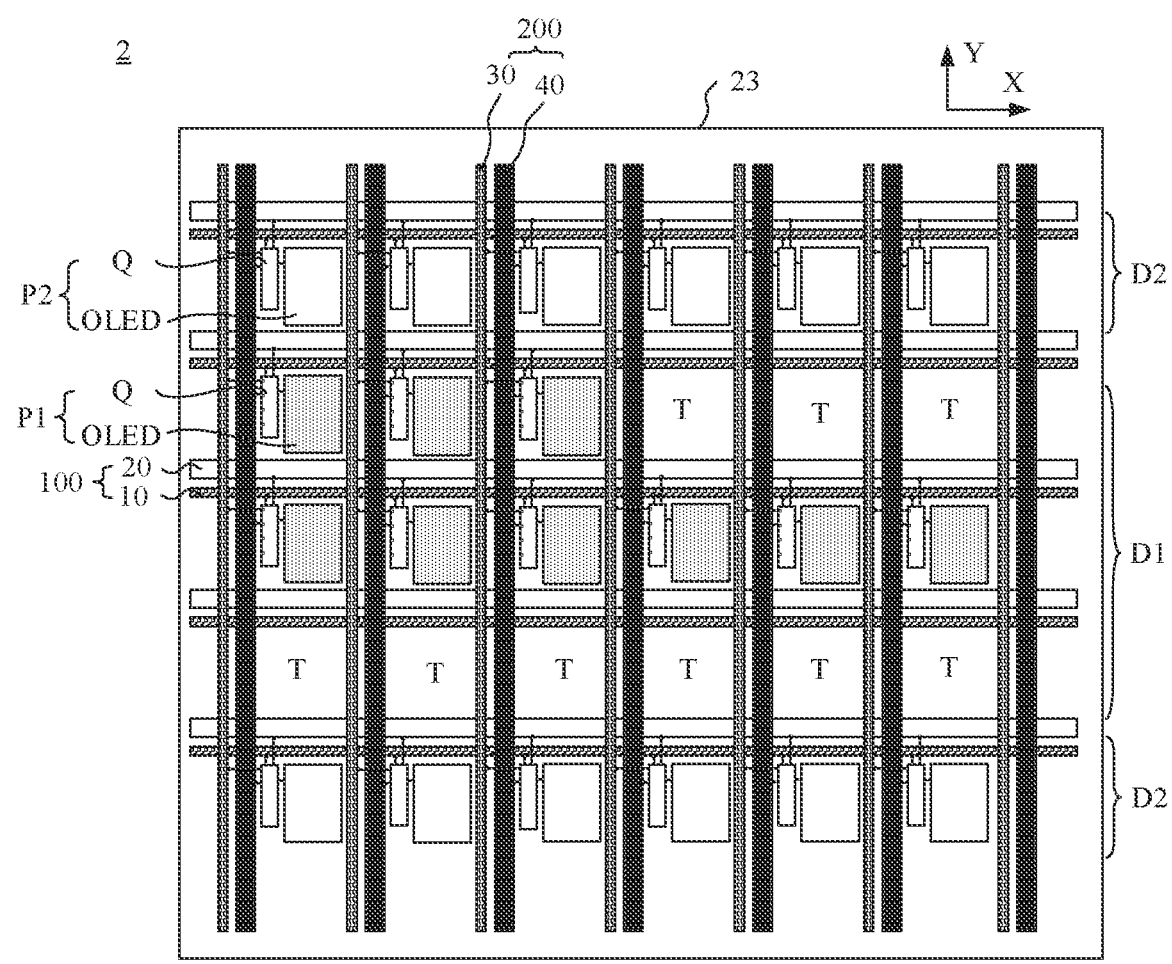
FIG. 6b is a schematic diagram of a structure of another display according to an embodiment of this application.

Based on this, as shown in FIG. 6b, the display 2 further includes a plurality of first signal lines 10 and a plurality of second signal lines 20. The first signal line 10 and the second signal line 20 are electrically connected to the drive circuit Q, and are configured to transmit an electrical signal to the drive circuit Q.

As shown in FIG. 6b, the plurality of first signal lines 10 are all disposed on the substrate 23, and the plurality of first signal lines 10 are parallel to each other and insulated from each other. The plurality of second signal lines 20 are also disposed on the substrate 23 and the plurality of second signal lines 20 are parallel to each other and insulated from each other. In addition, the first signal line 10 and the second signal line 20 are parallel to each other (with a same extension direction), insulated from each other, and alternately arranged.

In the first subpixel array D1, a first signal line group 100 is disposed between adjacent rows of subpixels arranged along the extension direction of the first signal line 10, and the first signal line group 100 includes one first signal line 10 and one second signal line 20.

It should be noted that, first, as shown in FIG. 6b, a row of subpixels in the first subpixel array D1 may include both the first light-emitting subpixel P1 and the transparent subpixel T, for example, a first row of subpixels from top to bottom in the first subpixel array D1 shown in FIG. 6b. Alternatively, a row of subpixels in the first subpixel array D1 may include only the first light-emitting subpixel P1, for example, a second row of subpixels from top to bottom in the first subpixel array D1 shown in FIG. 6b. Alternatively, a row of subpixels in the first subpixel array D1 may include only the transparent subpixel T, for example, a third row of subpixels from top to bottom in the first subpixel array D1 shown in FIG. 6b.

Second, a same row of first light-emitting subpixels P1 arranged along the extension direction of the first signal line 10 is connected to a same first signal line 10 and a same second signal line 20.

That is, the first signal line 10 and the second signal line 20 in a same first signal line group 100 may be electrically connected to the same row of first light-emitting subpixels P1 in the first subpixel array D1.

It may be understood that the first signal line 10 and the second signal line 20 are connected to the first light-emitting subpixel P1, and are essentially connected to the drive circuit Q in the first light-emitting subpixel P1.

In a possible embodiment, as shown in FIG. 6b, the first signal line 10 and the second signal line 20 that are connected to the same row of first light-emitting subpixels P1 belong to the same first signal line group 100.

Figure 6C:
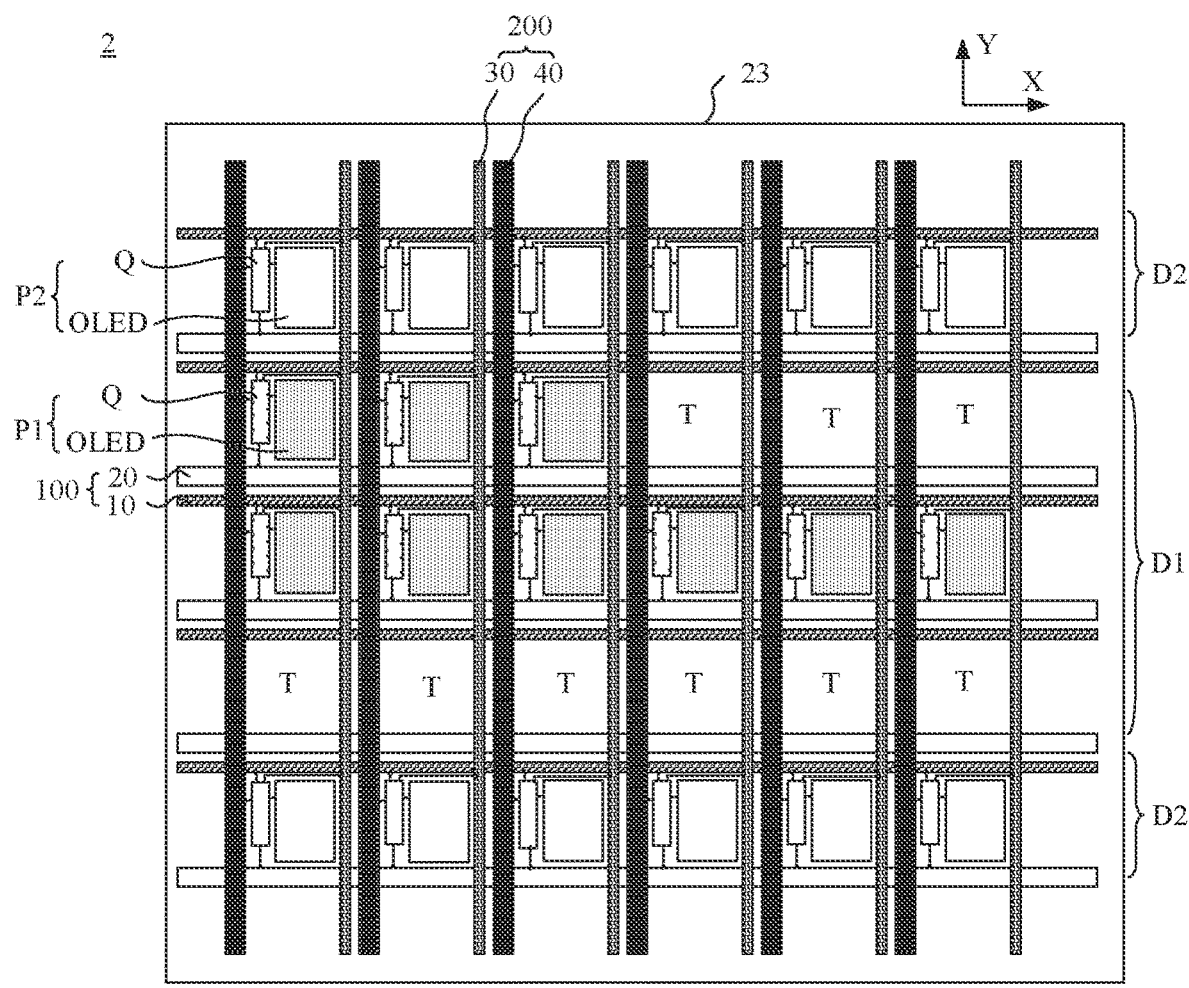
FIG. 6c is a schematic diagram of a structure of another display according to an embodiment of this application.

In another possible embodiment, as shown in FIG. 6c, the first signal line 10 and the second signal line 20 that are connected to the same row of first light-emitting subpixels P1 belong to different first signal line groups 100.

That is, the first signal line 10 and the second signal line 20 in the same first signal line group 100 may be electrically connected to different rows of first light-emitting subpixels P1 in the first subpixel array D1.

In this embodiment of this application, for ease of description, an example in which the first signal line 10 and the second signal line 20 that are connected to the same row of first light-emitting subpixels P1 belong to the same first signal line group 100 is used for description.

Third, in a possible embodiment, as shown in FIG. 6b, in the first subpixel array D1, the same row of first light-emitting subpixels P1 arranged along the extension direction of the first signal line 10 is connected to the same first signal line 10 and the same second signal line 20. Therefore, a drive signal may be transmitted from one side of the display 2 to the first signal line 10 and the second signal line 20, that is, unilateral driving is implemented, and a structure is simple.

Figure 6D:
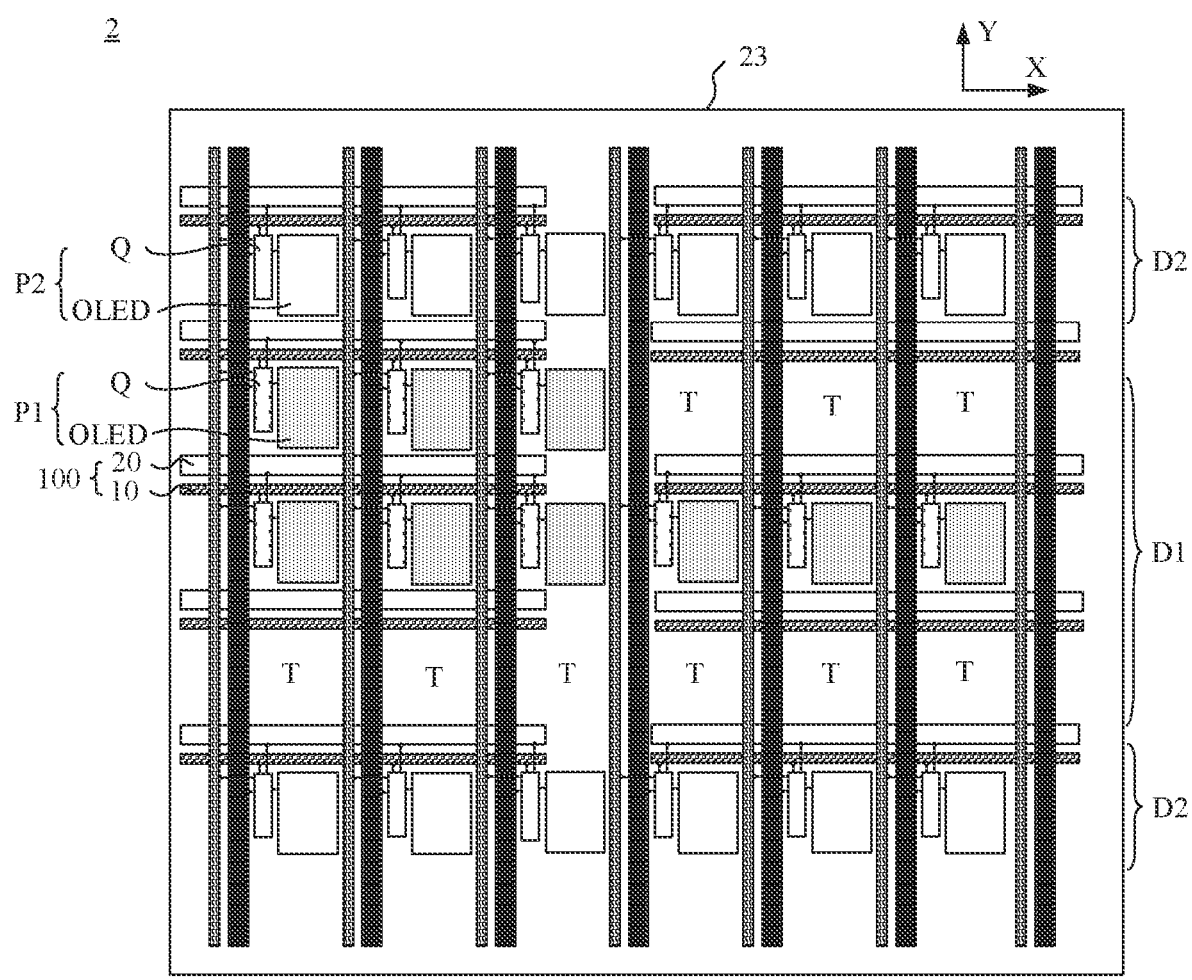
FIG. 6d is a schematic diagram of a structure of another display according to an embodiment of this application.

In another possible embodiment, as shown in FIG. 6d, it may be considered that the display 2 includes two adjacent first subpixel arrays D1, and the first light-emitting subpixels P1 connecting the first signal line 10 and the second signal line 20 in the same first signal line group 100 belong to a same first subpixel array D1. In this way, drive signals may be transmitted to the first signal line 10 and the second signal line 20 from two opposite sides of the display 2, that is bilateral driving is implemented.

When a quantity of a same row of first light-emitting subpixels P1 that are arranged along the extension direction of the first signal line 10 is large, a length of the required first signal line 10 is long. Due to existence of a voltage drop on the first signal line 10, the drive signal on the first signal line 10 along the extension direction of the first signal line 10 gradually weakens. The bilateral driving may shorten the length of the first signal line 10, so that the drive signal received by each first light-emitting subpixel P1 is approximately equal, which ensures display quality.

In FIG. 6b, an example in which the extension direction of the first signal line 10 is a horizontal direction X is used for description, and the extension direction of the first signal line 10 may also be a vertical direction Y.

Fourth, the first signal line 10 and the second signal line 20 are not limited in this embodiment of this application provided that extension directions of the first signal line 10 and the second signal line 20 are the same and the first signal line 10 and the second signal line 20 are insulated.

In a possible embodiment, the first signal line 10 and the second signal line 20 belong to signal lines that provide different types of signals to a same row (as shown in FIG. 6b) or different rows (as shown in FIG. 6c) of first light-emitting subpixels P1.

For example, the drive circuit Q in the first light-emitting subpixel P1 is the 7T1C structure shown in FIG. 2c. The first signal line 10 and the second signal line 20 may be any two different signal lines in an enabling signal line EM, a first grid scanning signal line N-1, a second grid scanning signal line N, an initial signal line Vint, and a reverse power voltage line ELVSS. Alternatively, the first signal line 10 and the second signal line 20 may be mutually a data line DL or a power voltage line ELVDD.

Figure 6E:
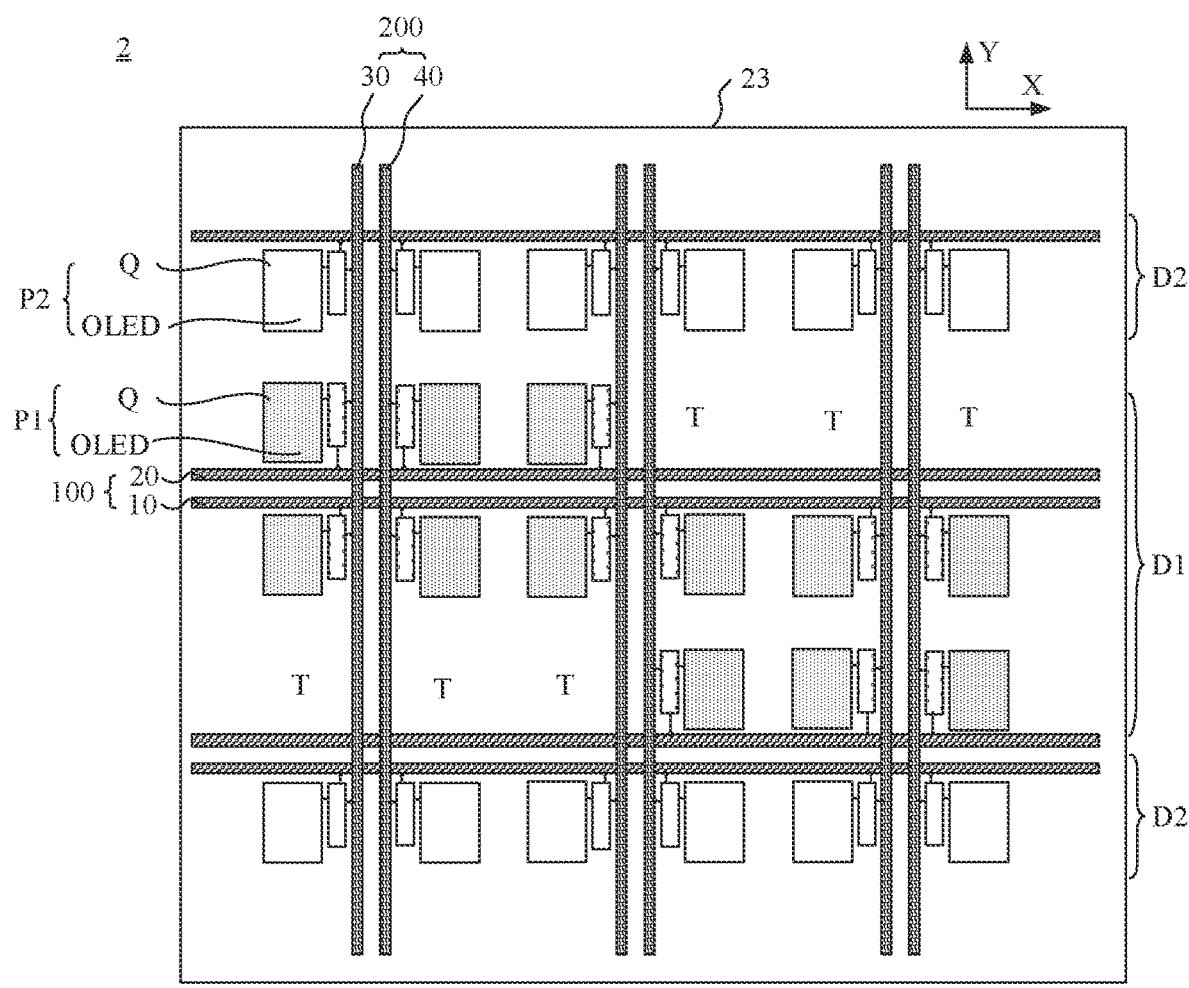
FIG. 6e is a schematic diagram of a structure of another display according to an embodiment of this application.

In another possible embodiment, as shown in FIG. 6e, the first signal line 10 and the second signal line 20 belong to signal lines that provide a same type of signal to different rows of first light-emitting subpixels P1.

For example, the drive circuit Q in the first light-emitting subpixel P1 is the 2T1C structure shown in FIG. 2d. The first signal line 10 and the second signal line 20 each may be any signal line in a second grid scanning signal line N, an initial signal line Vint, and a reverse power voltage line ELVSS. Alternatively, the first signal line 10 and the second signal line 20 each may be a data line DL or a power voltage line ELVDD.

Fifth, the first signal line 10 and the second signal line 20 may be disposed at a same layer, or may be disposed at different layers (that is, an insulation layer is disposed between the first signal line 10 and the second signal line 20 along a stacking direction of the first signal line 10 and the second signal line 20).

Sixth, the first signal line group 100 may also be disposed between adjacent rows of subpixels in the second subpixel array D2 in the display 2. In this way, based on a difference in the relative location of the first display region A1 in which the first subpixel array D1 is located and the second display region A2 in which the second subpixel array D2 is located, in a row of subpixels connected to the first signal line 10 and the second signal line 20, both of the first light-emitting subpixel P1 and the second light-emitting subpixel P2 may be included. Alternatively, only the first light-emitting subpixel P1 is included. Alternatively, only the second light-emitting subpixel P2 is included.

Seventh, for differentiation, as shown in FIG. 6*b* to FIG. 6*d*, when signals transmitted on the first signal line 10 and the second signal line 20 are different, in this embodiment of this application, an example in which the first signal line 10 and the second signal line 20 have different widths in a direction perpendicular to the extension direction is used for description. However, there is no limitation that the widths of the first signal line 10 and the second signal line 20 are different, and the widths of the first signal line 10 and the second signal line 20 may also be the same.

In the first subpixel array D1, a second signal line group 200 is disposed between adjacent rows of subpixels arranged along an extension direction of a third signal line 30, and the second signal line group 200 includes one third signal line 30 and one fourth signal line 40.

It should be noted that, first, a same row of first light-emitting subpixels P1 arranged along the extension direction of the third signal line 30 is connected to a same third signal line 30 and a same fourth signal line 40.

It may be understood that the third signal line 30 and the fourth signal line 40 are connected to the first light-emitting subpixel P1, and are essentially connected to the drive circuit Q in the first light-emitting subpixel P1.

In a possible embodiment, as shown in FIG. 6*b*, the third signal line 30 and the fourth signal line 40 that are connected to the same row of first light-emitting subpixels P1 belong to a same second signal line group 200.

That is, the third signal line 30 and the fourth signal line 40 in the same second signal line group 200 may be electrically connected to the same row of first light-emitting subpixels P1 in the first subpixel array D1.

In another possible embodiment, as shown in FIG. 6*c*, the third signal line 30 and the fourth signal line 40 that are connected to the same row of first light-emitting subpixels P1 belong to different second signal line groups 200.

That is, the third signal line 30 and the fourth signal line 40 in the same second signal line group 200 may be electrically connected to different rows of first light-emitting subpixels P1 in the first subpixel array D1.

In this embodiment of this application, for ease of description, an example in which the third signal line 30 and the fourth signal line 40 that are connected to the same row of first light-emitting subpixels P1 belong to the same second signal line group 200 is used for description.

Second, the third signal line 30 and the fourth signal line 40 are not limited in this embodiment of this application provided that extension directions of the third signal line 30 and the fourth signal line 40 are the same and the third signal line 30 and the fourth signal line 40 are insulated.

In a possible embodiment, the third signal line 30 and the fourth signal line 40 belong to signal lines that provide different types of signals to a same row (as shown in FIG. 6*b*) or different rows (as shown in FIG. 6*c*) of first light-emitting subpixels P1.

For example, the drive circuit Q in the first light-emitting subpixel P1 is the 7T1C structure shown in FIG. 2*c*. The third signal line 30 and the fourth signal line 40 may mutually be a data line DL and a power voltage line ELVDD. The third signal line 30 and the fourth signal line 40 may alternatively be any two different signal lines in an enabling signal line EM, a first grid scanning signal line N-1, a second grid scanning signal line N, an initial signal line Vint, and a reverse power voltage line ELVSS.

In another possible embodiment, as shown in FIG. 6*e*, the third signal line 30 and the fourth signal line 40 belong to signal lines that provide a same type of signal to the different rows of first light-emitting subpixels P1.

For example, the drive circuit Q in the first light-emitting subpixel P1 is the 2T1C structure shown in FIG. 2*d*. The third signal line 30 and the fourth signal line 40 each may be a data line DL and a power voltage line ELVDD. Alternatively, the third signal line 30 and the fourth signal line 40 each may be any signal line in a second grid scanning signal line N, an initial signal line Vint, and a reverse power voltage line ELVSS.

Third, in a possible embodiment, as shown in FIG. 6*c*, in the extension direction of the third signal line 30, the first light-emitting subpixels P1 and the second light-emitting subpixels P2 that are located in a same row are connected to a same third signal line 30 and a same fourth signal line 40.

The second signal line group 200 may also be disposed between adjacent rows of subpixels in the second subpixel array D2 in the display 2.

In this way, based on a difference in the relative location of the first display region A1 in which the first subpixel array D1 is located and the second display region A2 in which the second subpixel array D2 is located, in a row of subpixels connected to the third signal line 30 and the fourth signal line 40, both of the first light-emitting subpixel P1 and the second light-emitting subpixel P2 may be included. Alternatively, only the first light-emitting subpixel P1 is included. Alternatively, only the second light-emitting subpixel P2 is included.

In FIG. 6*c*, an example in which the extension direction of the third signal line 10 is a vertical direction Y is used for description, and the extension direction of the third signal line 30 may also be a horizontal direction X provided that the extension direction of the first signal line 10 intersects the extension direction of the third signal line 30, for example, the first signal line 10 and the third signal line 30 are mutually a grid scanning signal line N and a data line DL.

For ease of description, in this embodiment of this application, an example in which the extension direction of the first signal line 10 is the horizontal direction X, and the extension direction of the third signal line 10 is the vertical direction Y is used for description.

Fourth, the third signal line 30 and the fourth signal line 40 may be disposed at a same layer, or may be disposed at different layers (that is, an insulation layer is disposed between the third signal line 30 and the fourth signal line 40 along a stacking direction of the third signal line 30 and the fourth signal line 40).

Fifth, for differentiation, as shown in FIG. 6b to FIG. 6d, when signals transmitted on the third signal line 30 and the fourth signal line 40 are different, in this embodiment of this application, an example in which the third signal line 30 and the fourth signal line 40 have different widths in a direction perpendicular to the extension direction is used for description. However, there is no limitation that the widths of the third signal line 30 and the fourth signal line 40 are different, and the widths of the third signal line 30 and the fourth signal line 40 may also be the same.

In this embodiment of this application, a proportion of the transparent subpixel T in the first display region A1 in which the first subpixel array D1 is located is greater than a proportion of the transparent subpixel T in the second display region A2 in which the second subpixel array D2 is located (there may be no transparent subpixel T in the second subpixel array D2), and the transparent subpixel T does not include the drive circuit Q. Therefore, as shown in FIG. 6f, density of the drive circuit Q in the first display region A1 is less than density of the drive circuit Q in the second display region A2, so that a quantity of transistors in the first display region A1 is less than a quantity of transistors in the second display region A2.

Figure 6F:
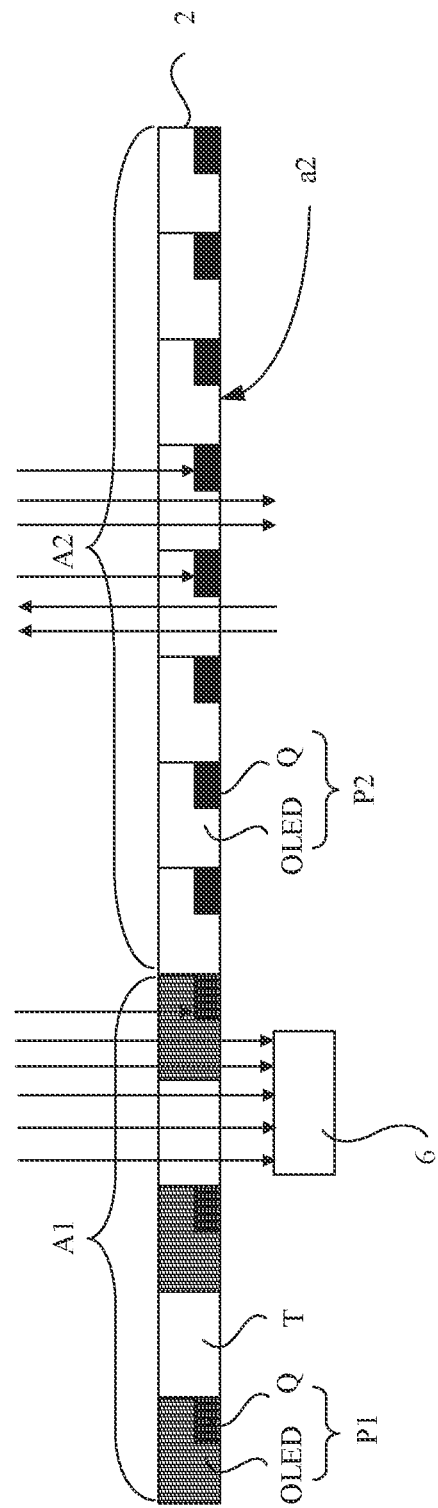
FIG. 6f is a schematic diagram of a structure of another display having an optical component according to an embodiment of this application.

As shown in FIG. 6f, the optical component 6 is located on the back surface a2 of the display 2. Because the transistor in the drive circuit Q is a light shielding material, after light is emitted to the drive circuit Q, the light is blocked. As a result, the light cannot pass through, and therefore cannot be emitted to the optical component 6. Because there is a blank region in which no drive circuit Q is disposed in the first display region A1, the light transmittance of the first display region A1 is greater than the light transmittance of the second display region A2. When the optical component 6 is disposed in the first display region A1, a light receiving rate of the optical component 6 may be further increased, to improve performance of the optical component 6.

However, regardless of whether the first signal line 10 and the second signal line 20 are disposed at a same layer, because an orthographic projection of the first signal line 10 on the substrate 23 and an orthographic projection of the second signal line 20 on the substrate 23 are disposed side by side, a diffraction grating is formed between the first signal line 10 and the second signal line 20. Therefore, the light is diffracted, and the light receiving rate of the optical component 6 is affected. Similarly, a diffraction grating is also formed between the third signal line 30 and the fourth signal line 40, which affects the light receiving rate of the optical component 6.

Based on this, to further increase the light receiving rate of the optical component 6 and improve the performance of the optical component 6 in the terminal 1, the display 2 is further improved based on the display 2 provided in this embodiment of this application.

Example 1

Figure 7A:
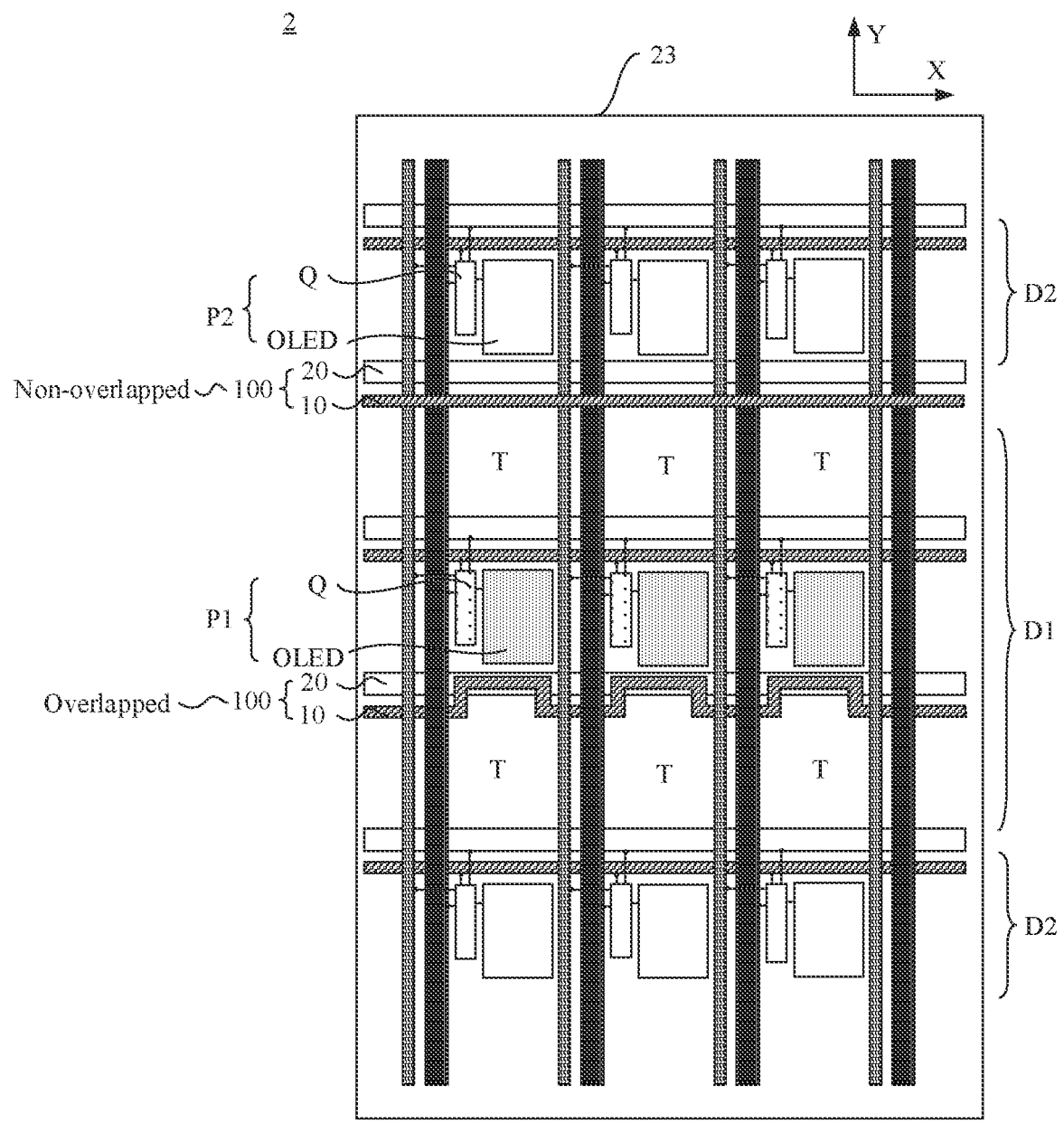
FIG. 7a is a schematic diagram of a structure of another display according to an embodiment of this application.

As shown in FIG. 7a, the display 2 includes at least one first subpixel array (low-density subpixel array) D1 and at least one second subpixel array (high-density subpixel array) D2 that are disposed on the substrate 23. The first subpixel array D1 includes a plurality of first light-emitting subpixels P1 and a plurality of transparent subpixels and the plurality of first light-emitting subpixels P1 and the plurality of transparent subpixels T are arranged in a mixed manner.

The display 2 further includes a plurality of first signal lines 10 and a plurality of second signal lines 20. The first signal line 10 and the second signal line 20 are electrically connected to the drive circuit Q of the first light-emitting subpixel P1 in the first subpixel array D1 and the drive circuit Q of second light-emitting subpixel P2 in the second subpixel array D2, and are configured to transmit electrical signals to the drive circuit Q.

As shown in FIG. 7a, the plurality of first signal lines 10 are disposed on the substrate 23, and the plurality of first signal lines 10 are insulated from each other. The plurality of second signal lines 20 are also disposed on the substrate 23 and the plurality of second signal lines 20 are insulated from each other. in addition, the plurality of first signal line 10 and the plurality of second signal line 20 extend in a same direction, are insulated from each other, and are alternately arranged.

For locations at which the first signal line 10 and the second signal line 20 in the display 10 are disposed and signals transmitted on the first signal line 10 and the second signal line 20, refer to the foregoing related descriptions of FIG. 6a to FIG. 6e. Details are not described herein again.

In the first subpixel array D1, a first signal line group 100 is disposed between adjacent rows of subpixels arranged along the extension direction of the first signal line 10, and the first signal line group 100 includes one first signal line 10 and one second signal line 20.

Based on a difference in a structure of the first subpixel array D1, the display 2 may include one first signal line group 100, or may include a plurality of first signal line groups 100.

As shown in FIG. 7a, orthographic projections of the first signal line 10 and the second signal line 20 in at least one first signal line group 100 on the substrate 23 overlap in some regions in which the transparent subpixels T are located.

That is, in a possible embodiment, the display 2 includes one first signal line group 100, and the orthographic projections of the first signal line 10 and the second signal line 20 in the first signal line group 100 on the substrate 23 overlap in some regions in which the transparent subpixels T are located.

In another possible embodiment, as shown in FIG. 7a, the display 2 includes a plurality of first signal line groups 100, and orthographic projections of the first signal line 10 and the second signal line 20 included in some of the plurality of first signal line groups 100 on the substrate 23 overlap in some regions in which the transparent subpixels T are located.

Figure 7B:
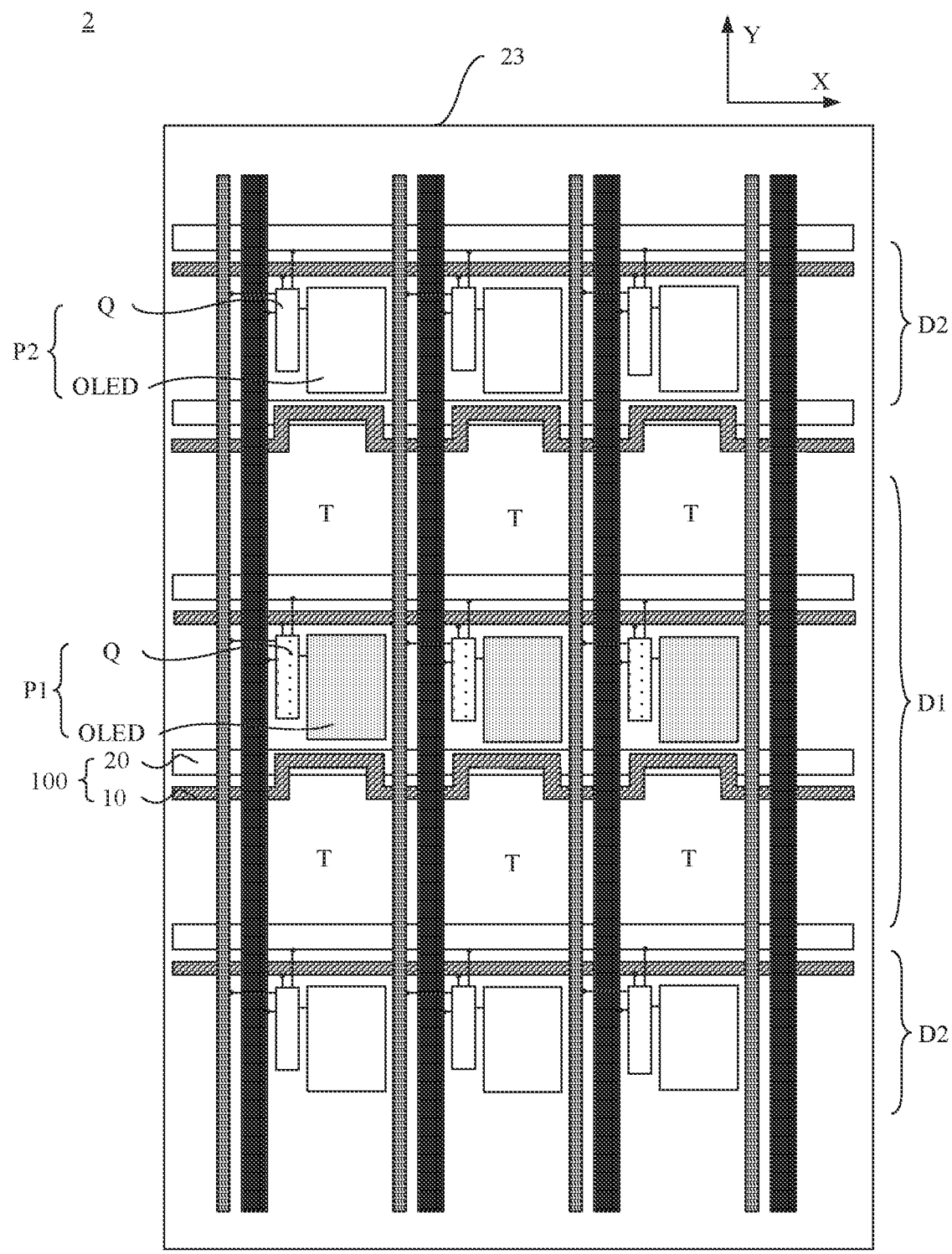
FIG. 7b is a schematic diagram of a structure of another display according to an embodiment of this application.

In another possible embodiment, as shown in FIG. 7b, the display 2 includes a plurality of first signal line groups 100, orthographic projections of the first signal line 10 and the second signal line 20 included in each of the plurality of first signal line groups 100 on the substrate 23 overlap in regions in which the transparent subpixels T are located.

That the orthographic projection of the first signal line 10 on the substrate 23 and the orthographic projection of the second signal line 20 on the substrate 23 overlap in the regions in which the transparent subpixels T are located may be understood that along a thickness direction of the display 2, a part of the first signal line 10 is located right above or right below the second signal line 20.

In a possible embodiment, as shown in FIG. 7b, the orthographic projection of the first signal line 10 on the substrate 23 and the orthographic projection of the second signal line 20 on the substrate 23 overlap in regions in which each transparent subpixel T is located.

Figure 7C:
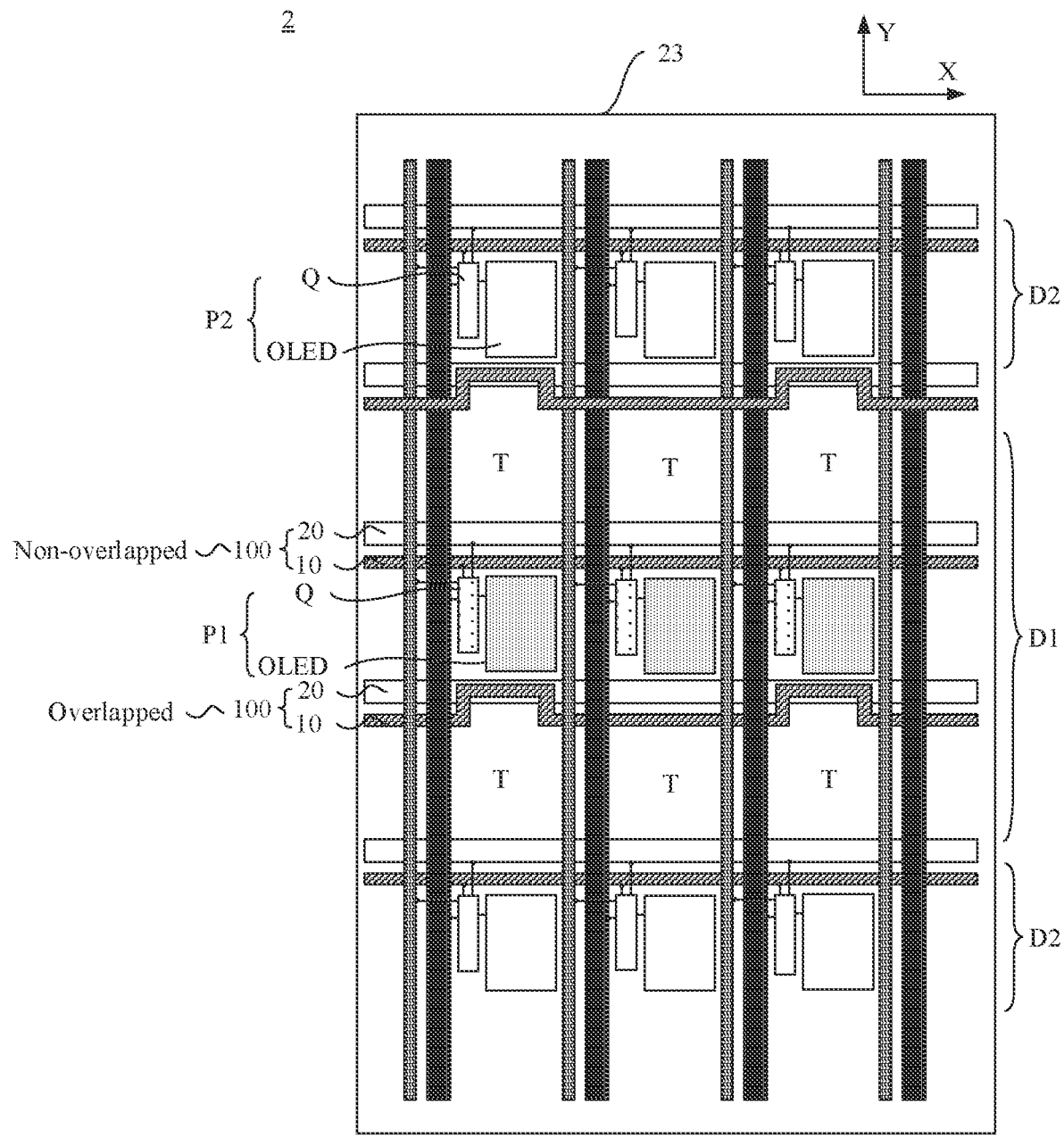
FIG. 7c is a schematic diagram of a structure of another display according to an embodiment of this application.

In another possible embodiment, as shown in FIG. 7c, the orthographic projection of the first signal line 10 on the substrate 23 and the orthographic projection of the second signal line 20 on the substrate 23 overlap in regions in which some of the plurality of transparent subpixels T are located.

In addition, to reduce changes to a preparation process, so as to reduce process complexity, in a possible embodiment, as shown in FIG. 7a to FIG. 7c, only a structure of a same signal line is changed, so that the first signal line 10 and the second signal line 20 that are originally parallel overlap.

Figure 7D:
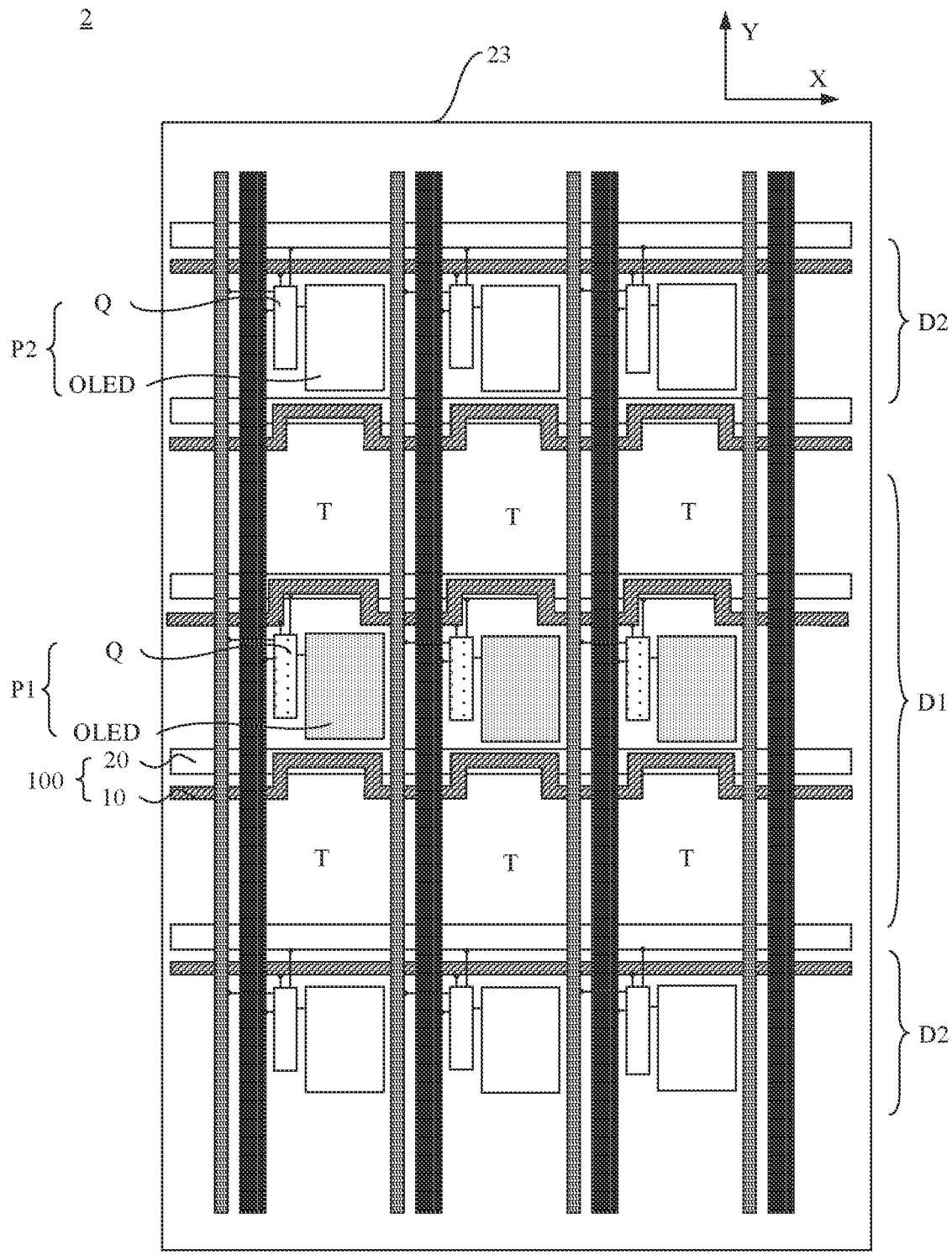
FIG. 7d is a schematic diagram of a structure of another display according to an embodiment of this application.

To unify the preparation process, structures of all first signal lines 10 are the same. In another possible embodiment, as shown in FIG. 7d, each first signal line 10 connected to the subpixels in the first subpixel array D1 has a same structure.

Figure 7E:
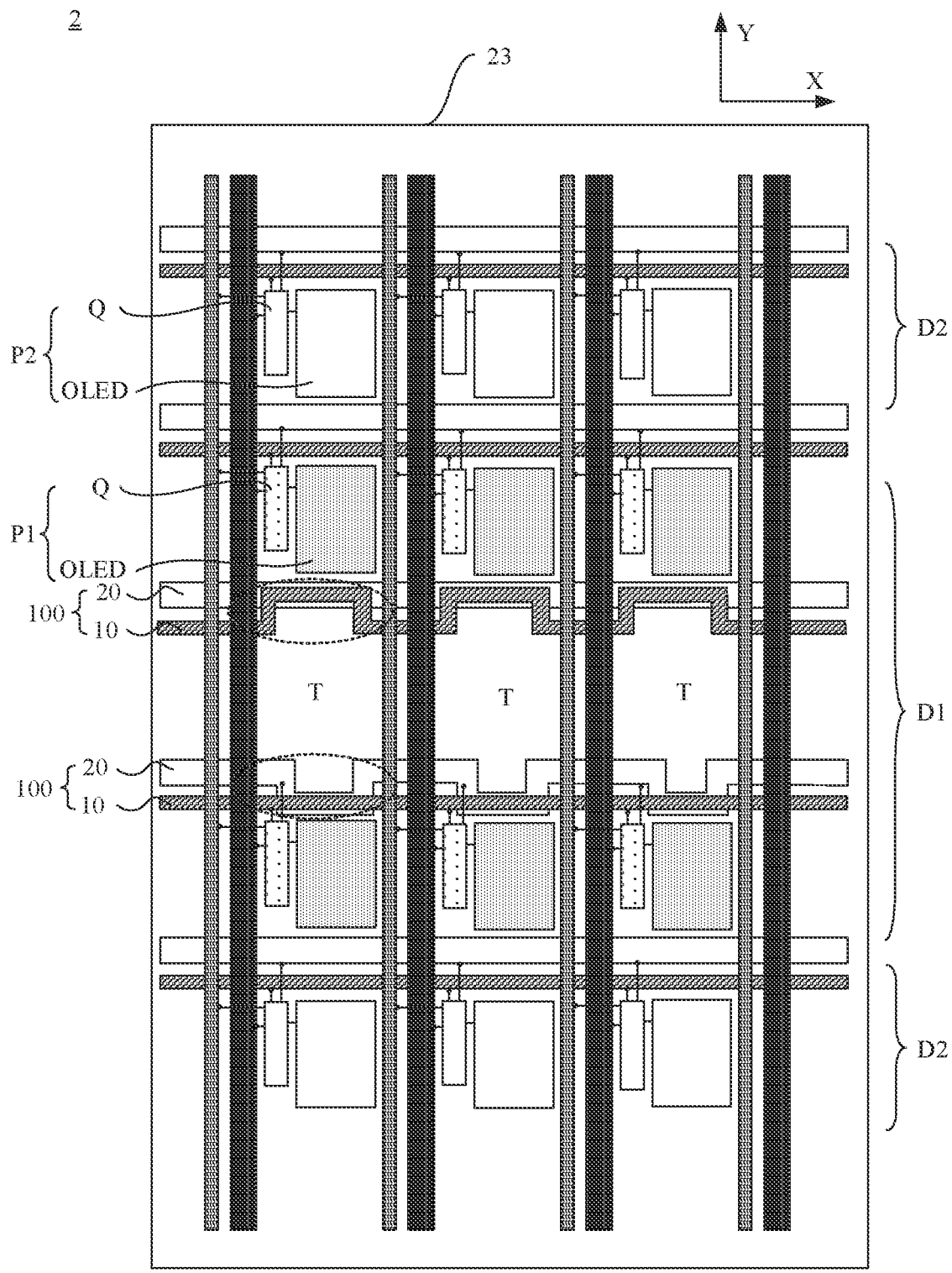
FIG. 7e is a schematic diagram of a structure of another display according to an embodiment of this application.

To reduce blocked areas of the first signal line 10 and the second signal line 20, and maximize an area of the regions in which the transparent subpixels T are located, so as to improve transmittance, in another possible embodiment, as shown in FIG. 7e, when one side of the first signal line group 100 is the transparent subpixels T, and the other side is the first light-emitting subpixels P1, a signal line that is in the first signal line group 100 and that is close to the transparent subpixels T bends toward a signal line that is far away from the transparent subpixels T (as shown in regions drawn by elliptical dotted lines in FIG. 7e).

For example, as shown in FIG. 7e, in the first signal line group 100 located above the transparent subpixels T in the first subpixel array D1, the first signal line 10 is close to the transparent subpixels T. Therefore, the first signal line 10 bends toward the second signal line 20 in the regions in which the transparent subpixels T are located, so that the first signal line 10 overlaps the second sub-signal line 20.

In the first signal line group 100 located below the transparent subpixels T in the first subpixel array D1, the second sub-signal line 20 is close to the transparent subpixels T. Therefore, the second sub-signal line 20 bends toward the first signal line 10 in the regions in which the transparent subpixels T are located, so that the first signal line 10 overlaps the second sub-signal line 20.

It should be noted that, as shown in FIG. 7a to FIG. 7e, although the orthographic projection of the first signal line 10 on the substrate 23 and the orthographic projection of the second signal line 20 on the substrate 23 overlap, the first signal line 10 and the second signal line 20 are insulated from each other.

In this embodiment of this application, the structures of the first signal line 10 and the second signal line 20 are adjusted, so that the orthographic projections of the first signal line 10 and the second signal line 20 on the substrate 23 overlap in the regions in which the transparent subpixels T are located, and overlapping parts of the orthographic projections of the first signal line 10 and the second signal line 20 do not form a diffraction grating. Therefore, the structures of the first signal line 10 and the second signal line 20 provided in this embodiment of this application can reduce diffraction gratings formed between the first signal line 10 and the second signal line 20, to reduce impact of the first signal line 10 and the second signal line 20 on light emitted into the display 2, and improve transmittance of light in the first display region A1 in which the first subpixel array D1 is located. The optical component 6 in the terminal is disposed on the back of the display 2, and corresponds to the first display region A1. Therefore, a daylighting effect of the optical component 6 can be improved.

In addition, after the orthographic projections of the first signal line 10 and the second signal line 20 on the substrate 23 overlap in the regions in which the transparent subpixels T are located, the area of the regions in which the transparent subpixels T are located may be increased, blocking of the regions in which the transparent subpixels T are located by the first signal line 10 and the second signal line 20 is reduced, and transmittance of the regions in which the transparent subpixels T are located is improved. Therefore, a daylighting effect of the optical component 6 can be further improved.

Figure 8A:
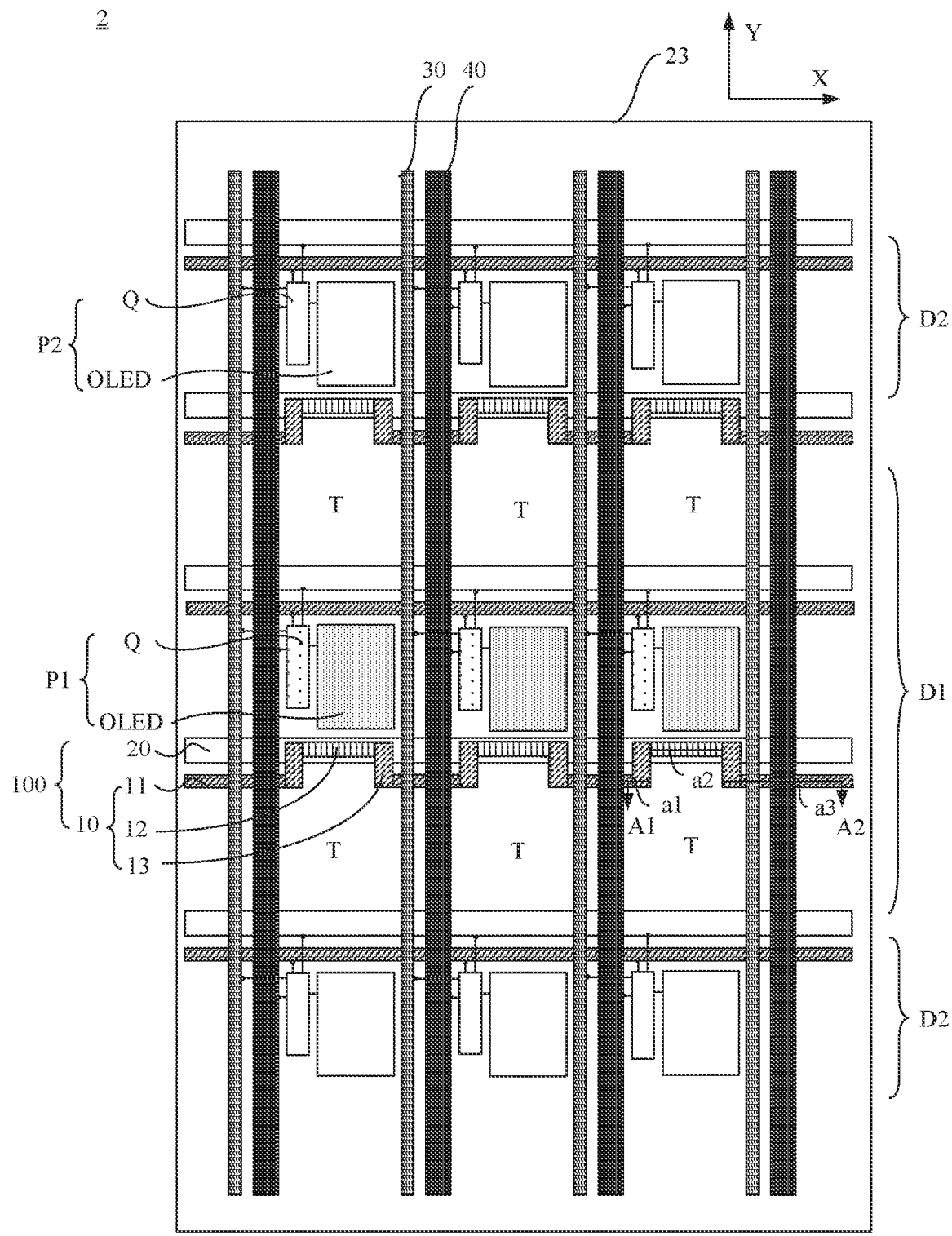
FIG. 8a is a schematic diagram of a structure of another display according to an embodiment of this application.

For the structures of the first signal line 10 and the second signal line 20, in a possible embodiment, as shown in FIG. 8a, the first signal line 10 includes at least one first sub-signal line 11 and at least one second sub-signal line 12.

The first sub-signal line 11 and the second sub-signal line 12 are disposed in parallel, that is, the first sub-signal line 11 and the second sub-signal line 12 are arranged in a staggered manner, and the first sub-signal line 11 and the second sub-signal line 12 are not on a same extension line.

The first sub-signal line 11 and the second sub-signal line 12 are alternately connected along the extension direction of the first signal line 10.

A connection manner between the first sub-signal line 11 and the second sub-signal line 12 is not limited. For example, as shown in FIG. 8a, the first sub-signal line 11 is connected to the second sub-signal line 12 through a first connection line 13.

When the first sub-signal line 11 and the second sub-signal line 12 are at a same layer, the first connection line 13 and the first sub-signal line 11 may be at a same layer, and two ends of the first connection line 13 are directly connected to the first sub-signal line 11 and the second sub-signal line 12. In this case, the first sub-signal line 11, the second sub-signal line 12, and the first connection line 13 may be of an integrated structure.

When the first sub-signal line 11 and the second sub-signal line 12 are at different layers, the first connection line 13 and the first sub-signal line 11 may be at a same layer, or the first connection line 13 and the first sub-signal line 11 may be of an integrated structure. The first connection line 13 is connected to the second sub-signal line 12 through a via, to implement the connection between the first sub-signal line 11 and the second sub-signal line 12. Alternatively, the first connection line 13 and the second sub-signal line 12 may be at a same layer, and the first connection line 13 and the second sub-signal line 12 may be of an integrated structure. The first connection line 13 is connected to the first sub-signal line 11 through a via, to implement the connection between the first sub-signal line 11 and the second sub-signal line 12.

Certainly, regardless of the structure, the first connection line 13 is not connected to the second signal line 20, to avoid a short circuit.

The second sub-signal line 12 is located in the regions in which the transparent subpixels T are located, and the second sub-signal line 12 and the second signal line 20 are disposed at different layers.

In a same first signal line group 100, an orthographic projection of the second sub-signal line 12 on the substrate 23 overlaps the orthographic projection of the second signal line 20 on the substrate 23.

That is, in the first signal line 10, the second sub-signal line 12 is located in the regions in which the transparent subpixels T are located, and the second sub-signal line 12 is located right above or right below the second signal line 20.

The following describes a location relationship between the first sub-signal line 11, the second sub-signal line 12, and the second signal line 20.

Figure 8B:
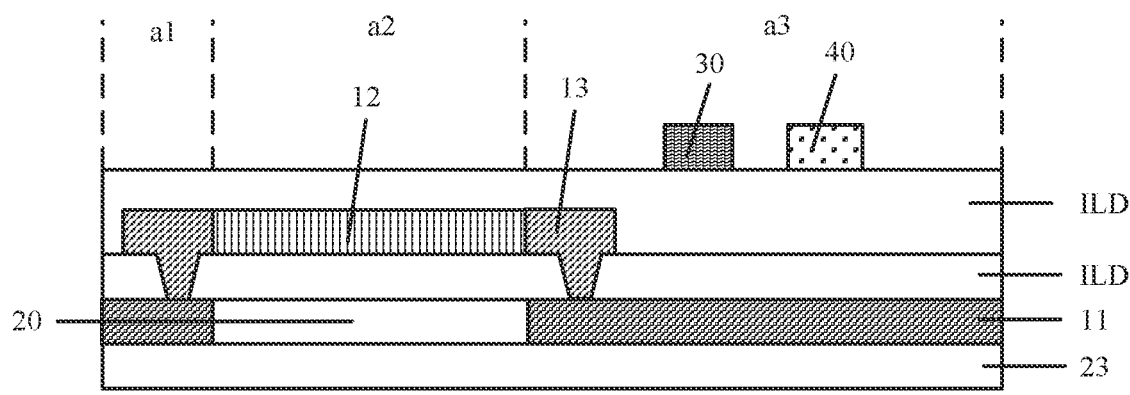
FIG. 8b is a section view along a direction A1-A2 in FIG. 8a according to an embodiment of this application.

In a first possible embodiment, details are as follows:

As shown in FIG. 8b (a section view along a direction A1-A2 in FIG. 8a), the second sub-signal line 12 and the first sub-signal line 11 are disposed at different layers, and the first sub-signal line 11 and the second signal line 20 are disposed at a same layer.

That is, the first sub-signal line 11 in the first signal line 10 and the second signal line 20 are disposed at the same layer, and the second sub-signal line 12 in the first signal line 10 is jumpered to another film layer, so that the second sub-signal line 12 is located right above or right below the second signal line 20.

As shown in FIG. 8b, to avoid a short circuit of signal lines between adjacent film layers, an inter layer dielectric (inter layer dielectric, ILD) layer is disposed between signal lines of adjacent layers. A quantity of ILD layers between the adjacent signal lines is not limited. In FIG. 8b, only one ILD layer is used as an example for description. A material of the ILD layer is not limited, and materials that can perform an insulation function may all be applicable to the ILD layer.

To avoid the short circuit between the first connection line 13 and the second signal line 20, as shown in FIG. 8b, the first connection line 13 and the second sub-signal line 12 are disposed at the same layer, and the first connection line 13 is connected to the first sub-signal line 11 through the via located at an ILD layer between the first sub-signal line 11 and the second sub-signal line 12, to implement the connection between the first sub-signal line 11 and the second sub-signal line 12.

For a location relationship between the third signal line 30, the fourth signal line 40, and the first signal line 10, optionally, as shown in FIG. 8b, the third signal line 30 and the fourth signal line 40 are disposed at a same layer, and the third signal line 30 and the fourth signal line 40 are disposed at a different layer from the first sub-signal line 11 and the second sub-signal line 12.

Figure 8C:
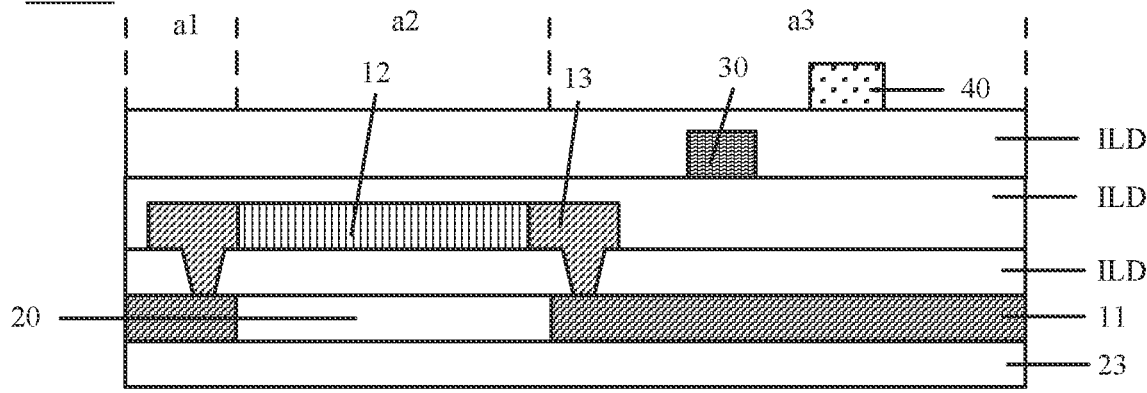
FIG. 8c is another section view along a direction A1-A2 in FIG. 8a according to an embodiment of this application.

Alternatively, for a location relationship between the third signal line 30, the fourth signal line 40, and the first signal line 10, optionally, as shown in FIG. 8c (a section view along the direction A1-A2 in FIG. 8a), the third signal line 30 and the fourth signal line 40 are disposed at different layers, and the third signal line 30 and the fourth signal line 40 are disposed at different layers from the first sub-signal line 11 and the second sub-signal line 12.

Certainly, the third signal line 30 may be located above the fourth signal line 40, or the fourth signal line 40 may be located above the third signal line 30.

When the third signal line 30 and the fourth signal line 40 are disposed at different layers from the first sub-signal line 11 and the second sub-signal line 12, in some embodiments, as shown in FIG. 8a, a second sub-signal line 12 is located in a region in which the transparent subpixel T is located and does not penetrate the region, and the first sub-signal line 11 crosses a boundary between two adjacent transparent subpixels T. Orthographic projections of the third signal line 30 and the fourth signal line 40 on the substrate 23 do not overlap the orthographic projection of the second sub-signal line 1 on the substrate 23. In addition, the orthographic projection of the third signal line 30 on the substrate 23 and the orthographic projection of the fourth signal line 40 on the substrate 23 cross an orthographic projection of the first sub-signal line 11 on the substrate 23.

That is, a second sub-signal line 12 is located in a region in which the transparent subpixel T is located, and does not cross signal lines (for example, the third signal line 30 and the fourth signal line 40) located at a boundary between two adjacent transparent subpixels T.

Figure 8D:
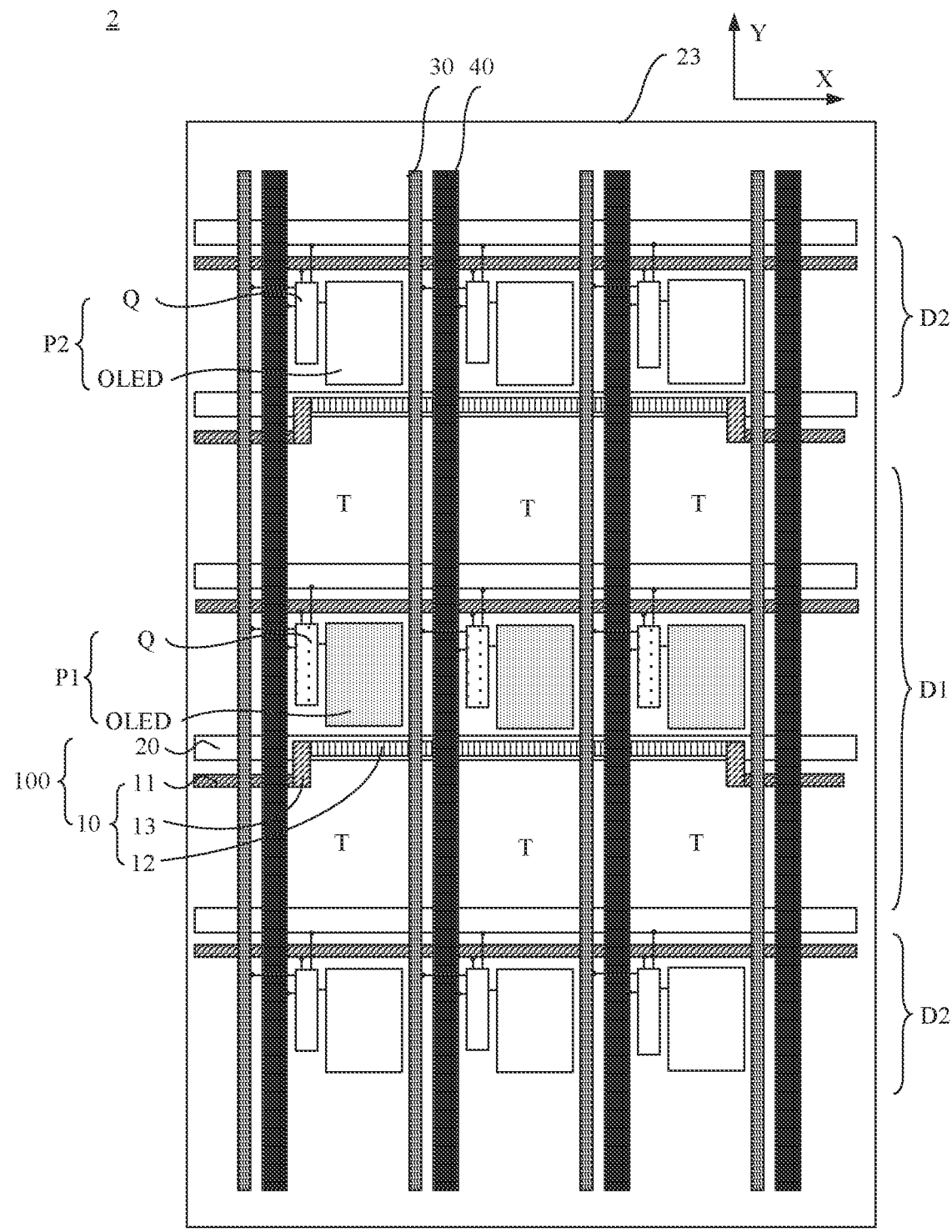
FIG. 8d is a schematic diagram of a structure of another display according to an embodiment of this application.

When the third signal line 30 and the fourth signal line 40 are disposed at different layers from the first sub-signal line 11 and the second sub-signal line 12, in some other embodiments, to reduce a quantity of second sub-signal lines 12, so as to reduce complexity of the first signal line 10, as shown in FIG. 8d, the second sub-signal line 12 penetrates, along an extension direction of the second sub-signal line 12, at least one region in which the transparent subpixel T is located.

Figure 8E:
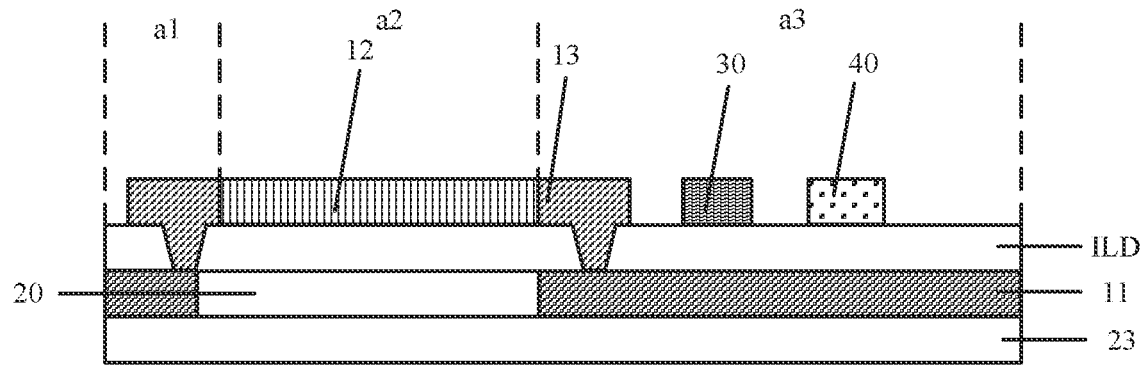
FIG. 8e is another section view along a direction A1-A2 in FIG. 8a according to an embodiment of this application.

Alternatively, for a location relationship between the third signal line 30, the fourth signal line 40, and the first signal line 10, optionally, as shown in FIG. 8e (a section view along the direction A1-A2 in FIG. 8a), the third signal line 30 and the fourth signal line 40 are disposed at a same layer, and the second sub-signal line 12 is disposed at a same layer as the third signal line 30 and the fourth signal line 40.

Therefore, when the third signal line 30 and the fourth signal line 40 are prepared, the second sub-signal line 12 may be prepared in a same process, to simply a preparation process. In addition, the second sub-signal line 12 is disposed at the same layer as the third signal line 30 and the fourth signal line 40, so that a quantity of insulation layers between layers can be reduced, and the display 2 is lightened and thin.

Figure 8F:
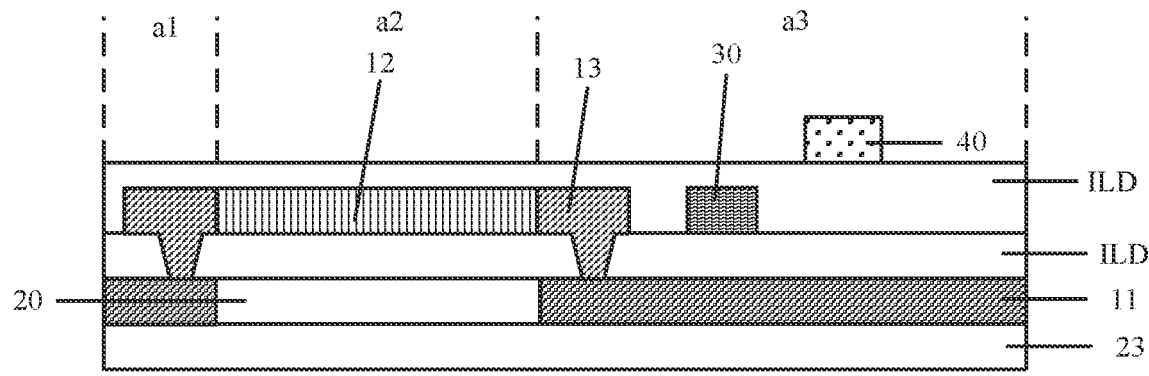
FIG. 8f is another section view along a direction A1-A2 in FIG. 8a according to an embodiment of this application.

Alternatively, for a location relationship between the third signal line 30, the fourth signal line 40, and the first signal line 10, optionally, as shown in FIG. 8f (a section view along the direction A1-A2 in FIG. 8a), the third signal line 30 and the fourth signal line 40 are disposed at different layers, and the second sub-signal line 12 and the third signal line 30 are disposed at a same layer.

Therefore, when the third signal line 30 is prepared, the second sub-signal line 12 may be prepared in a same process, to simply a preparation process. In addition, the second sub-signal line 12 and the third signal line 30 are disposed at the same layer, so that a quantity of insulation layers between layers can be reduced, and the display 2 is lightened and thin.

Figure 8G:
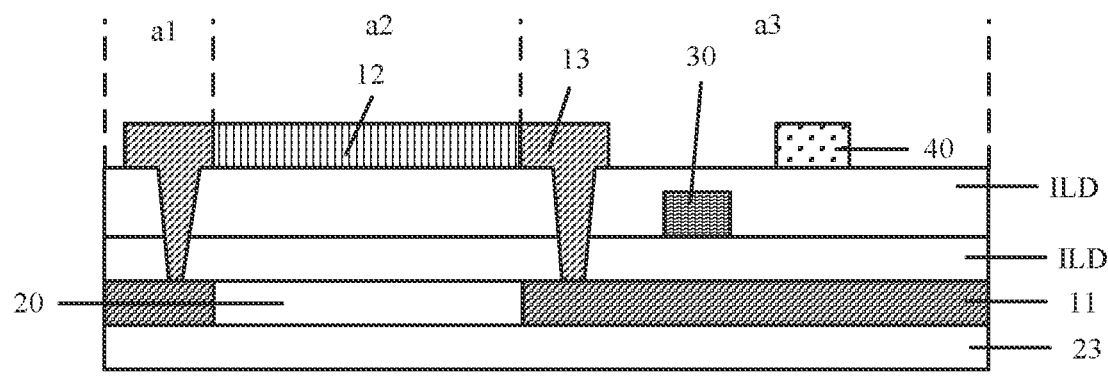
FIG. 8g is another section view along a direction A1-A2 in FIG. 8a according to an embodiment of this application.

Alternatively, for a location relationship between the third signal line 30, the fourth signal line 40, and the first signal line 10, optionally, as shown in FIG. 8g (a section view along the direction A1-A2 in FIG. 8a), the third signal line 30 and the fourth signal line 40 are disposed at different layers, and the second sub-signal line 12 and the fourth signal line 40 are disposed at a same layer.

Therefore, when the fourth signal line 40 is prepared, the second sub-signal line 12 may be prepared in a same process, to simply a preparation process. In addition, the second sub-signal line 12 and the fourth signal line 40 are disposed at the same layer, so that a quantity of insulation layers between layers can be reduced, and the display 2 is lightened and thin.

When the third signal line 30 and/or the fourth signal line 40 are/is disposed at a same layer as the second sub-signal line 12, in some embodiments, as shown in FIG. 8a, a second sub-signal line 12 is located in a region in which the transparent subpixel T is located and does not penetrate the region, and the first sub-signal line 11 crosses a boundary between two adjacent transparent subpixels T. Orthographic projections/an orthographic projection of the third signal line 30 and/or the fourth signal line 40 on the substrate 23 do/does not overlap the orthographic projection of the second sub-signal line 12 on the substrate 23. In addition, the orthographic projection of the third signal line 30 on the substrate 23 and the orthographic projection of the fourth signal line 40 on the substrate 23 cross an orthographic projection of the first sub-signal line 11 on the substrate 23.

That is, when the third signal line 30 and the second sub-signal line 12 are disposed at the same layer, the third signal line 30 and the second sub-signal line 12 are not crossed, and the third signal line 30 and the first sub-signal line 11 are crossed. When the fourth signal line 40 and the second sub-signal line 12 are disposed at the same layer, the fourth signal line 40 and the second sub-signal line 12 are not crossed, and the fourth signal line 40 and the first sub-signal line 11 are crossed.

It should be noted that a location relationship between the first sub-signal line 11 and the second sub-signal line 12 shown in FIG. 8b and FIG. 8c and. FIG. 8e to FIG. 8g is merely an example, and constitutes no limitation provided that the first sub-signal line 11 and the second sub-signal line 12 are disposed at different layers.

In a second possible embodiment, details are as follows:

A difference between the second possible embodiment and the first possible embodiment lies in that the first sub-signal line 11 and the second signal line 20 are disposed at different layers.

Figure 9A:
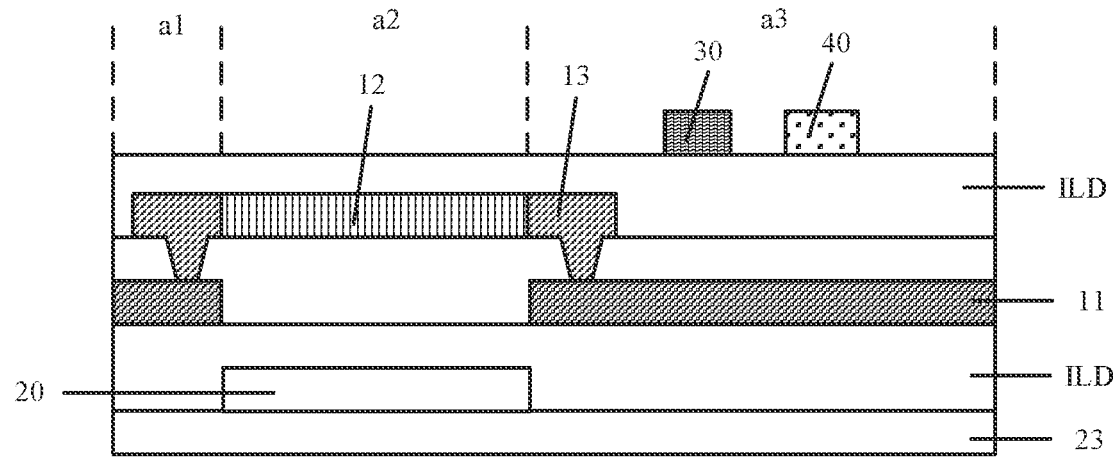
FIG. 9a is another section view along a direction A1-A2 in FIG. 8a according to an embodiment of this application.

As shown in FIG. 9a (a section view along a direction A1-A2 in FIG. 8a), the second sub-signal line 12 and the first sub-signal line 11 are disposed at different layers, and the first sub-signal line 11 and the second signal line 20 are disposed at different layers.

That is, the first sub-signal line 11 in the first signal line 10 and the second signal line 20 are disposed at the different layers, and the second sub-signal line 12 in the first signal line 10 and the second signal line 20 are disposed at different layers, and the first sub-signal line 11 and the second sub-signal line 12 in the first signal line 10 are also disposed at different layers.

The first sub-signal line 11 and the second signal line 20 are disposed at different layers, and the first sub-signal line 11 may be located above the second signal line 20. In this case, the first connection line 13 and the first sub-signal line 11 may be at a same layer, or the first connection line 13 and the second sub-signal line 12 may be at a same layer, to avoid a short circuit between the first connection line 13 and the second signal line 20. The first sub-signal line 11 may alternatively be located below the second signal line 20. In this case, the first connection line 13 and the second sub-signal line 12 are at a same layer, to avoid a short circuit between the first connection line 13 and the second signal line 20. In this example, an example in which the first sub-signal line 11 is located above the second signal line 20, and the first connection line 13 and the second sub-signal line 12 are disposed at a same layer is used for description.

Similarly, for a location relationship between the third signal line 30, the fourth signal line 40, and the first signal line 10, optionally, as shown in FIG. 9a, the third signal line 30 and the fourth signal line 40 are disposed at a same layer, and the third signal line 30 and the fourth signal line 40 are disposed at a different layer from the first sub-signal line 11 and the second sub-signal line 12.

Figure 9B:
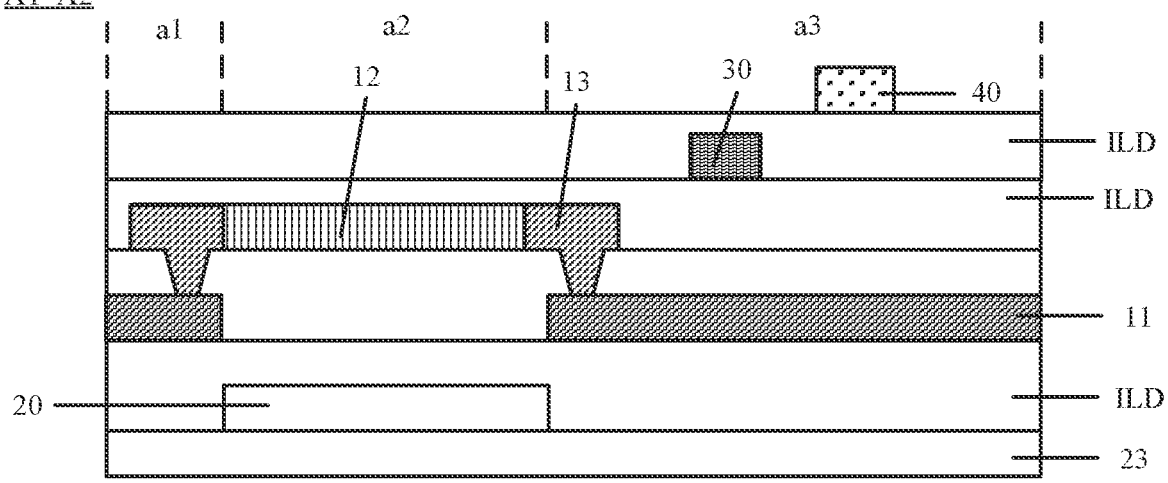
FIG. 9b is another section view along a direction A1-A2 in FIG. 8a according to an embodiment of this application.

Alternatively, for a location relationship between the third signal line 30, the fourth signal line 40, and the first signal line 10, optionally, as shown in FIG. 9b (a section view along a direction A1-A2 in FIG. 8a), the third signal line 30 and the fourth signal line 40 are disposed at different layers, and the third signal line 30 and the fourth signal line 40 are disposed at different layers from the first sub-signal line 11 and the second sub-signal line 12.

Certainly, the third signal line 30 may be located above the fourth signal line 40, or the fourth signal line 40 may be located above the third signal line 30.

When the third signal line 30 and the fourth signal line 40 are disposed at different layers from the first sub-signal line 11 and the second sub-signal line 12, in some embodiments, as shown in FIG. 8a, a second sub-signal line 12 is located in a region in which the transparent subpixel T is located and does not penetrate the region, and the first sub-signal line 11 crosses a boundary between two adjacent transparent subpixels T. Orthographic projections of the third signal line 30 and the fourth signal line 40 on the substrate 23 do not overlap the orthographic projection of the second sub-signal line 12 on the substrate 23. In addition, the orthographic projection of the third signal line 30 on the substrate 23 and the orthographic projection of the fourth signal line 40 on the substrate 23 cross an orthographic projection of the first sub-signal line 11 on the substrate 23.

That is, a second sub-signal line 12 is located in a region in which the transparent subpixel T is located, and does not cross signal lines (for example, the third signal line 30 and the fourth signal line 40) located at a boundary between two adjacent transparent subpixels T.

When the third signal line 30 and the fourth signal line 40 are disposed at different layers from the first sub-signal line 11 and the second sub-signal line 12, in some other embodiments, to reduce a quantity of second sub-signal lines 12, so as to reduce complexity of the first signal line 10, as shown in FIG. 8d, the second sub-signal line 12 penetrates, along an extension direction of the second sub-signal line 12, at least one region in which the transparent subpixel T is located.

Figure 9C:
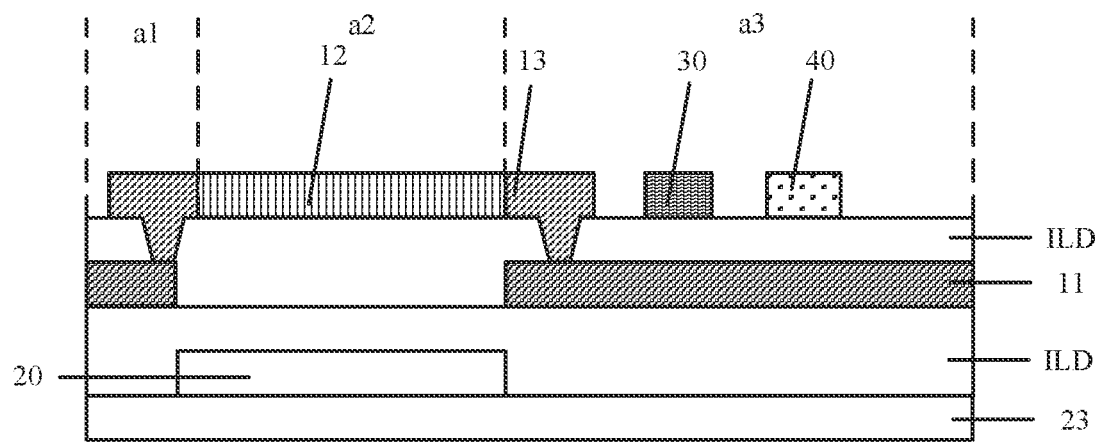
FIG. 9c is another section view along a direction A1-A2 in FIG. 8a according to an embodiment of this application.

Alternatively, for a location relationship between the third signal line 30, the fourth signal line 40, and the first signal line 10, optionally, as shown in FIG. 9c (a section view along the direction A1-A2 in FIG. 8a), the third signal line 30 and the fourth signal line 40 are disposed at a same layer, and the second sub-signal line 12 is disposed at a same layer as the third signal line 30 and the fourth signal line 40.

Therefore, when the third signal line 30 and the fourth signal line 40 are prepared, the second sub-signal line 12 may be prepared in a same process, to simply a preparation process. In addition, the second sub-signal line 12 is disposed at the same layer as the third signal line 30 and the fourth signal line 40, so that a quantity of insulation layers between layers can be reduced, and the display 2 is lightened and thin.

Figure 9D:
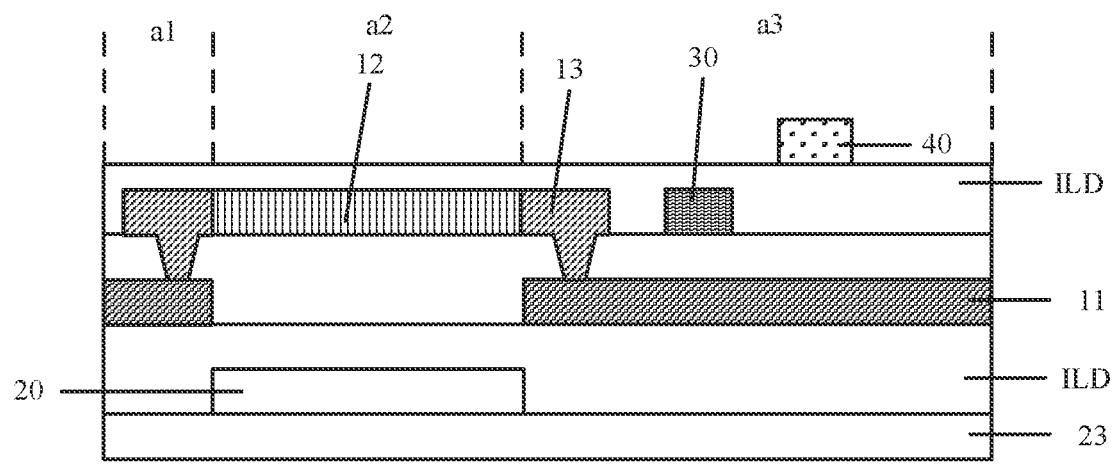
FIG. 9d is another section view along a direction A1-A2 in FIG. 8a according to an embodiment of this application.

Alternatively, for a location relationship between the third signal line 30, the fourth signal line 40, and the first signal line 10, optionally, as shown in FIG. 9d (a section view along the direction A1-A2 in FIG. 8a), the third signal line 30 and the fourth signal line 40 are disposed at different layers, and the second sub-signal line 12 and the third signal line 30 are disposed at a same layer.

Therefore, when the third signal line 30 is prepared, the second sub-signal line 12 may be prepared in a same process, to simply a preparation process. In addition, the second sub-signal line 12 and the third signal line 30 are disposed at the same layer, so that a quantity of insulation layers between layers can be reduced, and the display 2 is lightened and thin.

Figure 9E:
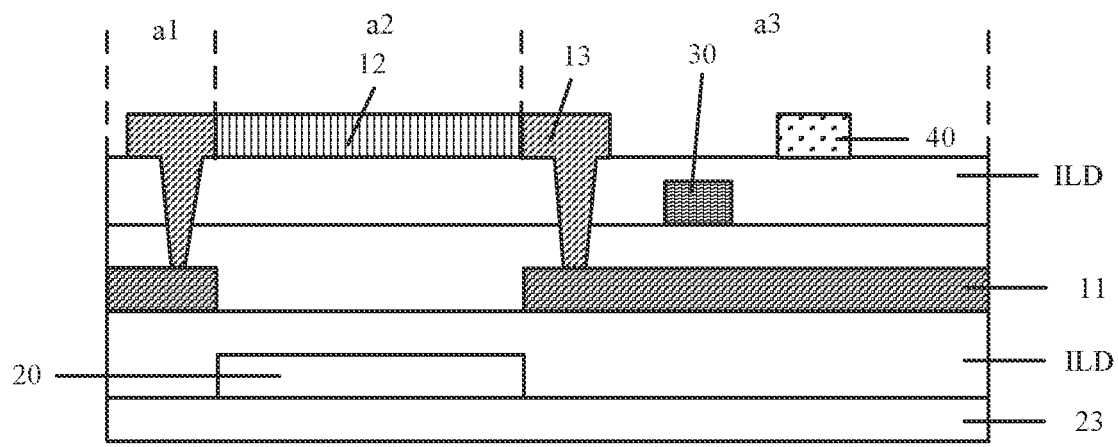
FIG. 9e is another section view along a direction A1-A2 in FIG. 8a according to an embodiment of this application.

Alternatively, for a location relationship between the third signal line 30, the fourth signal line 40, and the first signal line 10, optionally, as shown in FIG. 9e (a section view along the direction A1-A2 in FIG. 8a), the third signal line 30 and the fourth signal line 40 are disposed at different layers, and the second sub-signal line 12 and the fourth signal line 40 are disposed at a same layer.

Therefore, when the fourth signal line 40 is prepared, the second sub-signal line 12 may be prepared in a same process, to simply a preparation process. In addition, the second sub-signal line 12 and the fourth signal line 40 are disposed at the same layer, so that a quantity of insulation layers between layers can be reduced, and the display 2 is lightened and thin.

When the third signal line 30 and/or the fourth signal line 40 are/is disposed at a same layer as the second sub-signal line 12, in sonic embodiments, as shown in FIG. 8a, a second sub-signal line 12 is located in a region in which the transparent subpixel T is located and does not penetrate the region, and the first sub-signal line 11 crosses a boundary between two adjacent transparent subpixels T. Orthographic projections/an orthographic projection of the third signal line 30 and/or the fourth signal line 40 on the substrate 23 do/does not overlap the orthographic projection of the second sub-signal line 12 on the substrate 23. In addition, the orthographic projection of the third signal line 30 on the substrate 23 and the orthographic projection of the fourth signal line 40 on the substrate 23 cross an orthographic projection of the first sub-signal line 11 on the substrate 23.

That is, when the third signal line 30 and the second sub-signal line 12 are disposed at the same layer, the third signal line 30 and the second sub-signal line 12 are not crossed, and the third signal line 30 and the first sub-signal line 11 are crossed. When the fourth signal line 40 and the second sub-signal line 12 are disposed at the same layer, the fourth signal line 40 and the second sub-signal line 12 are not crossed, and the fourth signal line 40 and the first sub-signal line 11 are crossed.

It should be noted that a location relationship between the first sub-signal line 11, the second sub-signal line 12, and the second signal line 20 shown in FIG. 9a to FIG. 9e is merely an example, and constitutes no limitation provided that two of the first sub-signal line 11, the second sub-signal line 12, and the second signal line 20 are disposed at different layers.

In a third possible embodiment, details are as follows:

A difference between the third possible embodiment and the first and second possible embodiments lies in that the second sub-signal line 12 and the first sub-signal line 11 are disposed at a same layer.

Figure 10A:
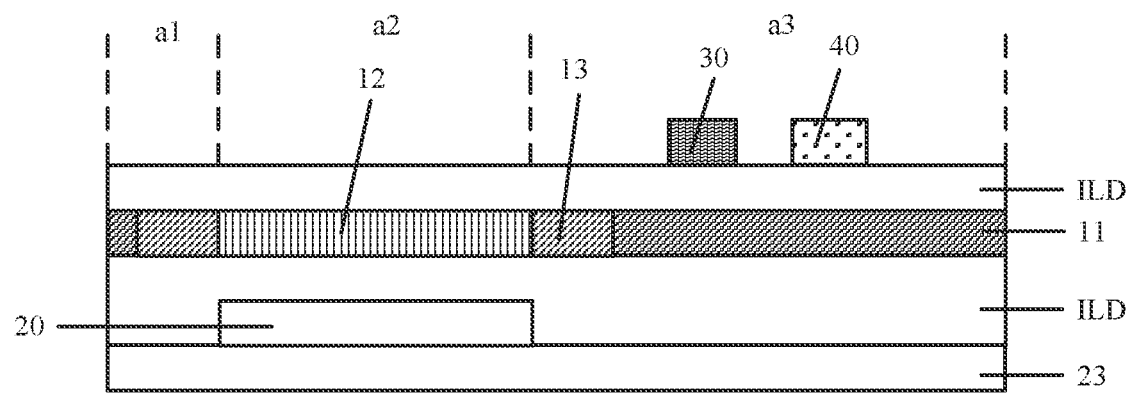
FIG. 10a is another section view along a direction A1-A2 in FIG. 8a according to an embodiment of this application.

As shown in FIG. 10a (a section view along a direction A1-A2 in FIG. 8a), the second sub-signal line 12 and the first sub-signal line 11 are disposed at a same layer. As shown in FIG. 8a, in a same first signal line group 100, an orthographic projection of the first sub-signal line 11 on the substrate 23 and the orthographic projection of the second signal line 20 on the substrate 23 are disposed side by side.

That is, the first sub-signal line 11 and the second sub-signal line 12 in the first signal line 10 are disposed at the same layer, and the first signal line 10 and the second signal line 20 are disposed at different layers. The orthographic projection of the first sub-signal line 11 in the first signal line 10 on the substrate 23 and the orthographic projection of the second signal line 20 on the substrate 23 are disposed side by side, and the second sub-signal line 12 in the first signal line 10 is located right above or right below the second signal line 20.

Similarly, for a location relationship between the third signal line 30, the fourth signal line 40, and the first signal line 10, optionally, as shown in FIG. 10a, the third signal line 30 and the fourth signal line 40 are disposed at a same layer, and the third signal line 30 and the fourth signal line 40 are disposed at a different layer from the first sub-signal line 11 and the second sub-signal line 12.

Figure 10B:
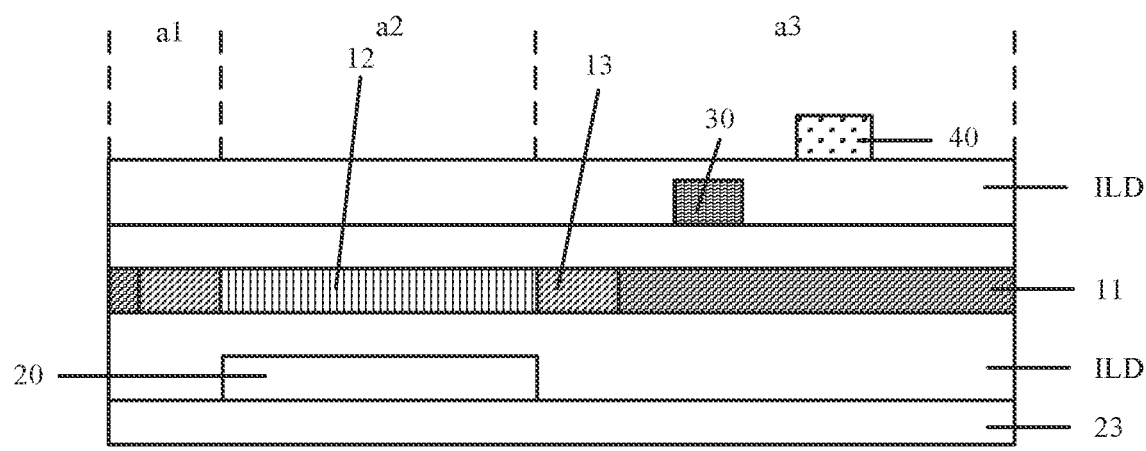
FIG. 10b is another section view along a direction A1-A2 in FIG. 8a according to an embodiment of this application.

Alternatively, for a location relationship between the third signal line 30, the fourth signal line 40, and the first signal line 10, optionally, as shown in FIG. 10b (a section view along a direction A1-A2 in FIG. 8a), the third signal line 30 and the fourth signal line 40 are disposed at different layers, and the third signal line 30 and the fourth signal line 40 are disposed at different layers from the first sub-signal line 11 and the second sub-signal line 12.

Certainly, the third signal line 30 may be located above the fourth signal line 40, or the fourth signal line 40 may be located above the third signal line 30.

When the third signal line 30 and the fourth signal line 40 are disposed at different layers from the first sub-signal line 11 and the second sub-signal line 12, in some embodiments, as shown in FIG. 8a, a second sub-signal line 12 is located in a region in which the transparent subpixel T is located and does not penetrate the region, and the first sub-signal line 11 crosses a boundary between two adjacent transparent subpixels T. Orthographic projections of the third signal line 30 and the fourth signal line 40 on the substrate 23 do not overlap the orthographic projection of the second sub-signal line 12 on the substrate 23. In addition, the orthographic projection of the third signal line 30 on the substrate 23 and the orthographic projection of the fourth signal line 40 on the substrate 23 cross the orthographic projection of the first sub-signal line 11 on the substrate 23.

That is, a second sub-signal line 12 is located in a region in which the transparent subpixel T is located, and does not cross signal lines (for example, the third signal line 30 and the fourth signal line 40) located at a boundary between two adjacent transparent subpixels When the third signal line 30 and the fourth signal line 40 are disposed at different layers from the first sub-signal line 11 and the second sub-signal line 12, in some other embodiments, to reduce a quantity of second sub-signal lines 12, so as to reduce complexity of the first signal line 10, as shown in FIG. 8d, the second sub-signal line 12 penetrates, along an extension direction of the second sub-signal line 12, at least one region in which the transparent subpixel T is located.

Figure 11:
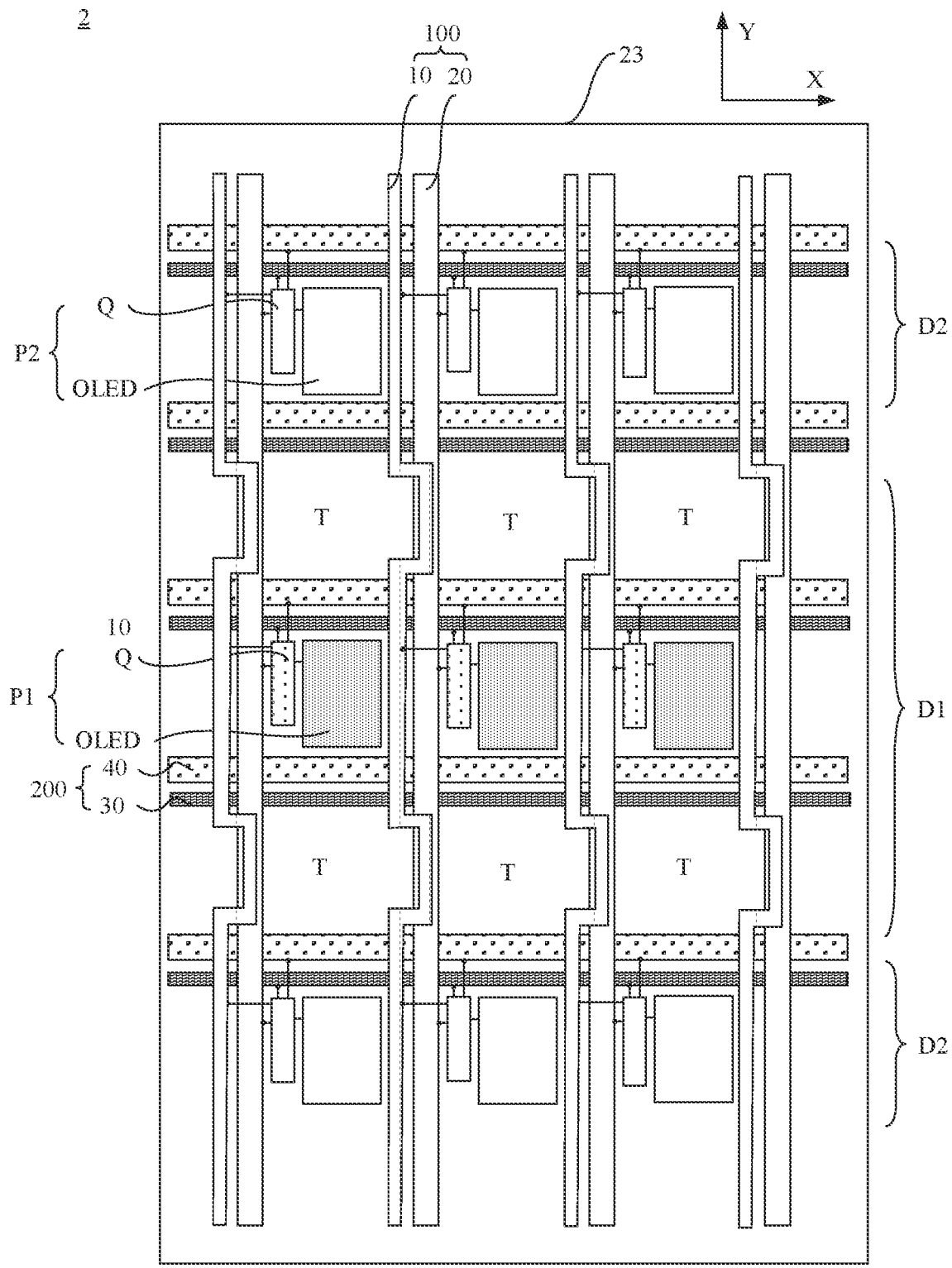
FIG. 11 is a schematic diagram of a structure of another display according to an embodiment of this application.

It may be understood that, in the schematic diagrams provided in this example, from a perspective of the figures, an example in which the first signal line 10 and the second signal line 20 extend along the horizontal direction X is used for description. Certainly, as shown in FIG. 11, the first signal line 10 and the second signal line 20 may also extend along the vertical direction Y. A structure in which the first signal line 10 and the second signal line 20 extend along the vertical direction Y is the same as the structure in which the first signal line 10 and the second signal line 20 extend along the horizontal direction X. Details are not described herein again.

Example 2

A difference between Example 2 and Example 1 lies in that structures of the third signal line 30 and the fourth signal line 40 in the display 2 are different.

Figure 12A:
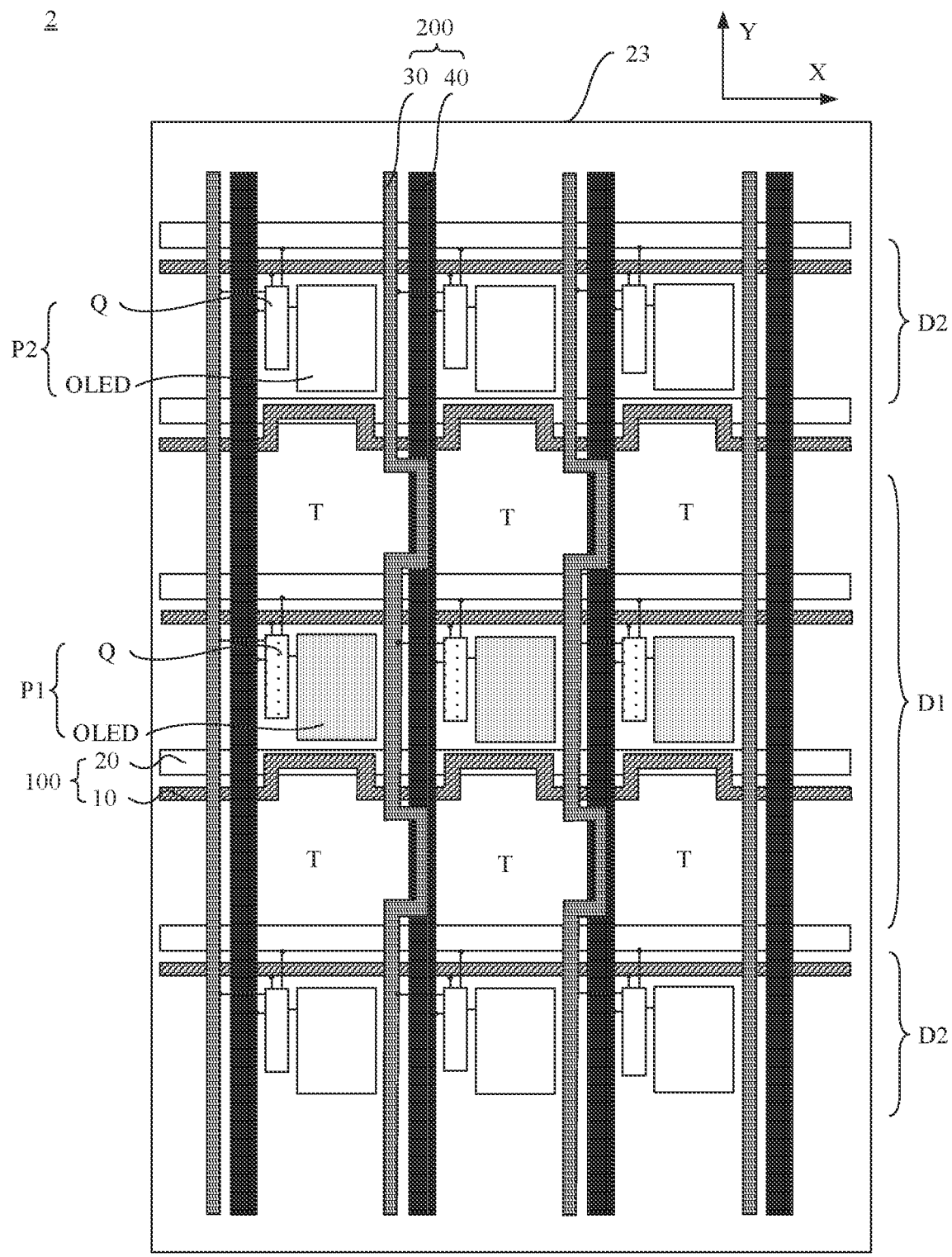
FIG. 12a is a schematic diagram of a structure of another display according to an embodiment of this application.

As shown in FIG. 12a, the display 2 includes a plurality of third signal lines 30 that are insulated from each other and a plurality of fourth signal lines 40 that are insulated from each other, and the plurality of third signal lines 30 and the plurality of fourth signal lines 40 extend in a same direction, are insulated from each other, and are alternately disposed on the substrate 23.

Orthographic projections of the third signal line 30 and the fourth signal line 40 in at least one second signal line group 200 on the substrate 23 overlap in some regions in which the transparent subpixels T are located.

That is, in a possible embodiment, the display 2 includes one second signal line group 200, and the orthographic projections of the third signal line 30 and the fourth signal line 40 in the second signal line group 200 on the substrate 23 overlap in some regions in which the transparent subpixels T are located.

In another possible embodiment, as shown in FIG. 12a, the display 2 includes a plurality of second signal line groups 200, and orthographic projections of the third signal line 30 and the fourth signal line 40 included in some of the plurality of second signal line groups 200 on the substrate 23 overlap in some regions in which the transparent subpixels T are located.

Figure 12B:
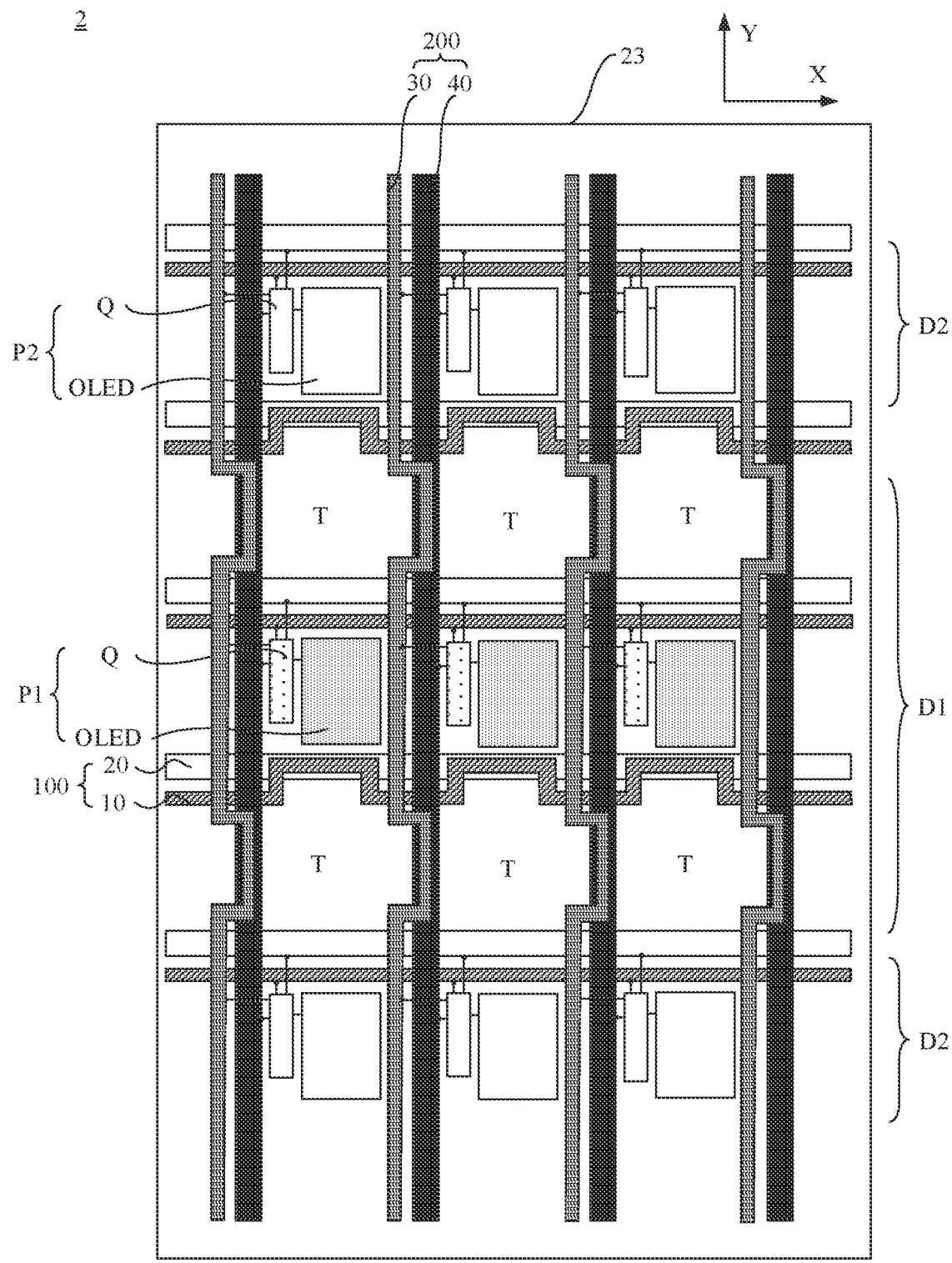
FIG. 12b is a schematic diagram of a structure of another display according to an embodiment of this application.

In another possible embodiment, as shown in FIG. 12b, the display 2 includes a plurality of second signal line groups 200, orthographic projections of the third signal line 30 and the fourth signal line 40 included in each of the plurality of second signal line groups 200 on the substrate 23 overlap in regions in which the transparent subpixels T are located.

That the orthographic projection of the third signal line 30 on the substrate 23 and the orthographic projection of the fourth signal line 40 on the substrate 23 overlap in the regions in which the transparent subpixels T are located may be understood that along a thickness direction of the display 2, a part of the third signal line 30 is located right above or right below the fourth signal line 40.

In a possible embodiment, as shown in FIG. 12b, the orthographic projection of the third signal line 30 on the substrate 23 and the orthographic projection of the fourth signal line 40 on the substrate 23 overlap in regions in which each transparent subpixel T is located.

Figure 12C:
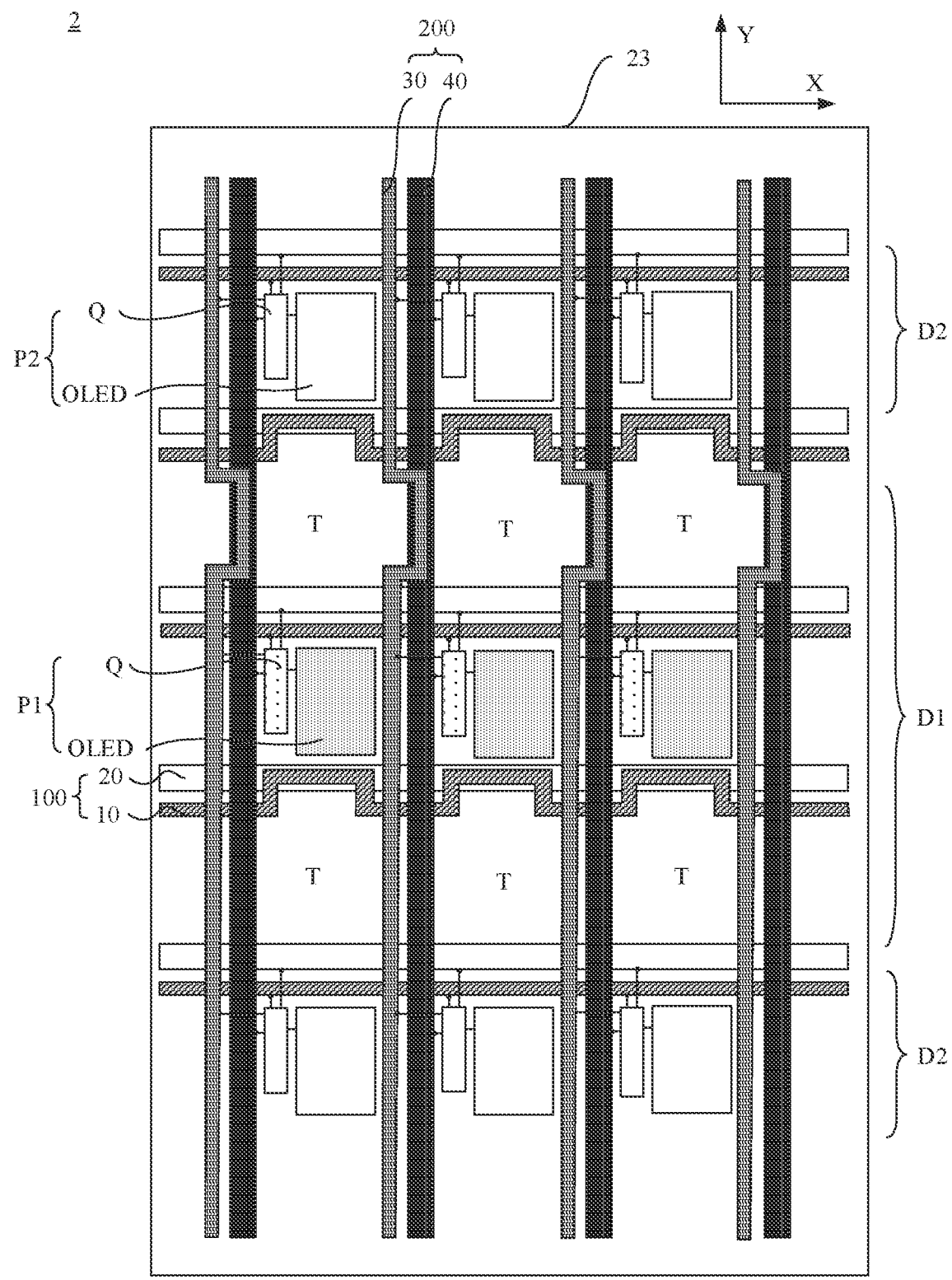
FIG. 12c is a schematic diagram of a structure of another display according to an embodiment of this application.

In another possible embodiment, as shown in FIG. 12c, the orthographic projection of the third signal line 30 on the substrate 23 and the orthographic projection of the fourth signal line 40 on the substrate 23 overlap in regions in which some of the plurality of transparent subpixels T are located.

In addition, to reduce changes to a production process, so as to reduce process complexity, in a possible embodiment, as shown in FIG. 12a to FIG. 12c, only a structure of a same signal line is changed, so that the third signal line 30 and the fourth signal line 40 that are originally parallel overlap.

Figure 12D:
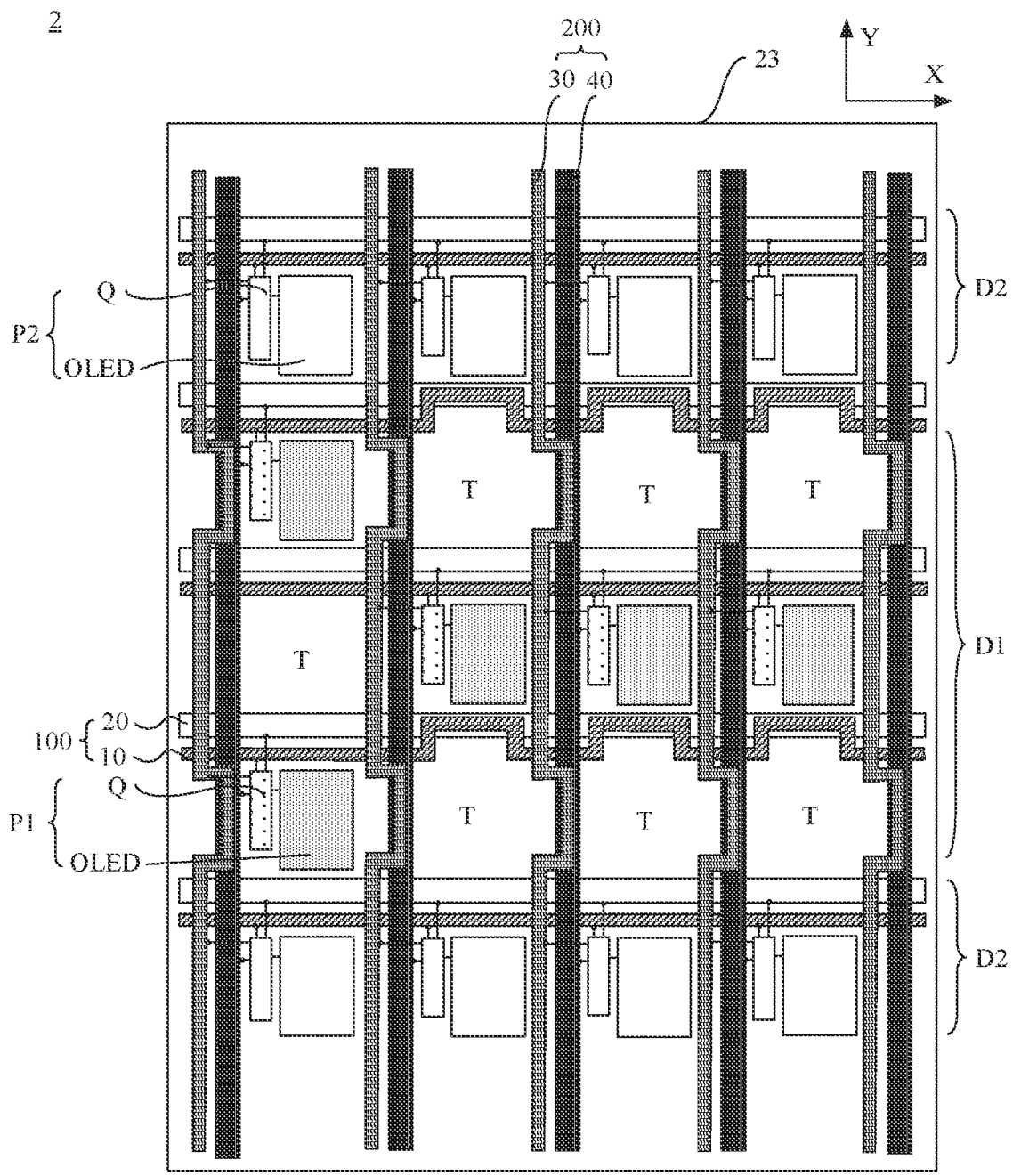
FIG. 12d is a schematic diagram of a structure of another display according to an embodiment of this application.

To unify the production process, structures of all third signal lines 30 are the same. In another possible embodiment, as shown in FIG. 12d, each third signal line 30 connected to the subpixels in the first subpixel array D1 has a same structure.

Figure 12E:
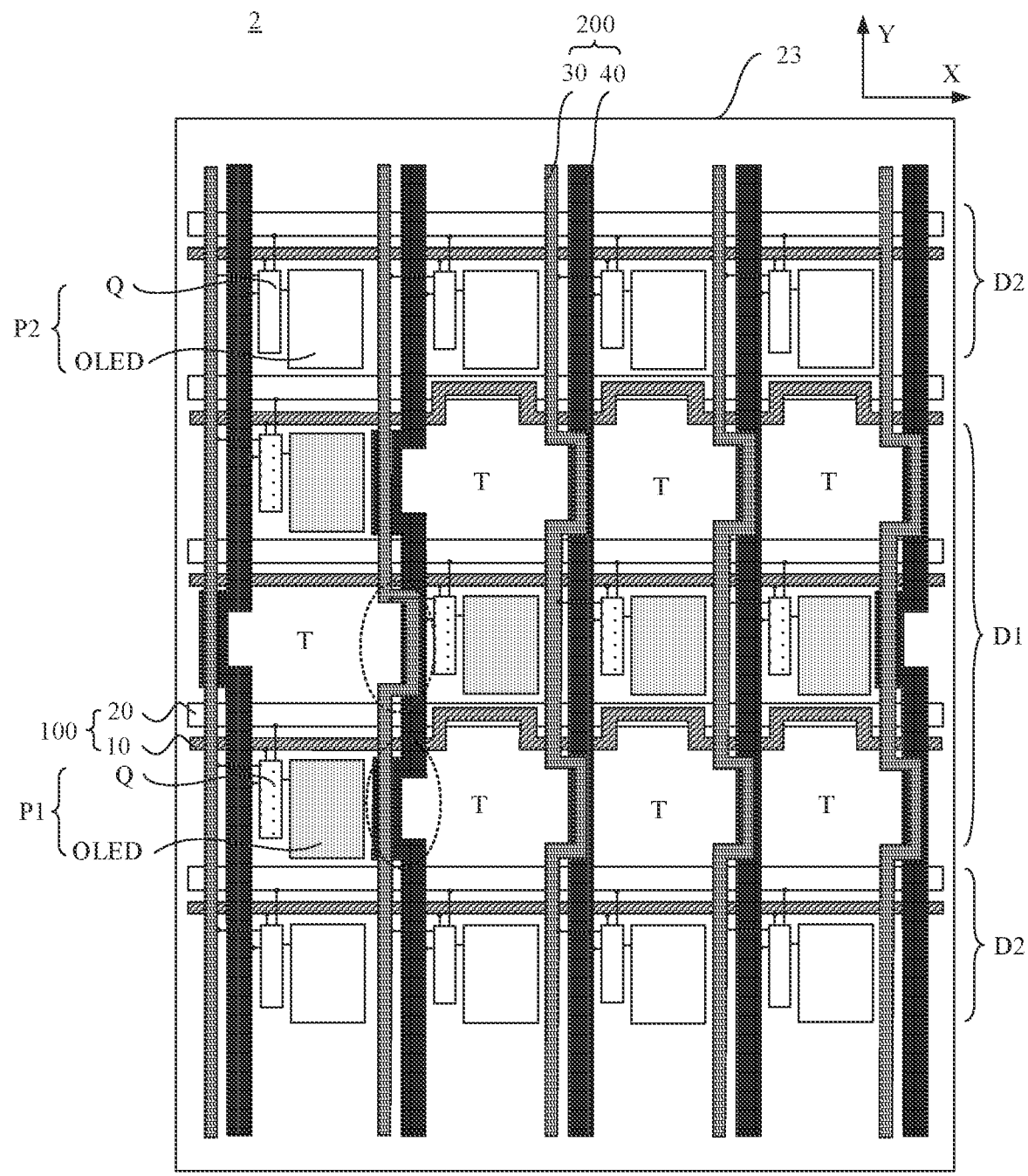
FIG. 12e is a schematic diagram of a structure of another display according to an embodiment of this application.

To reduce blocked areas of the third signal line 30 and the fourth signal line 40, and maximize an area of the regions in which the transparent subpixels T are located, so as to improve transmittance, in another possible embodiment, as shown in FIG. 12e, when one side of the second signal line group 200 is the transparent subpixels T, and the other side is the first light-emitting subpixels P1, a signal line that is in the second signal line group 200 and that is close to the transparent subpixels T bends toward a signal line that is far away from the transparent subpixels T (as shown in regions drawn by elliptical dotted lines in FIG. 12e).

For example, as shown in FIG. 12e, in the two regions drawn by the elliptical dotted lines, in the region that is located above and that is drawn by the elliptical dotted lines, the third signal line 30 is close to the transparent subpixel relative to the fourth signal line 40. Therefore, the third signal line 30 bends toward the fourth signal line 40, so that the third signal line 30 overlaps the fourth sub-signal line 40.

In the two regions drawn by the elliptical dotted lines, in the region that is located below and that is drawn by the elliptical dotted lines, the fourth signal line 40 is close to the transparent subpixel T relative to the third signal line 30. Therefore, the fourth signal line 40 bends toward the third signal line 30, so that the third signal line 30 overlaps the fourth sub-signal line 40.

It should be noted that, as shown in FIG. 12a to FIG. 12e, although the orthographic projection of the third signal line 30 on the substrate 23 and the orthographic projection of the fourth signal line 40 on the substrate 23 overlap, the third signal line 30 and the fourth sub-signal line 40 are insulated from each other.

In this embodiment of this application, the structures of the third signal line 30 and the fourth sub-signal line 40 are adjusted, so that the orthographic projections of the third signal line 30 and the fourth sub-signal line 40 on the substrate 23 overlap in the regions in which the transparent subpixels T are located, and overlapping parts of the orthographic projections of the third signal line 30 and the fourth sub-signal line 40 do not form a diffraction grating. Therefore, the structures of the third signal line 30 and the fourth sub-signal line 40 provided in this embodiment of this application can reduce diffraction gratings formed between the third signal line 30 and the fourth sub-signal line 40, to reduce impact of the third signal line 30 and the fourth sub-signal line 40 on light emitted into the display 2, and improve transmittance of light in the first display region A1 in which the first subpixel array D1 is located. The optical component 6 in the terminal is disposed on the back of the display 2, and corresponds to the first display region A1. Therefore, a daylighting effect of the optical component 6 can be improved.

In addition, after the orthographic projections of the third signal line 30 and the fourth sub-signal line 40 on the substrate 23 overlap in the regions in which the transparent subpixels T are located, the area of the regions in which the transparent subpixels T are located may be increased, blocking of the regions in which the transparent subpixels T are located by the third signal line 30 and the fourth sub-signal line 40 is reduced, and transmittance of the regions in which the transparent subpixels T are located is improved. Therefore, a daylighting effect of the optical component 6 can be further improved.

Figure 13A:
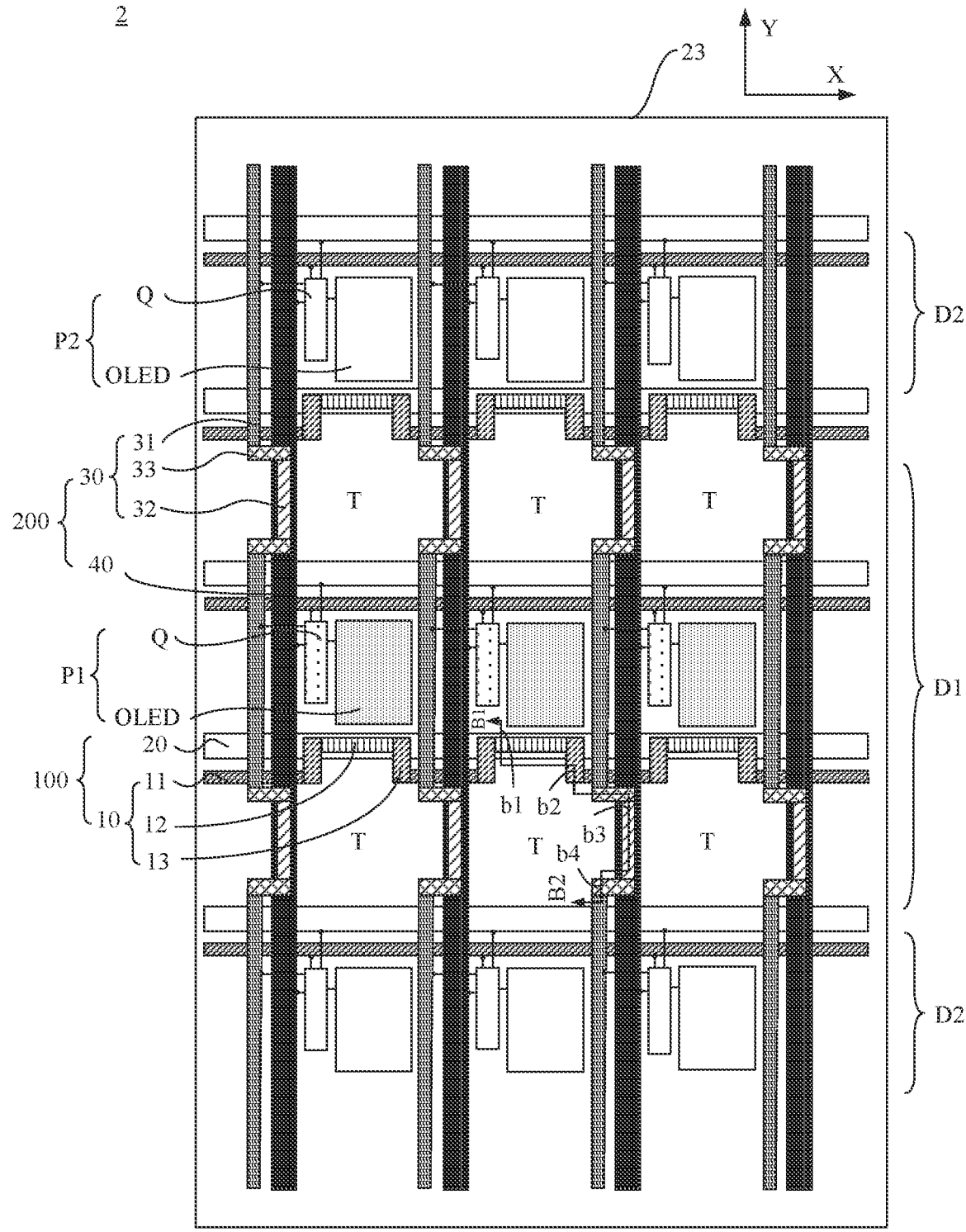
FIG. 13a is a schematic diagram of a structure of another display according to an embodiment of this application.

For the structures of the third signal line 30 and the fourth sub-signal line 40, in a possible embodiment, as shown in FIG. 13a, the third signal line 30 includes at least one third sub-signal line 31 and at least one fourth sub-signal line 32, and the third sub-signal line 31 and the fourth sub-signal line 32 are disposed in parallel, and the third sub-signal line 31 and the fourth sub-signal line 32 are alternately connected along the extension direction of the third signal line 30.

The third sub-signal line 31 and the fourth sub-signal line 32 are disposed in parallel, that is, the third sub-signal line 31 and the fourth sub-signal line 32 are arranged in a staggered manner, and the third sub-signal line 31 and the fourth sub-signal line 32 are not on a same extension line.

The third sub-signal line 31 and the fourth sub-signal line 32 are alternately connected along the extension direction of the third signal line 30, and a connection manner between the first sub-signal line 11 and the second sub-signal line 12 is not limited. For example, as shown in FIG. 13a, the third sub-signal line 31 is connected to the fourth sub-signal line 32 through a second connection line 33.

When the third sub-signal line 31 and the fourth sub-signal line 32 are at a same layer, the second connection line 33 may be at a same layer as the third sub-signal line 31, and two ends of the second connection line 33 are directly connected to the third sub-signal line 31 and the fourth sub-signal line 32. In this case, the third sub-signal line 31, the fourth sub-signal line 32, and the second connection line 33 may be of an integrated structure.

When the third sub-signal line 31 and the fourth sub-signal line 32 are at different layers, the second connection line 33 may be at a same layer as the third sub-signal line 31, or the second connection line 33 and the third sub-signal line 31 may be of an integrated structure. The second connection line 33 is connected to the fourth sub-signal line 32 through a via, to implement the connection between the third sub-signal line 31 and the fourth sub-signal line 32. Alternatively, the second connection line 33 may be at a same layer as the fourth sub-signal line 32, and the second connection line 33 and the fourth sub-signal line 32 may be of an integrated structure. The second connection line 33 is connected to the third sub-signal line 31 through a via, to implement the connection between the third sub-signal line 31 and the fourth sub-signal line 32.

Certainly, regardless of the structure, the second connection line 33 is not connected to the fourth signal line 40, to avoid a short circuit.

The fourth sub-signal line 32 is located in the regions in which the transparent subpixels T are located.

In a same second signal line group 200, an orthographic projection of the fourth sub-signal line 32 on the substrate 23 overlaps the orthographic projection of the fourth signal line 40 on the substrate 23, but the fourth sub-signal line 32 and the fourth signal line 40 are disposed at different layers, and are insulated.

That is, in the third signal line 30, the fourth sub-signal line 32 is located in the regions in which the transparent subpixels T are located, and the fourth sub-signal line 32 is located right above or right below the fourth signal line 40.

Figure 13B:
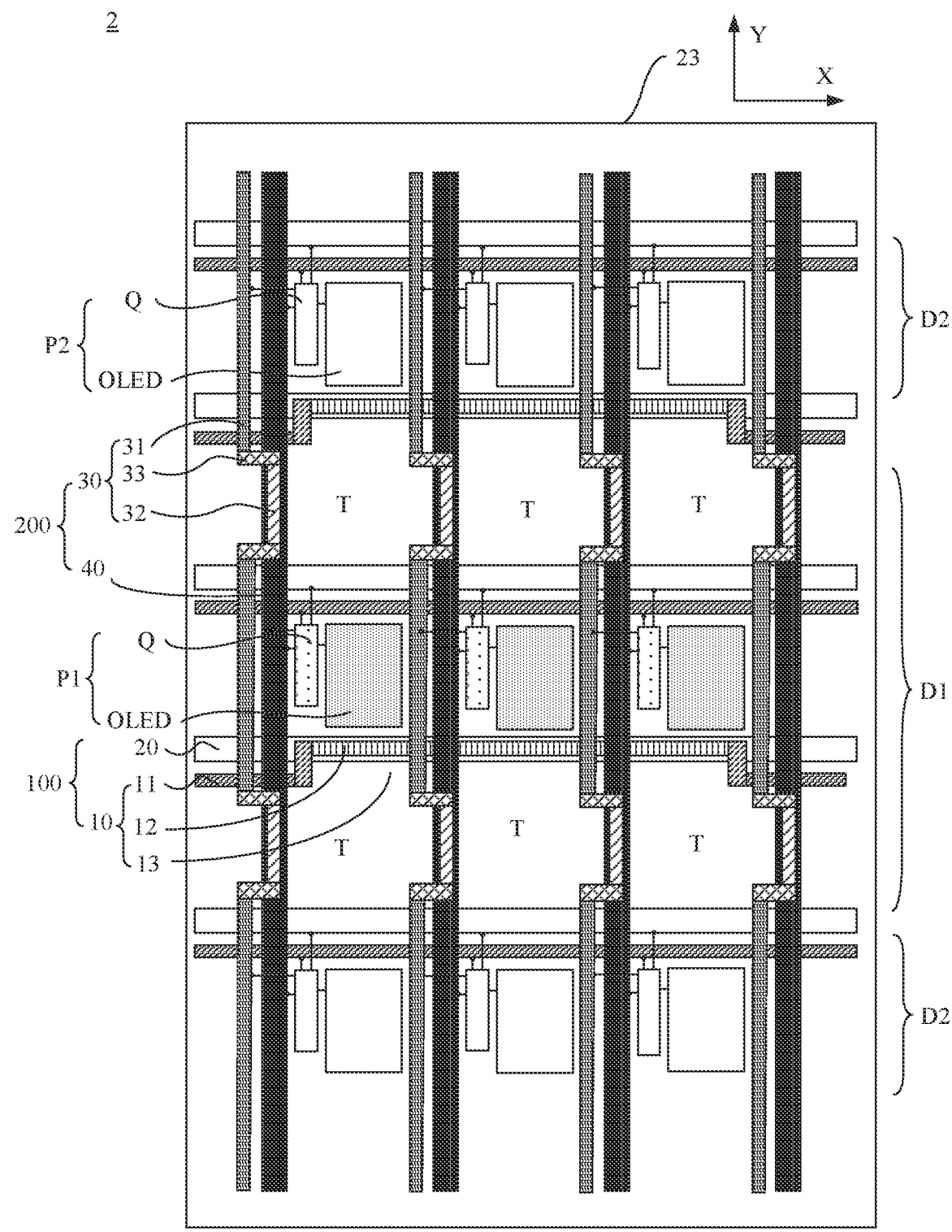
FIG. 13b is a schematic diagram of a structure of another display according to an embodiment of this application.

For a structure of the fourth sub-signal line 32, in some embodiments, as shown in FIG. 13a and FIG. 13b, a fourth sub-signal line 32 is located in a region in which the transparent subpixel T is located and does not penetrate the region, and the third sub-signal line 31 crosses a boundary between two adjacent transparent subpixels T. Orthographic projections of the first signal line 10 and the second signal line 20 on the substrate 23 do not overlap the orthographic projection of the fourth sub-signal line 32 on the substrate 23. In addition, the orthographic projection of the first signal line 10 on the substrate 23 and the orthographic projection of the second signal line 20 on the substrate 23 cross an orthographic projection of the third sub-signal line 31 on the substrate 23.

That is, a fourth sub-signal line 32 is located in a region in which the transparent subpixel T is located, and does not cross signal lines (for example, the first signal line 10 and the second signal line 20) located at a boundary between two adjacent transparent subpixels T.

In this case, for a structure of the second sub-signal line 12, as shown in FIG. 13a, a second sub-signal line 12 is located in a region in which the transparent subpixel T is located, and does not cross signal lines (for example, the third signal line 30 and the fourth signal line 40) located at a boundary between two adjacent transparent subpixels T. Alternatively, as shown in FIG. 13b, the second sub-signal line 12 penetrates, along an extension direction of the second sub-signal line 12, at least one region in which the transparent subpixel T is located.

Figure 13C:
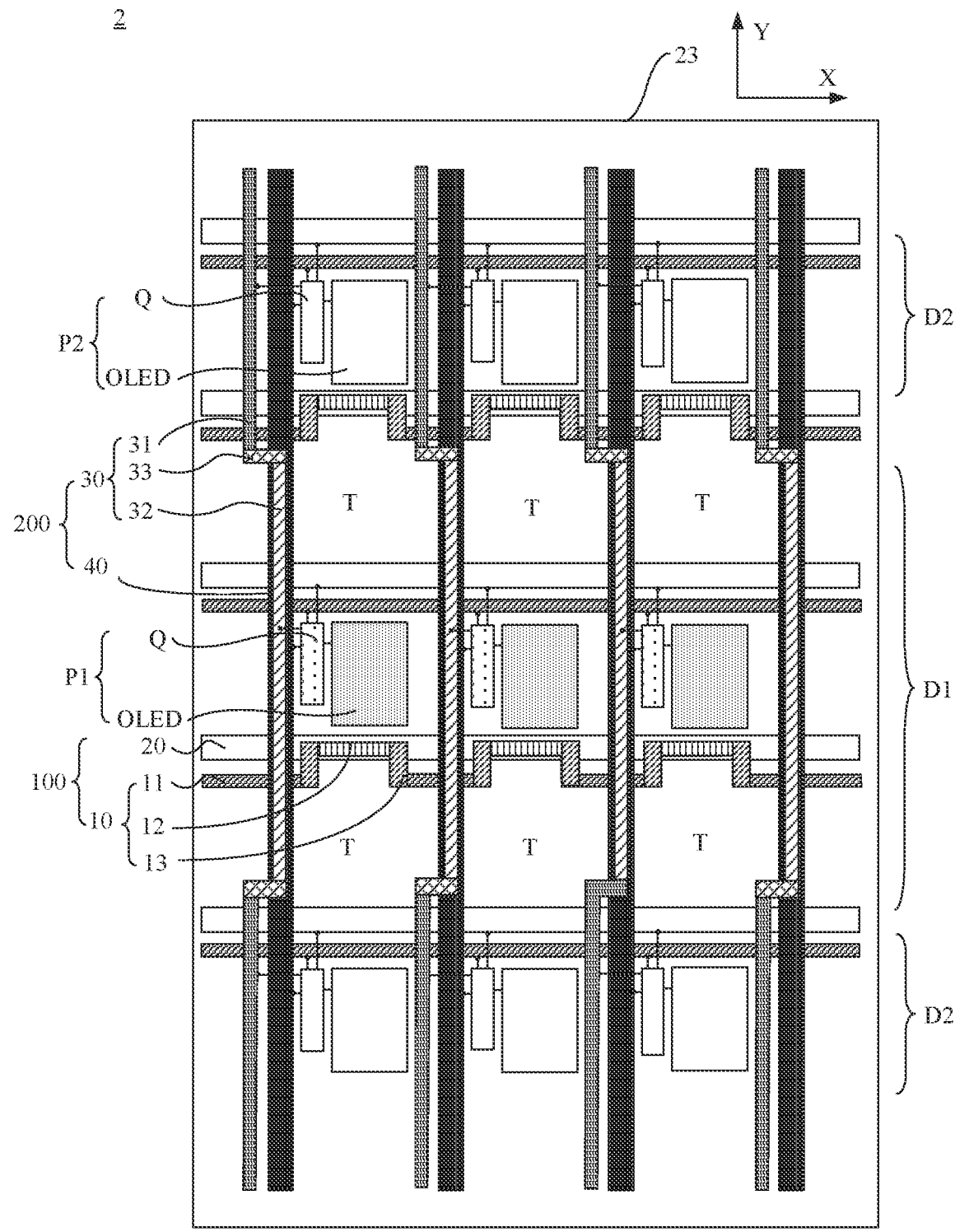
FIG. 13c is a schematic diagram of a structure of another display according to an embodiment of this application.
Figure 13D:
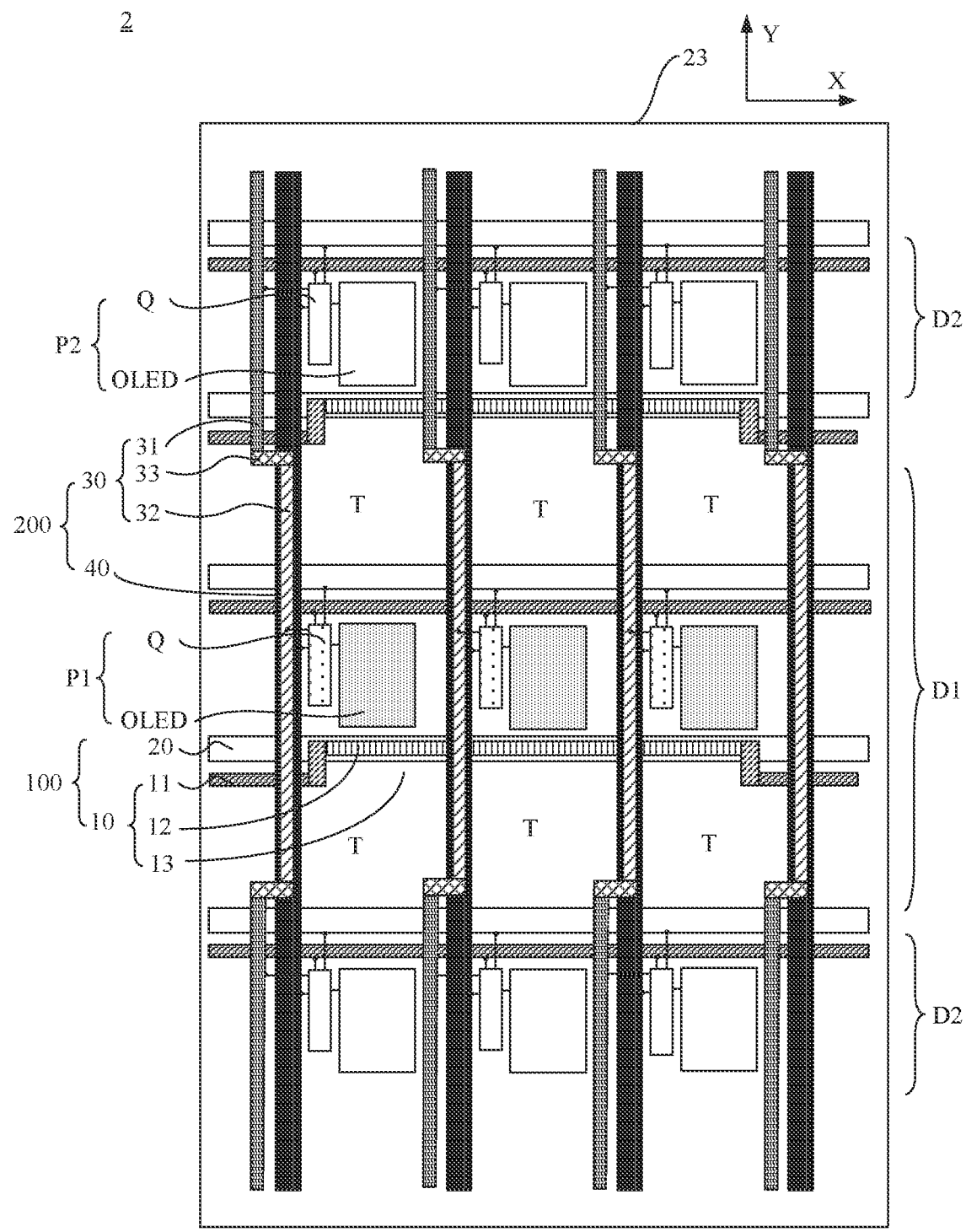
FIG. 13d is a schematic diagram of a structure of another display according to an embodiment of this application.

For the structure of the fourth sub-signal line 32, in some other embodiments, as shown in FIG. 13c and FIG. 13d, to reduce a quantity of fourth sub-signal lines 32, so as to reduce complexity of the third signal line 30, the fourth sub-signal line 32 penetrates, along the extension direction of the fourth sub-signal line 32, at least one region in which the transparent subpixel T is located.

In this case, for the structure of the second sub-signal line 12, as shown in FIG. 13c, a second sub-signal line 12 is located in a region in which the transparent subpixel T is located, and does not cross signal lines (for example, the third signal line 30 and the fourth signal line 40) located at a boundary between two adjacent transparent subpixels T. Alternatively, as shown in FIG. 13d, the second sub-signal line 12 penetrates, along the extension direction of the second sub-signal line 12, at least one region in which the transparent subpixel T is located.

The following describes a location relationship between the third sub-signal line 31, the fourth sub-signal line 32, and the fourth signal line 40.

Figure 14A:
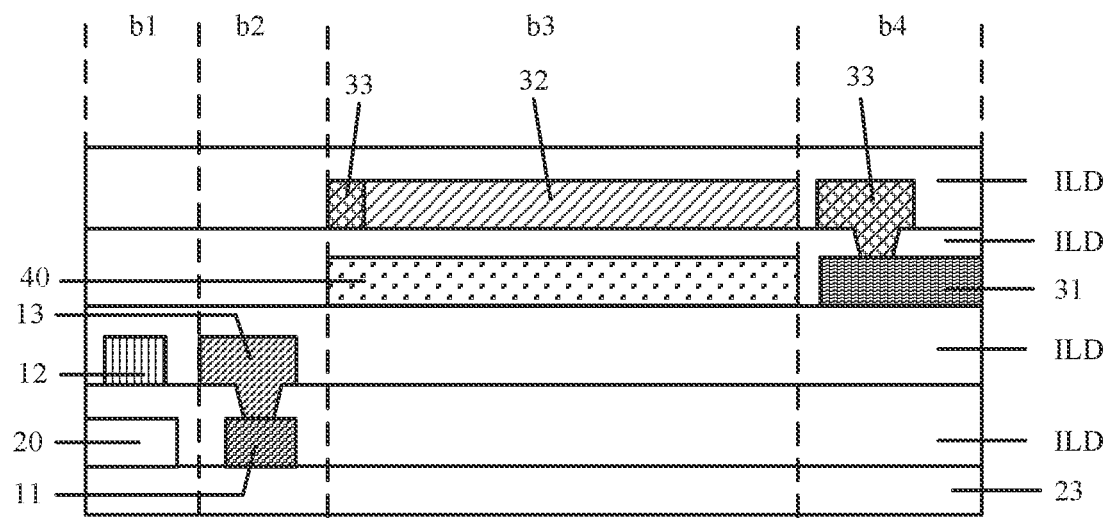
FIG. 14a is a section view along a direction B1-B2 in FIG. 13a according to an embodiment of this application.

In a first possible embodiment, details are as follows:

As shown in FIG. 14a (a section view along a direction B1-B2 in FIG. 13a), the fourth sub-signal line 32 and the third sub-signal line 31 are disposed at different layers, and the third sub-signal line 31 and the fourth signal line 40 are disposed at a same layer.

That is, the third sub-signal line 31 in the third signal line 30 and the fourth signal line 40 are disposed at the same layer, and the fourth sub-signal line 32 in the third signal line 30 is jumpered to another film layer, so that the fourth sub-signal line 32 is located right above or right below the fourth signal line 40.

It may be understood that, as shown in FIG. 14a, to avoid a short circuit of signal lines between adjacent film layers, an ILD layer is disposed between signal lines of adjacent layers. A quantity of ILD layers between the adjacent signal lines is not limited, and FIG. 14a is merely an example. A material of the ILD layer is not limited, and materials that can perform an insulation function may all be applicable to the ILD layer.

To avoid the short circuit between the second connection line 33 and the fourth signal line 40, as shown in FIG. 14a, the second connection line 33 and the fourth sub-signal line 32 are disposed at a same layer, and the second connection line 33 is connected to the third sub-signal line 31 through the via located at an ILD layer between the third sub-signal line 31 and the fourth sub-signal line 32, to implement the connection between the third sub-signal line 31 and the fourth sub-signal line 32.

A location relationship between the first sub-signal line 11, the second sub-signal line 12, the second signal line 20, the third sub-signal line 31, the fourth sub-signal line 32, and the fourth signal line 40 is as follows:

Optionally, as shown in FIG. 14a, the first sub-signal line 11 and the second sub-signal line 12 are disposed at different layers, and the first sub-signal line 11 and the second signal line 20 are disposed at a same layer.

That is, the first sub-signal line 11, the second sub-signal line 12, and the second signal line 20 are disposed at different layers from the third sub-signal line 31 and the fourth sub-signal line 32.

In this case, structures of the second sub-signal 12 and the fourth sub-signal line 32 may be shown in FIG. 13a to FIG. 13d.

Figure 14B:
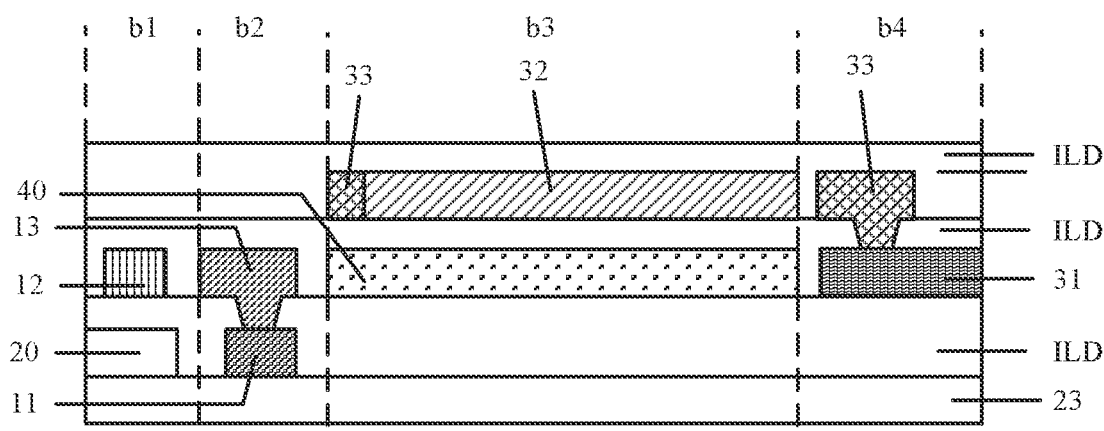
FIG. 14b is a section view along a direction B1-B2 in FIG. 13a according to an embodiment of this application.

A location relationship between the first sub-signal line 11, the second sub-signal line 12, the second signal line 20, the third sub-signal line 31, the fourth sub-signal line 32, and the fourth signal line 40 is as follows:

Alternatively, optionally, as shown in FIG. 14b (a section view along the direction B1-B2 in FIG. 13a), the first sub-signal line 11 and the second sub-signal line 12 are disposed at different layers, and the first sub-signal line 11 and the second signal line 20 are disposed at a same layer.

In addition, the third sub-signal line 31 and the fourth signal line 40 are disposed at a same layer as the second sub-signal line 12, and the fourth sub-signal line 32 and the first sub-signal line 11 are disposed at different layers, and the second sub-signal line 12 and the second signal line 20 are disposed at different layers.

Therefore, when the second sub-signal line 12 is prepared, the third sub-signal line 31 and the fourth signal line 40 may be prepared in a same process, to simply a preparation process. In addition, the third sub-signal line 31 and the fourth signal line 40 are disposed at the same layer as the second sub-signal line 12, so that a quantity of insulation layers and a quantity of conducting layers between layers can be reduced, and the display 2 is lightened and thin.

In this case, structures of the second sub-signal line 12 and the fourth sub-signal line 32 may be shown in FIG. 13a or FIG. 13c.

Figure 14C:
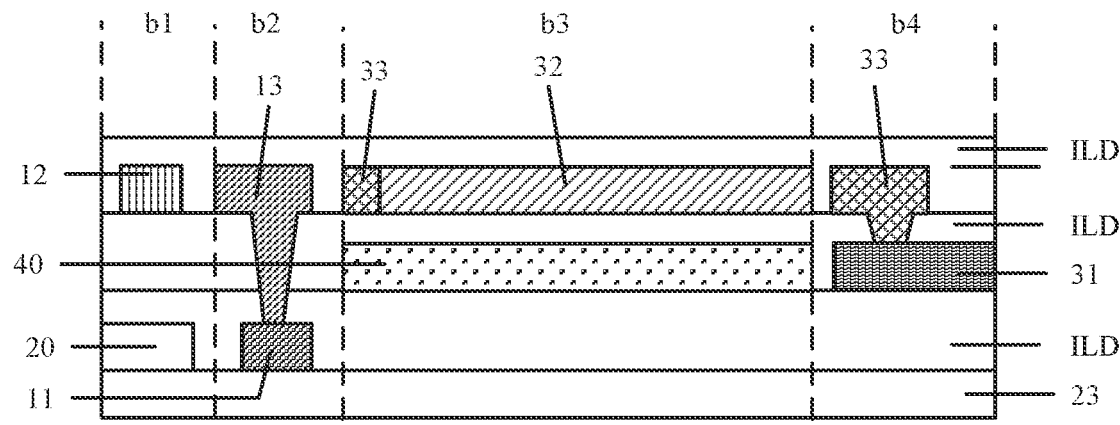
FIG. 14c is a section view along a direction B1-B2 in FIG. 13a according to an embodiment of this application.

A location relationship between the first sub-signal line 11, the second sub-signal line 12, the second signal line 20, the third sub-signal line 31, the fourth sub-signal line 32, and the fourth signal line 40 is as follows:

Alternatively, optionally, as shown in FIG. 14c (a section view along the direction B1-B2 in FIG. 13a), the first sub-signal line 11 and the second sub-signal line 12 are disposed at different layers, and the first sub-signal line 11 and the second signal line 20 are disposed at a same layer.

In addition, the fourth sub-signal line 32 and the second sub-signal line 12 are disposed at a same layer, the fourth sub-signal line 32 is disposed at a different layer from the first sub-signal line 11 and the second signal line 20, and the third sub-signal line 31 and the fourth signal line 40 are disposed at a different layer from the second sub-signal line 12.

Therefore, when the second sub-signal line 12 is prepared, the fourth sub-signal line 32 may be prepared in a same process, to simply a preparation process. In addition, the fourth sub-signal line 32 and the second sub-signal line 12 are disposed at the same layer, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13a to FIG. 13c.

Figure 14D:
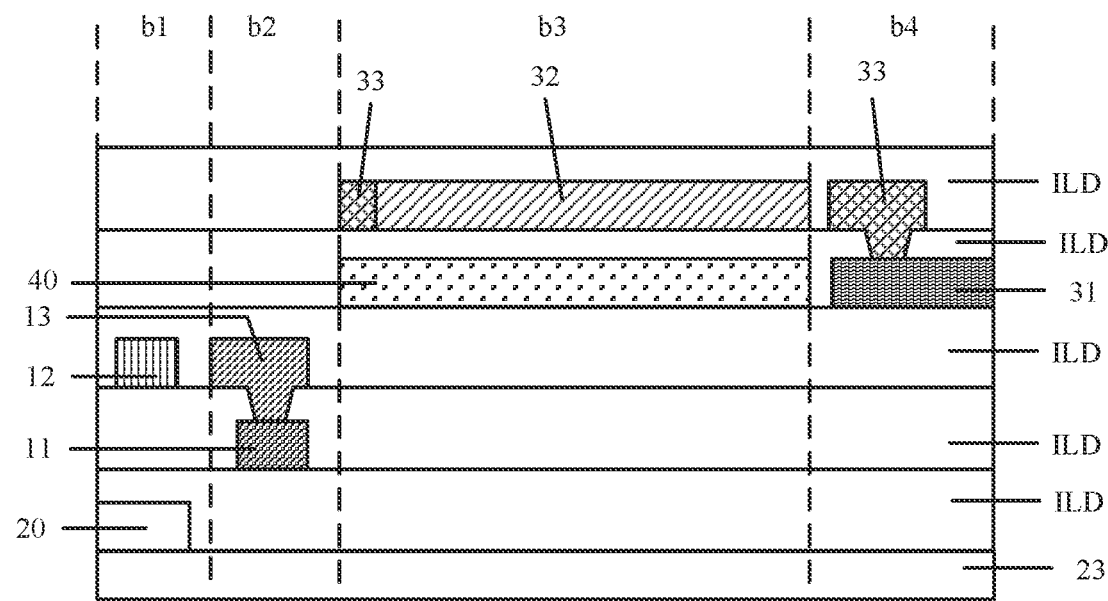
FIG. 14d is a section view along a direction B1-B2 in FIG. 13a according to an embodiment of this application.

A location relationship between the first sub-signal line 11, the second sub-signal line 12, the second signal line 20, the third sub-signal line 31, the fourth sub-signal line 32, and the fourth signal line 40 is as follows:

Alternatively, optionally, as shown in FIG. 14d, the first sub-signal line 11 and the second sub-signal line 12 are disposed at different layers, and the first sub-signal line 11 and the second signal line 20 are disposed at different layers.

In addition, the first sub-signal line 11, the second sub-signal line 12, and the second signal line 20 are disposed at different layers from the third sub-signal line 31 and the fourth sub-signal line 32.

In this case, the structures of the second sub-signal line 12 and the fourth sub-signal line 32 may be shown in FIG. 13a to FIG. 13d.

Figure 14E:
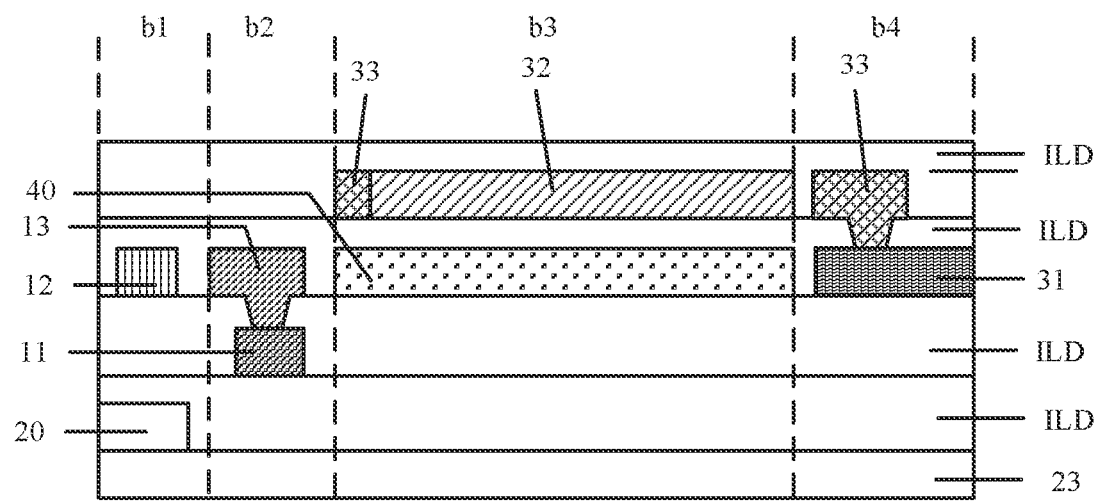
FIG. 14e is a section view along a direction B1-B2 in FIG. 13a according to an embodiment of this application.

A location relationship between the first sub-signal line 11, the second sub-signal line 12, the second signal line 20, the third sub-signal line 31, the fourth sub-signal line 32, and the fourth signal line 40 is as follows:

Alternatively, optionally, as shown in FIG. 14e (a section view along the direction B1-B2 in FIG. 13a), the first sub-signal line 11 and the second sub-signal line 12 are disposed at different layers, and the first sub-signal line 11 and the second signal line 20 are disposed at different layers.

In addition, the third sub-signal line 31 and the fourth signal line 40 are disposed at a same layer as the second sub-signal line 12, and the fourth sub-signal line 32 and the first sub-signal line 11 are disposed at different layers, and the second sub-signal line 12 and the second. signal line 20 are disposed at different layers.

Therefore, when the second sub-signal line 12 is prepared, the third sub-signal line 31 and the fourth signal line 40 may be prepared in a same process, to simply a preparation process. In addition, the third sub-signal line 31 and the fourth signal line 40 are disposed at the same layer as the second sub-signal line 12, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13a or FIG. 13c.

Figure 14F:
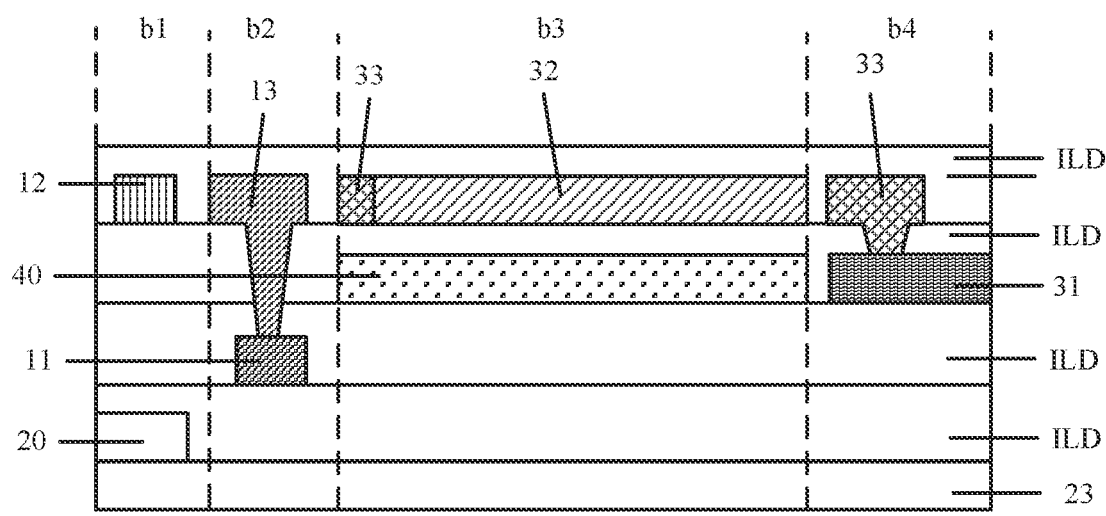
FIG. 14f is a section view along a direction B1-B2 in FIG. 13a according to an embodiment of this application.

A location relationship between the first sub-signal line 11, the second sub-signal line 12, the second signal line 20, the third sub-signal line 31, the fourth sub-signal line 32, and the fourth signal line 40 is as follows:

Alternatively, optionally, as shown in FIG. 14f (a section view along the direction B1-B2 in FIG. 13a), the first sub-signal line 11 and the second sub-signal line 12 are disposed at different layers, and the first sub-signal line 11 and the second signal line 20 are disposed at different layers.

In addition, the third sub-signal line 31 and the fourth signal line 40 are disposed at a different layer from the second sub-signal line 12, the fourth sub-signal line 32 and the second sub-signal line 12 are disposed at a same layer, and the fourth sub-signal line 32, the first sub-signal line 11, and the second signal line 20 are disposed at different layers.

Therefore, when the second sub-signal line 12 is prepared, the fourth sub-signal line 32 may be prepared in a same process, to simply a preparation process. In addition, the fourth sub-signal line 32 and the second sub-signal line 12 are disposed at the same layer, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13a to FIG. 13d.

Figure 14G:
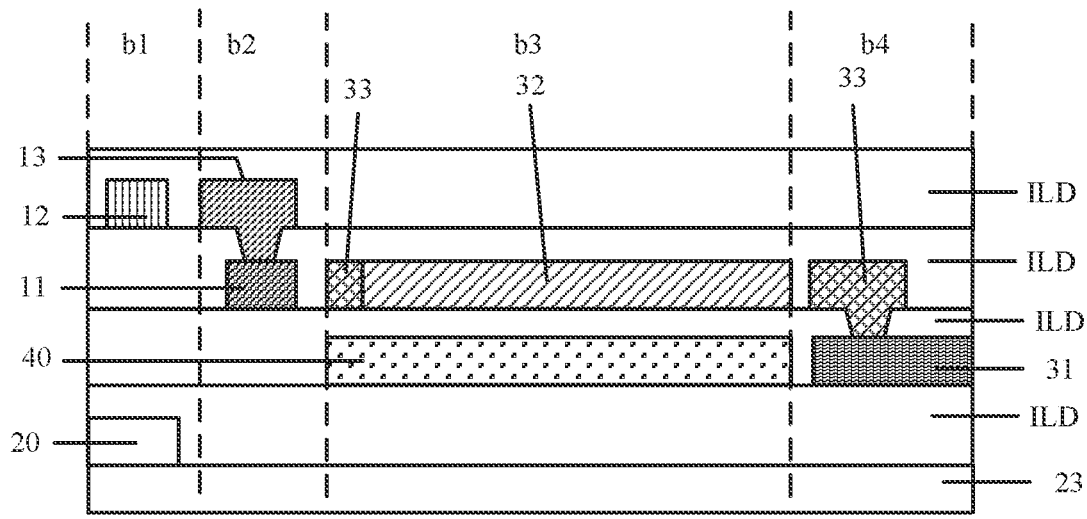
FIG. 14g is a section view along a direction B1-B2 in FIG. 13a according to an embodiment of this application.

A location relationship between the first sub-signal line 11, the second sub-signal line 12, the second signal line 20, the third sub-signal line 31, the fourth sub-signal line 32, and the fourth signal line 40 is as follows:

Alternatively, optionally, as shown in FIG. 14g (a section view along the direction B1-B2 in FIG. 13a), the first sub-signal line 11 and the second sub-signal line 12 are disposed at different layers, and the first sub-signal line 11 and the second signal line 20 are disposed at different layers.

In addition, the third sub-signal line 31 and the fourth signal line 40 are disposed at a different layer from the second sub-signal line 12, and the fourth sub-signal line 32 and the first sub-signal line 11 are disposed at a same layer.

Therefore, when the first sub-signal line 11 is prepared, the fourth sub-signal line 32 may be prepared in a same process, to simply a preparation process. In addition, the fourth sub-signal line 32 and the first sub-signal line 11 are disposed at the same layer, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13*a* or FIG 13*b*.

A location relationship between the first sub-signal line 11, the second sub-signal line 12, the second signal line 20, the third sub-signal line 31, the fourth sub-signal line 32, and the fourth signal line 40 is as follows:

Alternatively, optionally, the second sub-signal line 12 and the first sub-signal line 11 are disposed at a same layer.

Figure 14H:
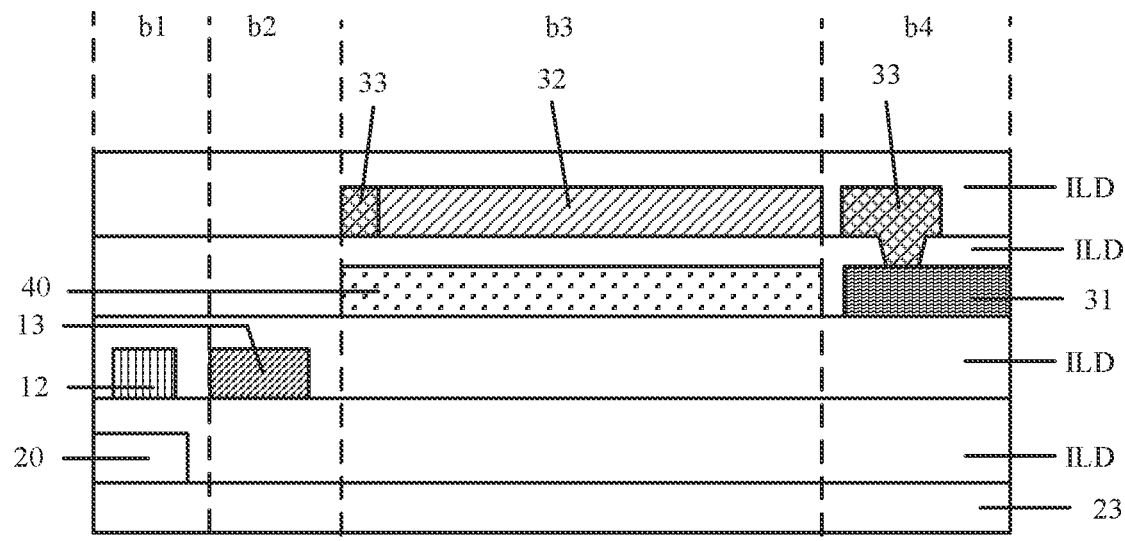
FIG. 14h is a section view along a direction B1-B2 in FIG. 13a according to an embodiment of this application.

When the second sub-signal line 12 and the first sub-signal line 11 are disposed at the same layer, the first connection line 13, the second sub-signal line 12, and the first sub-signal line 11 are disposed at a same layer. That is, as shown in FIG. 14*h* (a section view along the direction B1-B2 in FIG. 13*a*), a film layer location at which the first connection line 13 and the second sub-signal line 12 are located is a film layer location at which the first sub-signal line 11 is located.

In addition, the first sub-signal line 11, the second sub-signal line 12, and the second signal line 20 are disposed at different layers from the third sub-signal line 31 and the fourth sub-signal line 32.

In this case, the structures of the second sub-signal line 12 and the fourth sub-signal line 32 may be shown in FIG. 13*a* to FIG. 13*d*.

A location relationship between the first sub-signal line 11, the second sub-signal line 12, the second signal line 20, the third sub-signal line 31, the fourth sub-signal line 32, and the fourth signal line 40 is as follows:

Alternatively, optionally, the second sub-signal line 12 and the first sub-signal line 11 are disposed at a same layer.

Figure 14I:
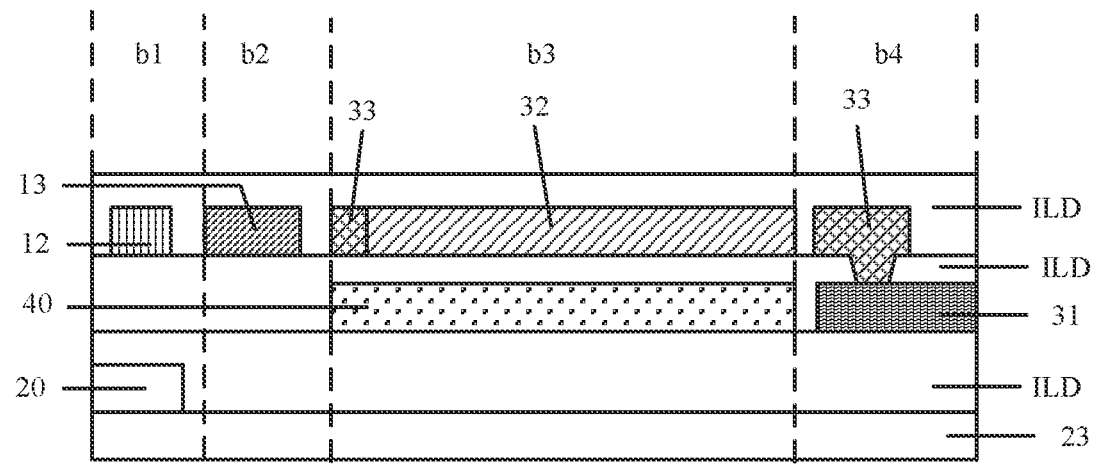
FIG. 14i is a section view along a direction B1-B2 in FIG. 13a according to an embodiment of this application.

When the second sub-signal line 12 and the first sub-signal line 11 are disposed at the same layer, the first connection line 13, the second sub-signal line 12, and the first sub-signal line 11 are disposed at a same layer. That is, as shown in FIG. 14*i* (a section view along the direction B1-B2 in FIG. 13*a*), a film layer location at which the first connection line 13 and the second sub-signal line 12 are located is a film layer location at which the first sub-signal line 11 is located.

In addition, the fourth sub-signal line 32 is disposed at a same layer as the first sub-signal line 11 and the second sub-signal line 12.

Therefore, when the first sub-signal line 11 and the second sub-signal line 12 are prepared, the fourth sub-signal line 32 may be prepared in a same process, to simply a preparation process. In addition, the fourth sub-signal line 32 is disposed at the same layer as the first sub-signal line 11 and the second sub-signal line 12, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13*a* or FIG. 13*b*.

In a second possible embodiment, details are as follows:

A difference between the second possible embodiment and the first possible embodiment lies in that the third sub-signal line 31 and the fourth signal line 40 are disposed at different layers.

Figure 15A:
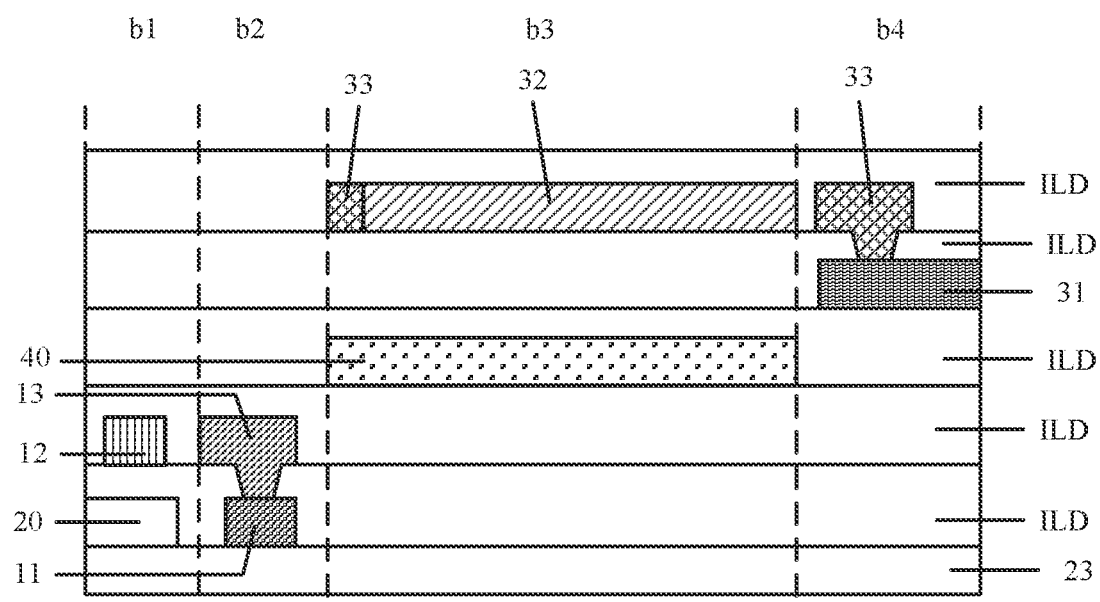
FIG. 15a is a section view along a direction B1-B2 in FIG. 13a according to an embodiment of this application.

As shown in FIG. 15*a* (a section view along a direction B1-B2 in FIG. 13*a*), the fourth sub-signal line 32 and the third sub-signal line 31 are disposed at different layers, and the third sub-signal line 31 and the fourth signal line 40 are disposed at different layers.

That is, the third sub-signal line 31 and the fourth sub-signal line 32 in the third signal line 30 are disposed at different layers from the fourth signal line 40, so that the fourth sub-signal line 32 is located right above or right below the fourth signal line 40.

The third sub-signal line 31 and the fourth signal line 40 are disposed at different layers, and the third sub-signal line 31 may be located above the fourth signal line 40. In this case, the second connection line 33 may be at a same layer as the third sub-signal line 31, or the second connection line 33 may be at a same layer as the fourth sub-signal line 32, to avoid a short circuit between the second connection line 33 and the fourth signal line 40. The third sub-signal line 31 may alternatively be located below the fourth signal line 40. In this case, the second connection line 33 is at a same layer as the fourth sub-signal line 32, to avoid the short circuit between the second connection line 33 and the fourth signal line 40. In this example, an example in which the third sub-signal line 31 is located above the fourth signal line 40, and the second connection line 33 and the fourth sub-signal line 32 are disposed at a same layer is used for description.

A location relationship between the first sub-signal line 11, the second sub-signal line 12, the second signal line 20, the third sub-signal line 31, the fourth sub-signal line 32, and the fourth signal line 40 is as follows:

Optionally, as shown in FIG. 15*a*, the first sub-signal line 11 and the second sub-signal line 12 are disposed at different layers, and the first sub-signal line 11 and the second signal line 20 are disposed at a same layer.

In addition, the first sub-signal line 11, the second sub-signal line 12, and the second signal line 20 are disposed at different layers from the third sub-signal line 31 and the fourth sub-signal line 32.

In this case, structures of the second sub-signal line 12 and the fourth sub-signal line 32 may be shown in FIG. 13*a* to FIG. 13*d*.

Figure 15B:
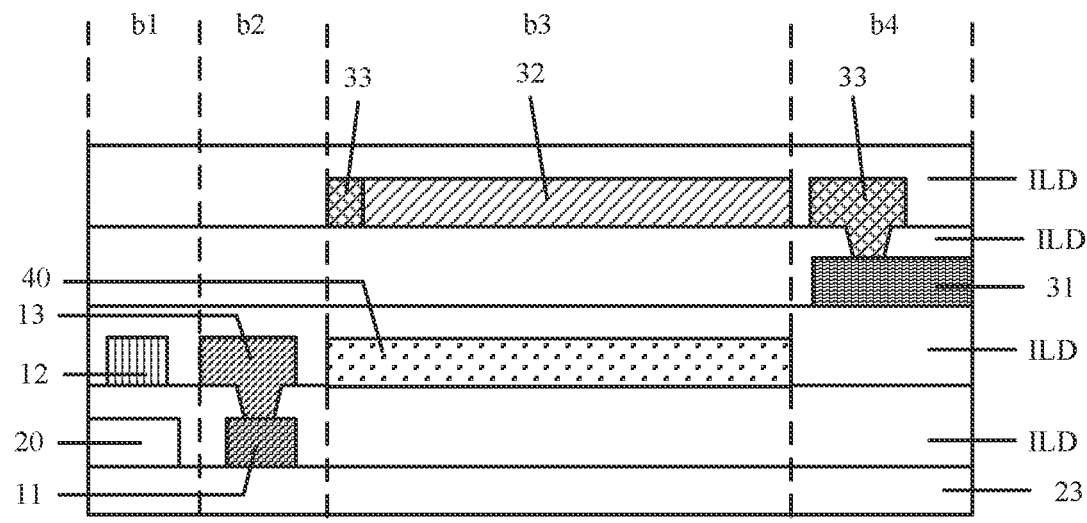
FIG. 15b is a section view along a direction B1-B2 in FIG. 13a according to an embodiment of this application.

A location relationship between the first sub-signal line 11, the second sub-signal line 12, the second signal line 20, the third sub-signal line 31, the fourth sub-signal line 32, and the fourth signal line 40 is as follows:

Alternatively, optionally, as shown in FIG. 15*b* (a section view along the direction B1-B2 in FIG. 13*a*), the first sub-signal line 11 and the second sub-signal line 12 are disposed at different layers, and the first sub-signal line 11 and the second signal line 20 are disposed at a same layer.

In addition, the fourth signal line 40 and the second sub-signal line 12 are disposed at a same layer.

Therefore, when the second sub-signal line 12 is prepared, the fourth signal line 40 may be prepared in a same process, to simply a preparation process. In addition, the fourth signal line 40 and the second sub-signal line 12 are disposed at the same layer, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13*a* or FIG. 13*c*.

Figure 15C:
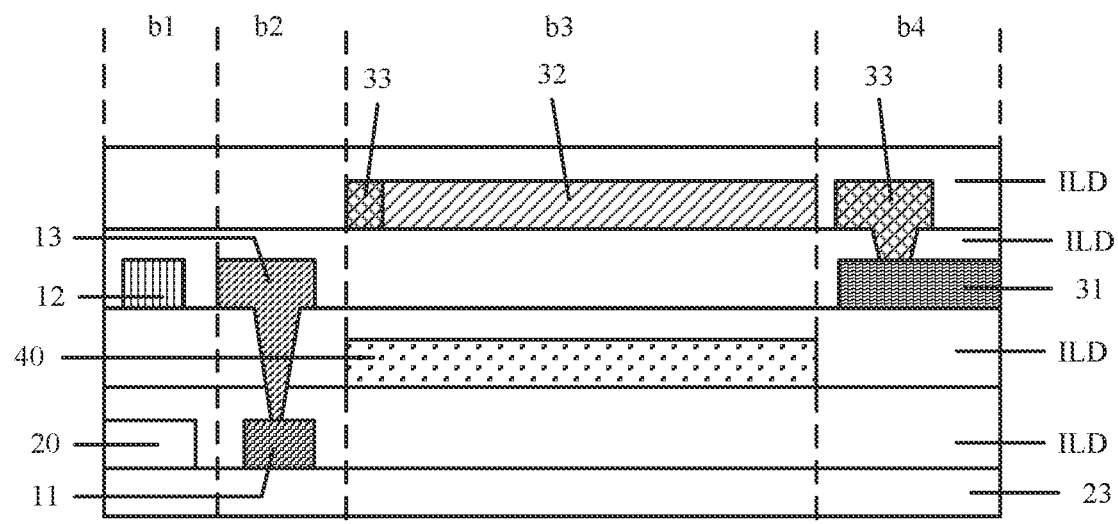
FIG. 15c is a section view along a direction B1-B2 in FIG. 13a according to an embodiment of this application.

Alternatively, optionally, as shown in FIG. 15*c* (a section view along the direction B1-B2 in FIG. 13*a*), the first sub-signal line 11 and the second sub-signal line 12 are disposed at different layers, and the first sub-signal line 11 and the second signal line 20 are disposed at a same layer.

In addition, the third sub-signal line 31 and the second sub-signal line 12 are disposed at a same layer.

Therefore, when the second sub-signal line 12 is prepared, the third sub-signal line 31 may be prepared in a same process, to simply a preparation process. In addition, the third sub-signal line 31 and the second sub-signal line 12 are disposed at the same layer, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13*a* or FIG. 13*c*.

Figure 15D:
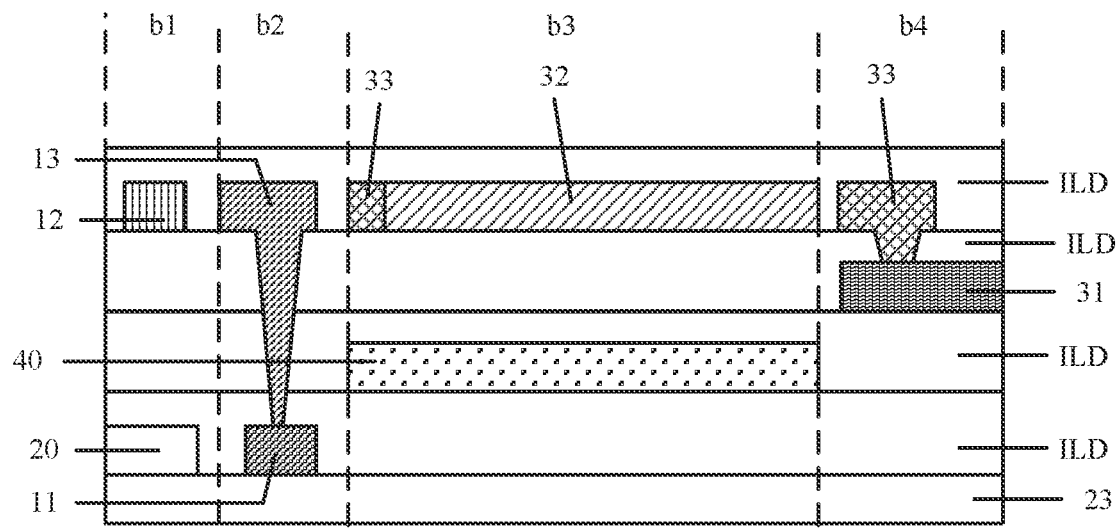
FIG. 15d is a section view along a direction B1-B2 in FIG. 13a according to an embodiment of this application.

A location relationship between the first sub-signal line 11, the second sub-signal line 12, the second signal line 20, the third sub-signal line 31, the fourth sub-signal line 32, and the fourth signal line 40 is as follows:

Alternatively, optionally, as shown in FIG. 15*d* (a section view along the direction B1-B2 in FIG. 13*a*), the first sub-signal line 11 and the second sub-signal line 12 are disposed at different layers, and the first sub-signal line 11 and the second signal line 20 are disposed at a same layer.

In addition, the fourth sub-signal line 32 and the second sub-signal line 12 are disposed at a same layer.

Therefore, when the second sub-signal line 12 is prepared, the fourth sub-signal line 32 may be prepared in a same process, to simply a preparation process. In addition, the fourth sub-signal line 32 and the second sub-signal line 12 are disposed at the same layer, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13*a* to FIG. 13*c*.

Figure 15E:
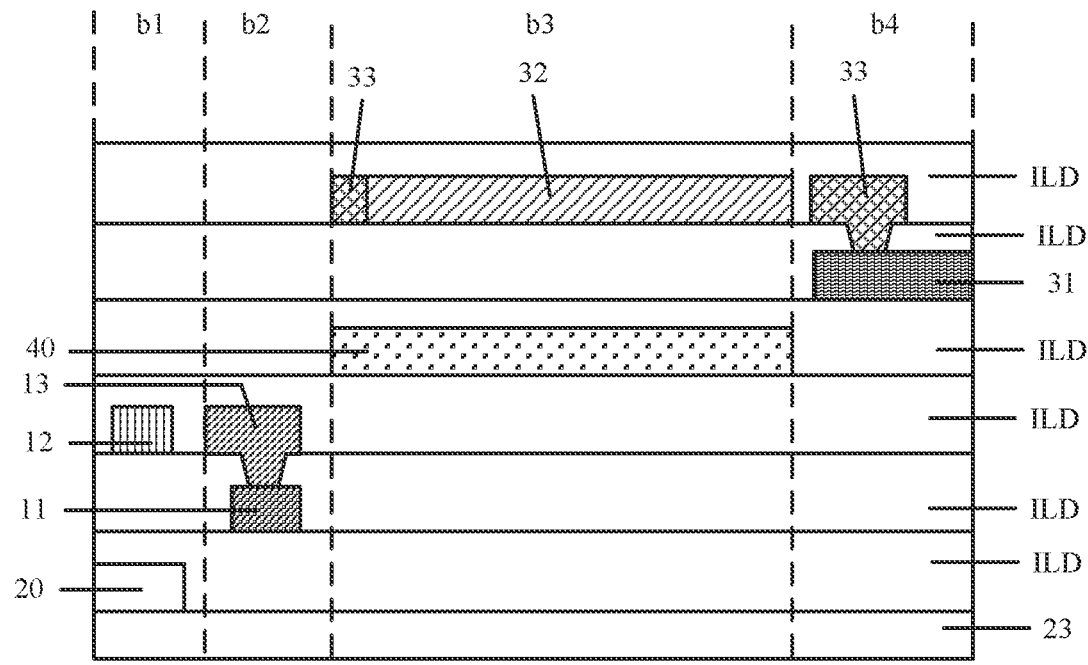
FIG. 15e is a section view along a direction B1-B2 in FIG. 13a according to an embodiment of this application.

A location relationship between the first sub-signal line 11, the second sub-signal line 12, the second signal line 20, the third sub-signal line 31, the fourth sub-signal line 32, and the fourth signal line 40 is as follows:

Alternatively, optionally, as shown in FIG. 15*e*, the first sub-signal line 11 and the second sub-signal line 12 are disposed at different layers, and the first sub-signal line 11 and the second signal line 20 are disposed at different layers.

In addition, the first sub-signal line 11, the second sub-signal line 12, and the second signal line 20 are disposed at different layers from the third sub-signal line 31 and the fourth sub-signal line 32.

In this case, the structures of the second sub-signal line 12 and the fourth sub-signal line 32 may be shown in FIG. 13*a* to FIG. 13*d*.

Figure 15F:
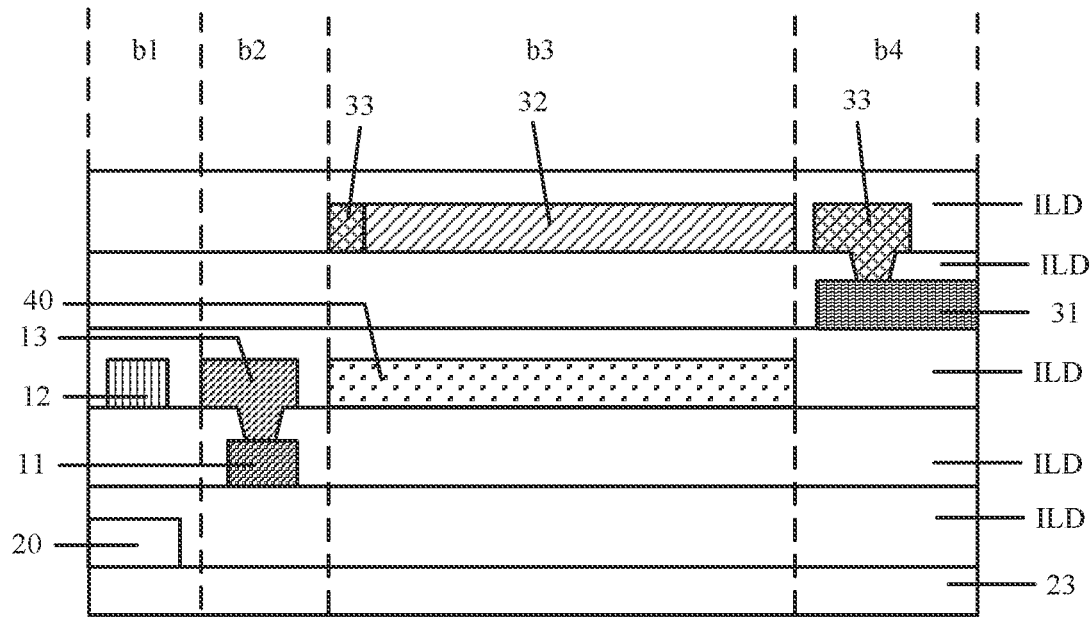
FIG. 15f is a section view along a direction B1-B2 in FIG. 13a according to an embodiment of this application.

A location relationship between the first sub-signal line 11, the second sub-signal line 12, the second signal line 20, the third sub-signal line 31, the fourth sub-signal line 32, and the fourth signal line 40 is as follows:

Alternatively, optionally, as shown in FIG. 15*f* (a section view along the direction B1-B2 in FIG. 13*a*), the first sub-signal line 11 and the second sub-signal line 12 are disposed at different layers, and the first sub-signal line 11 and the second signal line 20 are disposed at different layers.

In addition, the fourth signal line 40 and the second sub-signal line 12 are disposed at a same layer.

Therefore, when the second sub-signal line 12 is prepared, the fourth signal line 40 may be prepared in a same process, to simply a preparation process. In addition, the fourth signal line 40 and the second sub-signal line 12 are disposed at the same layer, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13*a* or FIG. 13*c*.

Figure 15G:
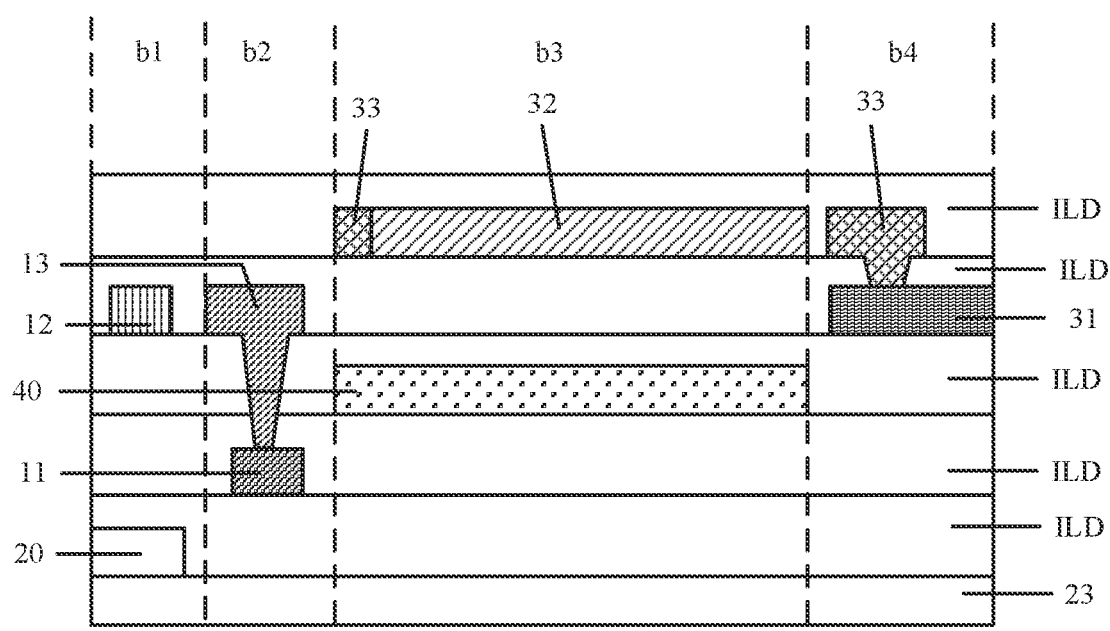
FIG. 15g is a section view along a direction B1-B2 in FIG. 13a according to an embodiment of this application.

Alternatively, optionally, as shown in FIG. 15*g* (a section view along the direction B1-B2 in FIG. 13*a*), the first sub-signal line 11 and the second sub-signal line 12 are disposed at different layers, and the first sub-signal line 11 and the second signal line 20 are disposed at different layers.

In addition, the third sub-signal line 31 and the second sub-signal line 12 are disposed at a same layer.

Therefore, when the second sub-signal line 12 is prepared, the third sub-signal line 31 may be prepared in a same process, to simply a preparation process. In addition, the third sub-signal line 31 and the second sub-signal line 12 are disposed at the same layer, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13*a* or FIG. 13*c*.

Figure 15H:
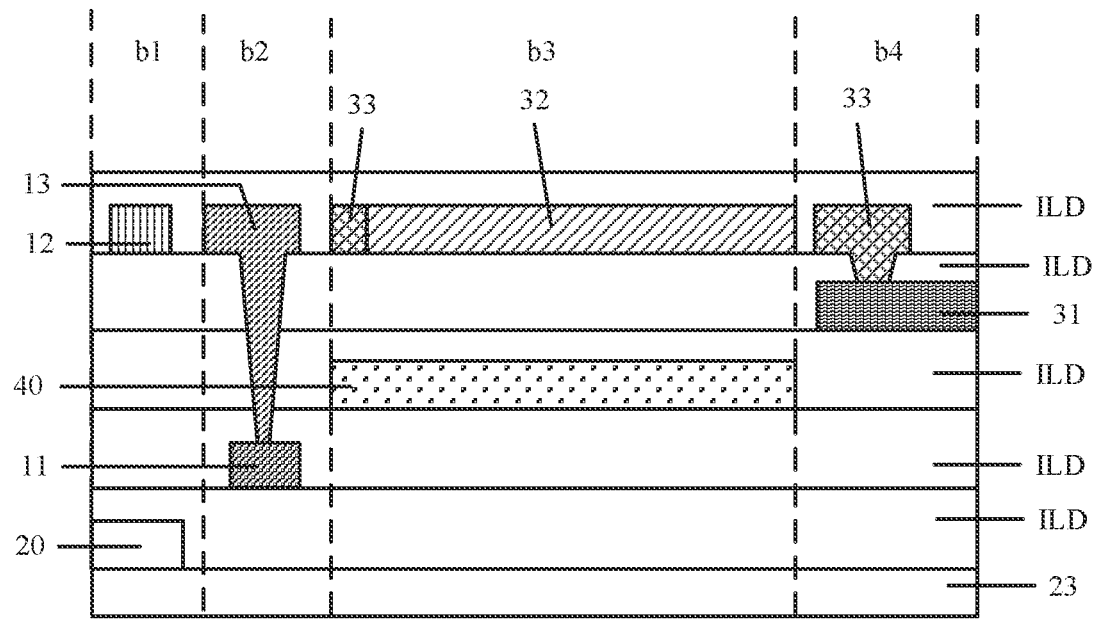
FIG. 15h is a section view along a direction B1-B2 in FIG. 13a according to an embodiment of this application.

A location relationship between the first sub-signal line 11, the second sub-signal line 12, the second signal line 20, the third sub-signal line 31, the fourth sub-signal line 32, and the fourth signal line 40 is as follows:

Alternatively, optionally, as shown in FIG. 15*h* (a section view along the direction B1-B2 in FIG. 13*a*), the first sub-signal line 11 and the second sub-signal line 12 are disposed at different layers, and the first sub-signal line 11 and the second signal line 20 are disposed at different layers.

In addition, the fourth sub-signal line 32 and the second sub-signal line 12 are disposed at a same layer.

Therefore, when the second sub-signal line 12 is prepared, the fourth sub-signal line 32 may be prepared in a same process, to simply a preparation process. In addition, the fourth sub-signal line 32 and the second sub-signal line 12 are disposed at the same layer, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13*a* to FIG. 13*c*.

Figure 15I:
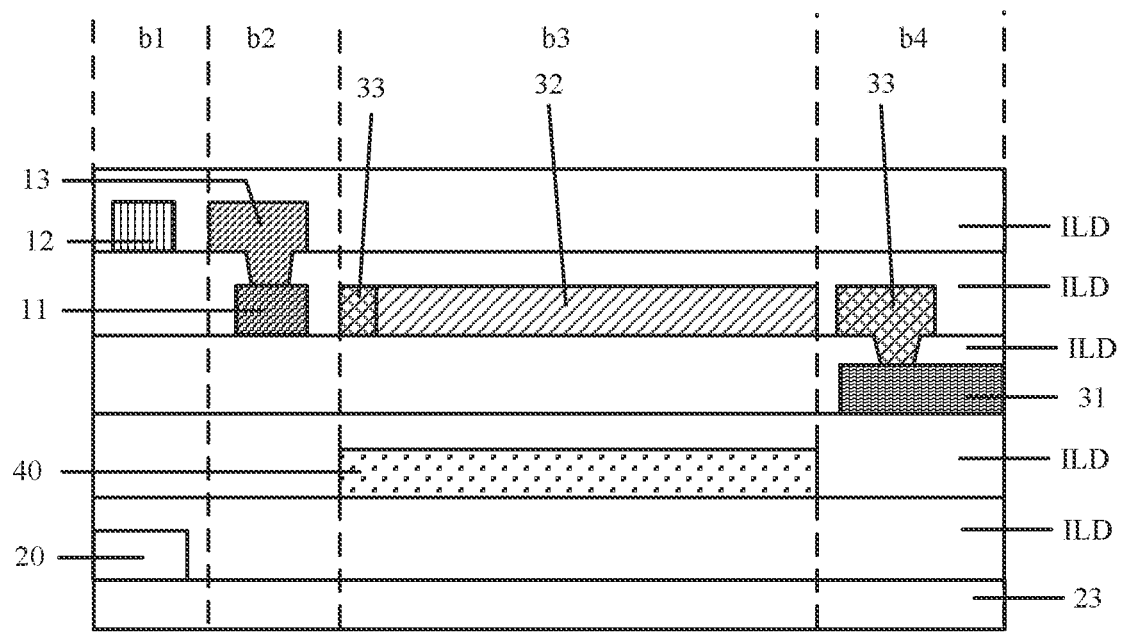
FIG. 15i is a section view along a direction B1-B2 in FIG. 13a according to an embodiment of this application.

A location relationship between the first sub-signal line 11, the second sub-signal line 12, the second signal line 20, the third sub-signal line 31, the fourth sub-signal line 32, and the fourth signal line 40 is as follows:

Alternatively, optionally, as shown in FIG. 15*i* (a section view along the direction B1-B2 in FIG. 13*a*), the first sub-signal line 11 and the second sub-signal line 12 are disposed at different layers, and the first sub-signal line 11 and the second signal line 20 are disposed at different layers.

In addition, the fourth sub-signal line 32 and the first sub-signal line 11 are disposed at a same layer.

Therefore, when the first sub-signal line 11 is prepared, the fourth sub-signal line 32 may be prepared in a same process, to simply a preparation process. In addition, the fourth sub-signal line 32 and the first sub-signal line 11 are disposed at the same layer, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13*a* or FIG. 13*b*.

A location relationship between the first sub-signal line 11, the second sub-signal line 12, the second signal line 20, the third sub-signal line 31, the fourth sub-signal line 32, and the fourth signal line 40 is as follows:

Alternatively, optionally, the second sub-signal line 12 and the first sub-signal line 11 are disposed at a same layer.

Figure 15J:
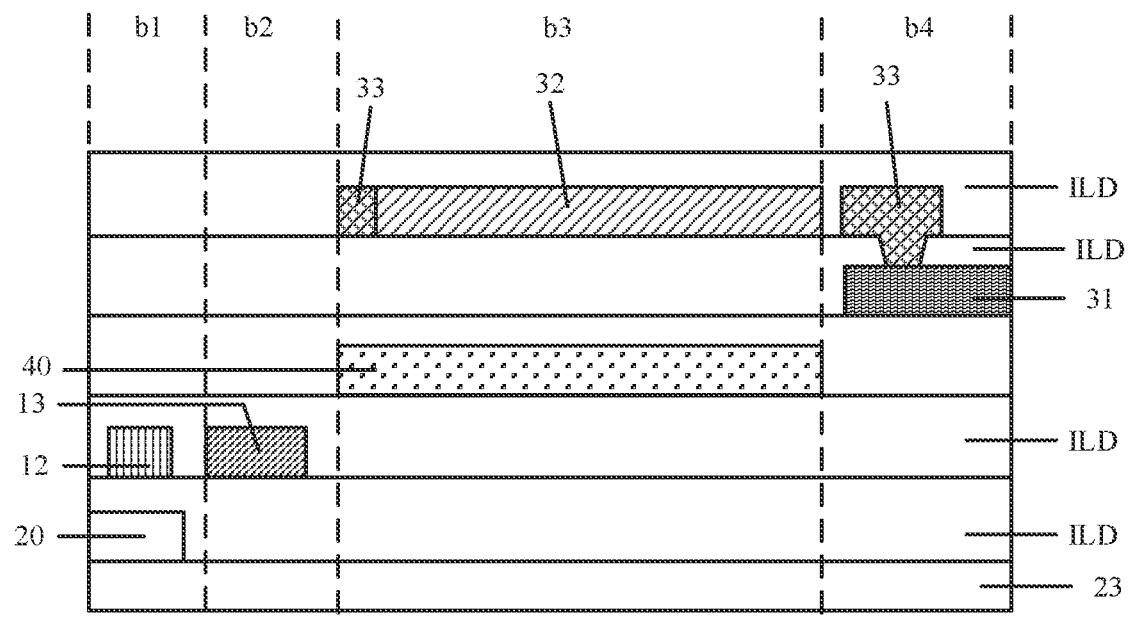
FIG. 15j is a section view along a direction B1-B2 in FIG. 13a according to an embodiment of this application.

When the second sub-signal line 12 and the first sub-signal line 11 are disposed at the same layer, the first connection line 13, the second sub-signal line 12, and the first sub-signal line 11 are disposed at a same layer. That is, as shown in FIG. 15j (a section view along the direction B1-B2 in FIG. 13a), a film layer location at which the first connection line 13 and the second sub-signal line 12 are located is a film layer location at which the first sub-signal line 11 is located.

In addition, the first sub-signal line 11, the second sub-signal line 12, and the second signal line 20 are disposed at different layers from the third sub-signal line 31 and the fourth sub-signal line 32.

In this case, the structures of the second sub-signal line 12 and the fourth sub-signal line 32 may be shown in FIG. 13a to FIG. 13d.

A location relationship between the first sub-signal line 11, the second sub-signal line 12, the second signal line 20, the third sub-signal line 31, the fourth sub-signal line 32, and the fourth signal line 40 is as follows:

Alternatively, optionally, the second sub-signal line 12 and the first sub-signal line 11 are disposed at a same layer.

Figure 15K:
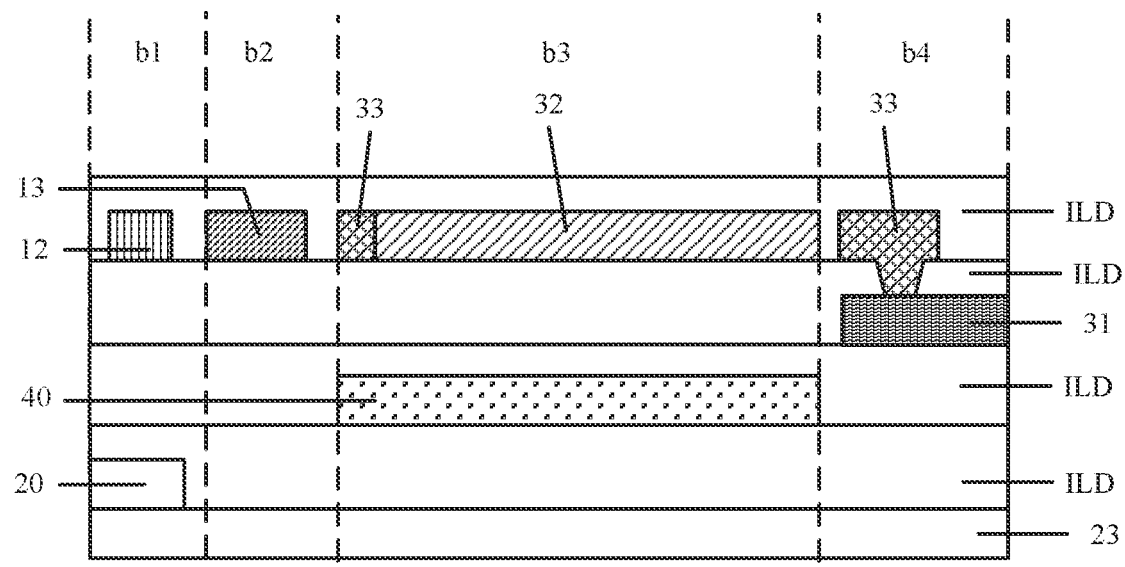
FIG. 15k is a section view along a direction B1-B2 in FIG. 13a according to an embodiment of this application.

When the second sub-signal line 12 and the first sub-signal line 11 are disposed at the same layer, the first connection line 13, the second sub-signal line 12, and the first sub-signal line 11 are disposed at a same layer. That is, as shown in FIG. 15k (a section view along the direction B1-B2 in FIG. 13a), a film layer location at which the first connection line 13 and the second sub-signal line 12 are located is a film layer location at which the first sub-signal line 11 is located.

In addition, the fourth sub-signal line 32 is disposed at a same layer as the first sub-signal line 11 and the second sub-signal line 12.

Therefore, when the first sub-signal line 11 and the second sub-signal line 12 are prepared, the fourth sub-signal line 32 may be prepared in a same process, to simply a preparation process. In addition, the fourth sub-signal line 32 is disposed at the same layer as the first sub-signal line 11 and the second sub-signal line 12, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13a or FIG. 13b.

In a third possible embodiment, details are as follows:

A difference between the third possible embodiment and the first possible embodiment lies in that the third sub-signal line 31 and the fourth sub-signal line 32 are disposed at a same layer.

Figure 16A:
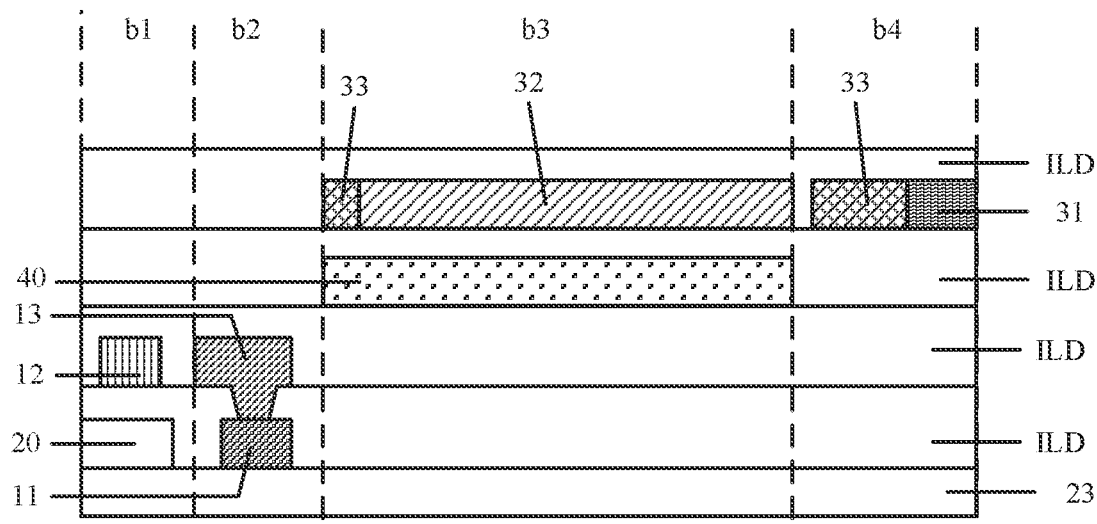
FIG. 16a is a section view along a direction B1-B2 in FIG. 13a according to an embodiment of this application.

As shown FIG. 16a (a section view along a direction B1-B2 in FIG. 13a), the third sub-signal line 31 and the fourth sub-signal line 32 are disposed at a same layer, and in a same second signal line group 200, the orthographic projection of the third sub-signal line 31 on the substrate 23 and the orthographic projection of the fourth signal line 40 on the substrate 23 are disposed side by side.

That is, the third sub-signal line 31 and the fourth sub-signal line 32 in the third signal line 30 are disposed at the same layer, and the third signal line 30 and the fourth signal line 40 are disposed at different layers. The orthographic projection of the third sub-signal line 31 in the third signal line 30 on the substrate 23 and the orthographic projection of the fourth signal line 40 on the substrate 23 are disposed side by side, and the fourth sub-signal line 32 in the third signal line 30 is located right above or right below the fourth signal line 40.

A location relationship between the first sub-signal line 11, the second sub-signal line 12, the second signal line 20, the third sub-signal line 31, the fourth sub-signal line 32, and the fourth signal line 40 is as follows:

Optionally, as shown in FIG. 16a, the first sub-signal line 11 and the second sub-signal line 12 are disposed at different layers, and the first sub-signal line 11 and the second signal line 20 are disposed at a same layer.

In addition, the first sub-signal line 11, the second sub-signal line 12, and the second signal line 20 are disposed at different layers from the third sub-signal line 31 and the fourth sub-signal line 32.

In this case, structures of the second sub-signal line 12 and the fourth sub-signal line 32 may be shown in FIG. 13a to FIG. 13d.

Figure 16B:
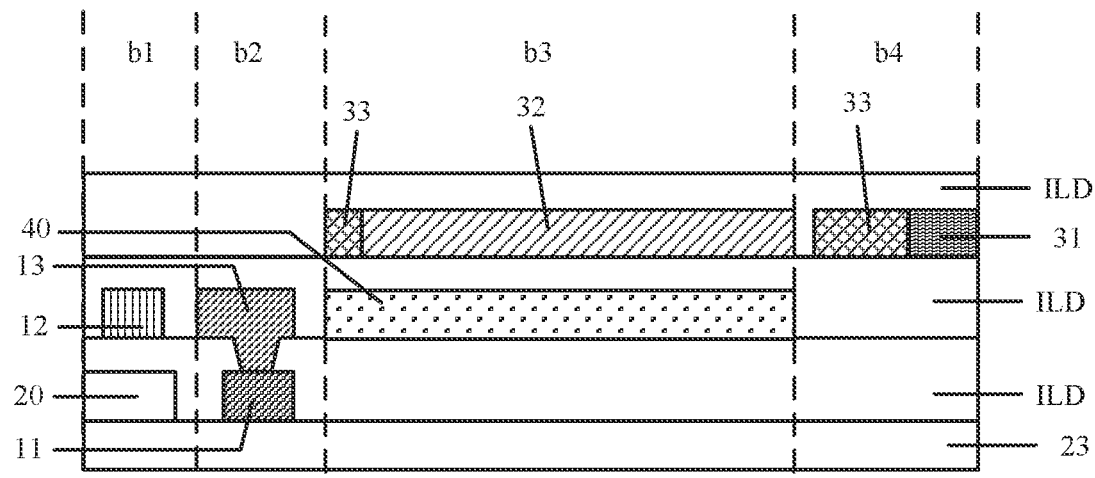
FIG. 16b is a section view along a direction B1-B2 in FIG. 13a according to an embodiment of this application.

A location relationship between the first sub-signal line 11, the second sub-signal line 12, the second signal line 20, the third sub-signal line 31, the fourth sub-signal line 32, and the fourth signal line 40 is as follows:

Alternatively, optionally, as shown in FIG. 16b (a section view along the direction B1-B2 in FIG. 13a), the first sub-signal line 11 and the second sub-signal line 12 are disposed at different layers, and the first sub-signal line 11 and the second signal line 20 are disposed at a same layer.

In addition, the fourth signal line 40 and the second sub-signal line 12 are disposed at a same layer.

Therefore, when the second sub-signal line 12 is prepared, the fourth signal line 40 may be prepared in a same process, to simply a preparation process. In addition, the fourth signal line 40 and the second sub-signal line 12 are disposed at the same layer, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13a or FIG. 13c.

Figure 16C:
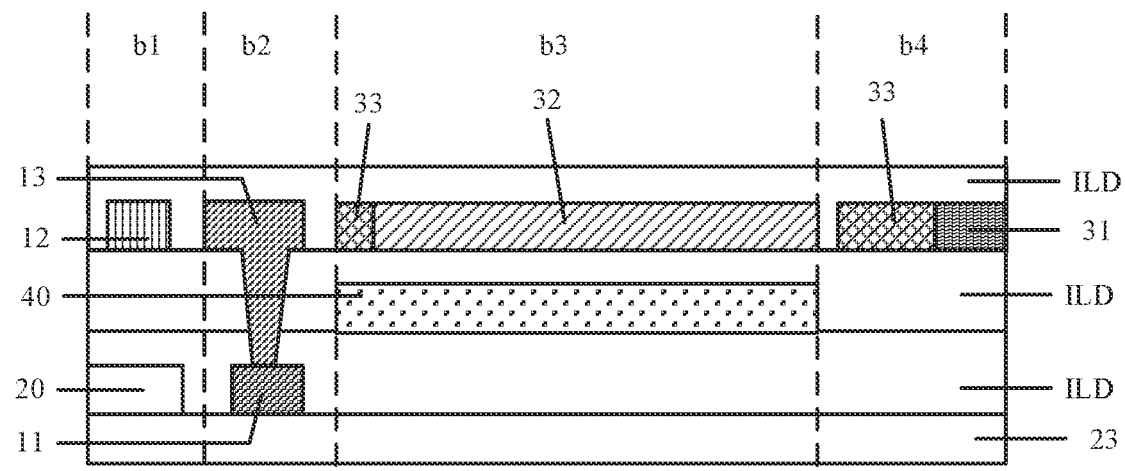
FIG. 16c is a section view along a direction B1-B2 in FIG. 13a according to an embodiment of this application.

Alternatively, optionally, as shown in FIG. 16c (a section view along the direction B1-B2 in FIG. 13a), the first sub-signal line 11 and the second sub-signal line 12 are disposed at different layers, and the first sub-signal line 11 and the second signal line 20 are disposed at a same layer.

In addition, the third sub-signal line 31 and the fourth sub-signal line 32 are disposed at a same layer as the second sub-signal line 12.

Therefore, when the second sub-signal line 12 is prepared, the third sub-signal line 31 and the fourth sub-signal line 32 may be prepared in a same process, to simply a preparation process. In addition, the third sub-signal line 31 and the fourth sub-signal line 32 are disposed at the same layer as the second sub-signal line 12, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13a or FIG. 13c.

Figure 16D:
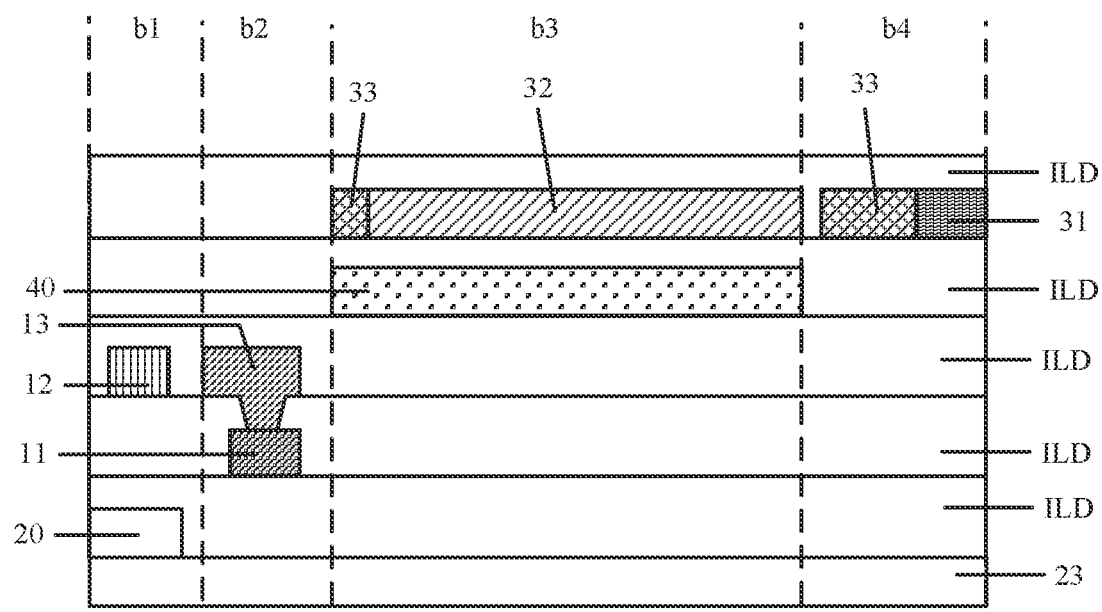
FIG. 16d is a section view along a direction B1-B2 in FIG. 13a according to an embodiment of this application.

A location relationship between the first sub-signal line 11, the second sub-signal line 12, the second signal line 20, the third sub-signal line 31, the fourth sub-signal line 32, and the fourth signal line 40 is as follows:

Alternatively, optionally, as shown in FIG. 16d (a section view along the direction B1-B2 in FIG. 13a), the first sub-signal line 11 and the second sub-signal line 12 are disposed at different layers, and the first sub-signal line 11 and the second signal line 20 are disposed at different layers.

In addition, the first sub-signal line 11, the second sub-signal line 12, and the second signal line 20 are disposed at different layers from the third sub-signal line 31 and the fourth sub-signal line 32.

In this case, the structures of the second sub-signal line 12 and the fourth sub-signal line 32 may be shown in FIG. 13a to FIG. 13d.

Figure 16E:
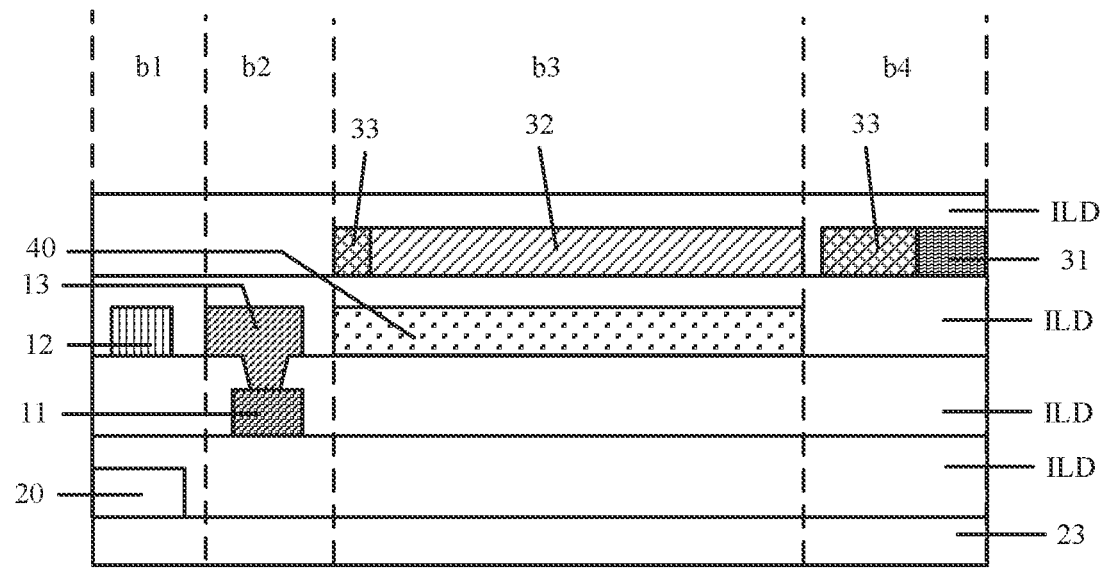
FIG. 16e is a section view along a direction B1-B2 in FIG. 13a according to an embodiment of this application.

Alternatively, optionally, as shown in FIG. 16e (a section view along the direction B1-B2 in FIG. 13a), the first sub-signal line 11 and the second sub-signal line 12 are disposed at different layers, and the first sub-signal line 11 and the second signal line 20 are disposed at different layers.

In addition, the fourth signal line 40 and the second sub-signal line 12 are disposed at a same layer.

Therefore, when the second sub-signal line 12 is prepared, the fourth signal line 40 may be prepared in a same process, to simply a preparation process. In addition, the fourth signal line 40 and the second sub-signal line 12 are disposed at the same layer, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13a or FIG. 13c.

Figure 16F:
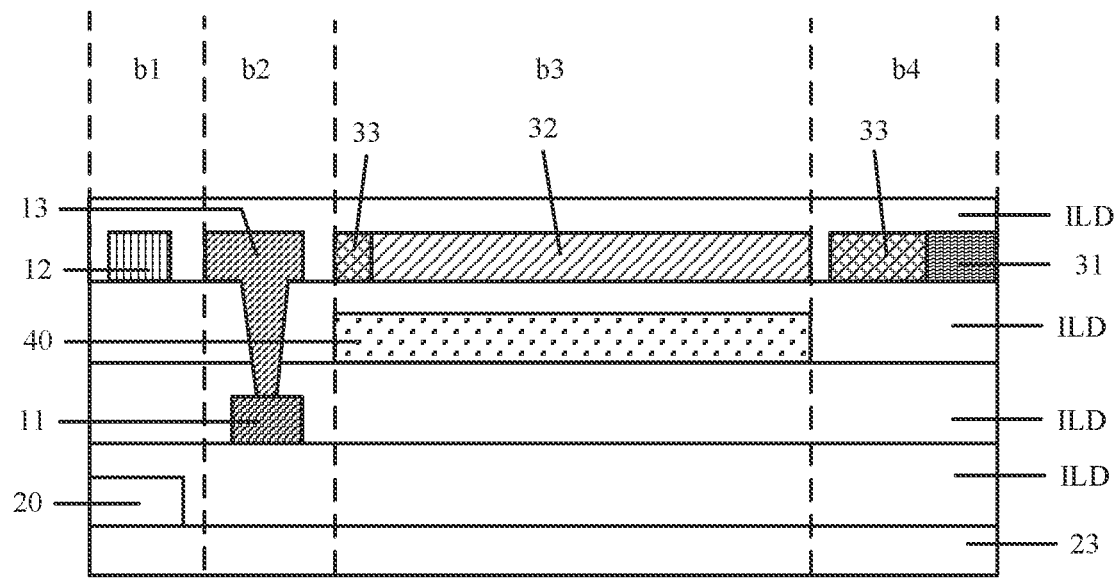
FIG. 16f is a section view along a direction B1-B2 in FIG. 13a according to an embodiment of this application.

A location relationship between the first sub-signal line 11, the second sub-signal line 12, the second signal line 20, the third sub-signal line 31, the fourth sub-signal line 32, and the fourth signal line 40 is as follows:

Alternatively, optionally, as shown in FIG. 16f (a section view along the direction B1-B2 in FIG. 13a), the first sub-signal line 11 and the second sub-signal line 12 are disposed at different layers, and the first sub-signal line 11 and the second signal line 20 are disposed at different layers.

In addition, the third sub-signal line 31 and the fourth sub-signal line 32 are disposed at a same layer as the second sub-signal line 12.

Therefore, when the second sub-signal line 12 is prepared, the third sub-signal line 31 and the fourth sub-signal line 32 may be prepared in a same process, to simply a preparation process. In addition, the third sub-signal line 31 and the fourth sub-signal line 32 are disposed at the same layer as the second sub-signal line 12, so that a quantity of insulation layers and a quantity of conducting layers between layers can be reduced, and the display 2 is lightened and thin.

In this case, the structures of the second sub-signal line 12 and the fourth sub-signal line 32 may be shown in FIG. 13a or FIG. 13c.

A location relationship between the first sub-signal line 11, the second sub-signal line 12, the second signal line 20, the third sub-signal line 31, the fourth sub-signal line 32, and the fourth signal line 40 is as follows:

Alternatively, optionally, the second sub-signal line 12 and the first sub-signal line 11 are disposed at a same layer.

Figure 16G:
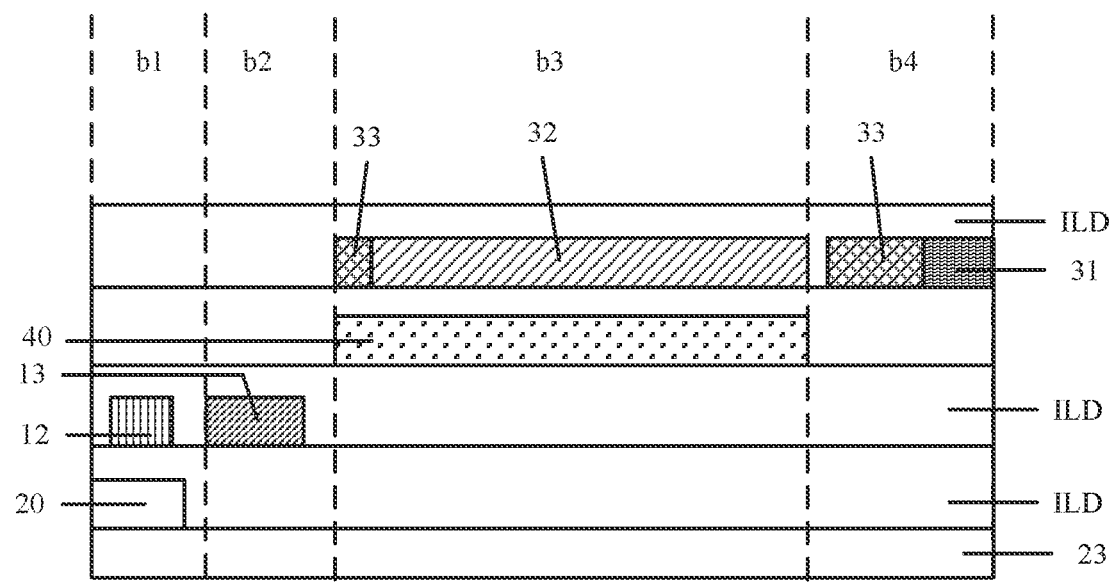
FIG. 16g is a section view along a direction B1-B2 in FIG. 13a according to an embodiment of this application.

When the second sub-signal line 12 and the first sub-signal line 11 are disposed at the same layer, the first connection line 13 is disposed at a same layer as the second sub-signal line 12 and the first sub-signal line 11. That is, as shown in FIG. 16g (a section view along the direction B1-B2 in FIG. 13a), a film layer location at which the first connection line 13 and the second sub-signal line 12 are located is a film layer location at which the first sub-signal line 11 is located.

In addition, the first sub-signal line 11, the second sub-signal line 12, and the second signal line 20 are disposed at different layers from the third sub-signal line 31 and the fourth sub-signal line 32.

In this case, the structures of the second sub-signal line 12 and the fourth sub-signal line 32 may be shown in FIG. 13a to FIG. 13d.

The descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A display, system comprising:
    a layered structure comprising a substrate;
    at least one first subpixel array disposed on the substrate and comprising:
        a plurality of first light-emitting subpixels; and
        a plurality of transparent subpixels,
            wherein the first light-emitting subpixels and the transparent subpixels are arranged in a mixed manner;
    a plurality of first signal lines disposed on the substrate, wherein the first signal lines are insulated from each other; and
    a plurality of second signal lines disposed on the substrate, wherein the second signal lines are insulated from each other,
    wherein the second signal lines and the first signal lines are extended in a same direction, insulated from each other, and alternately disposed,
    wherein a first signal line group comprises one first signal line and one second signal line disposed between adjacent rows of subpixels in the at least one first subpixel array, and
    wherein portions of the one first signal line and the one second signal line overlap in a region in which a corresponding transparent subpixel is located.

2. The display system of claim 1, wherein the one first signal line comprises:
    at least one first sub-signal line; and
    at least one second sub-signal line,
    wherein the at least one first sub-signal line and the at least one second sub-signal line are disposed in parallel and are alternately coupled along an extension direction of the one first signal line,
    wherein, in a same first signal line group, a portion of the at least one second sub-signal line on the substrate overlaps an overlaps a portion of the one second signal line on the substrate,
    wherein the at least one second sub-signal line is located in the region, and
    wherein the at least one second sub-signal line and the one second signal line are disposed at first different layers.

3. The display system of claim 2, wherein the at least one second sub-signal line and the at least one first sub-signal line are disposed at second different layers.

4. The display system of claim 3, wherein the at least one first sub-signal line and the one second signal line are disposed at a same layer or at third different layers.

5. The display system of claim 2, wherein the at least one second sub-signal line and the at least one first sub-signal line are disposed at a same layer, and wherein, in the same first signal line group, a portion of the at least one first sub-signal line on the substrate and a portion of the second signal line on the substrate are disposed side by side.

6. The display system of claim 2 further comprising:
    a plurality of third signal lines insulated from each other; and a plurality of fourth signal lines insulated from each other,
wherein the third signal lines and the fourth signal lines are disposed in parallel, insulated from each other, and alternately disposed on the substrate,
wherein the at least one second sub-signal line is disposed at a same layer as the third signal lines or the fourth signal lines, and
wherein the one first signal line intersects the third signal lines.

7. The display system of claim 2 further comprises comprising:
a plurality of third signal lines insulated from each other; and
a plurality of fourth signal lines insulated from each other,
wherein the third signal lines and the fourth signal lines are extended in a same direction, insulated from each other, and alternately disposed on the substrate,
wherein a second signal line group is disposed between the adjacent rows and comprises one third signal line and one fourth signal line,
wherein portions of the one third signal line and the one fourth signal line on the substrate overlap in the region, and
wherein the one first signal line intersects the one third signal line.

8. The display system of claim 7, wherein the one third signal line comprises:
at least one third sub-signal line; and
at least one fourth sub-signal line,
wherein the at least one third sub-signal line and the at least one fourth sub-signal line are disposed in parallel and alternately coupled along an extension direction of the one third signal line,
wherein, in a same second signal line group, a portion of the at least one fourth sub-signal line on the substrate overlaps a portion of the one fourth signal line on the substrate,
wherein the at least one fourth sub-signal line is located in the region, and
wherein the at least one fourth sub-signal line and the one fourth signal line are disposed at second different layers.

9. The display system of claim 8, wherein the at least one fourth sub-signal line and the at least one third sub-signal line are disposed at third different layers.

10. The display system of claim 9, wherein the at least one third sub-signal line and the one fourth signal line are disposed at a same layer or at fourth different layers.

11. The display system of claim 8, wherein the at least one fourth sub-signal line and the at least one third sub-signal line are disposed at a same layer, and wherein, in the same second signal line group, a portion of the at least one third sub-signal line on the substrate and a portion of the fourth signal line on the substrate are disposed side by side.

12. The display system of claim 8, wherein each of the at least one fourth sub-signal line is located in the region, wherein adjacent fourth sub-signal lines of the at least one fourth sub-signal line are coupled through the at least one third sub-signal line, and wherein a portion of the one first signal line on the substrate does not overlap the fourth sub-signal line on the substrate and crosses a portion of the at least one third sub-signal line on the substrate.

13. The display system of claim 12, wherein the at least one fourth sub-signal line and the one second signal line are disposed at a same layer.

14. The display system of claim 8, wherein the at least one fourth sub-signal line is disposed at a different layer from the one first signal line and the one second signal line, and wherein the at least one fourth sub-signal line penetrates, along an extension direction of the at least one fourth sub-signal line, the region.

15. The display system of claim 8, wherein each of the at least one second sub-signal line is located in the region, wherein the at least one first sub-signal line crosses a boundary between two adjacent transparent subpixels, and wherein portion of the one third signal line on the substrate or a portion of the fourth signal line on the substrate does not overlap the second sub-signal line on the substrate and crosses the at least one first sub-signal line on the substrate.

16. The display system of claim 15, wherein the at least one second sub-signal line is disposed at a same layer as the one third signal line or the one fourth signal line when the one first signal line comprises the at least one first sub-signal line and the at least one second sub-signal line.

17. The display system of claim 7, wherein the at least one second sub-signal line is disposed at a different layer from the one third signal line and the one fourth signal line when the one first signal line comprises the at least one first sub-signal line and the at least one second sub-signal line, and wherein the at least one second sub-signal line penetrates, along an extension direction of the at least one second sub-signal line, the region.

18. The display system of claim 7, wherein the one first signal line and the one third signal line are mutually a grid line and a data line.

19. The display system of claim 1, wherein the first light-emitting subpixels are grouped into a plurality of light-emitting pixels, wherein each of the light-emitting pixels comprises at least three first light-emitting subpixels that are adjacent to each other and that are respectively used to display three primary colors, wherein the transparent subpixels are grouped into a plurality of transparent pixels, wherein a quantity of transparent subpixels comprised in each of the transparent pixels is equal to a quantity of first light-emitting subpixels comprised in one light-emitting pixel, wherein a plurality of transparent subpixels in a same transparent pixel are adjacent to each other, and wherein in the at least one first subpixel array, the light-emitting pixels and the transparent pixels are arranged in a mixed manner.

20. A terminal comprising:
a display comprising:
a back;
a layered structure comprising a substrate;
at least one first subpixel array disposed on the substrate and comprising:
a plurality of first light-emitting subpixels; and
a plurality of transparent subpixels,
wherein the first light-emitting subpixels and the transparent subpixels are arranged in a mixed manner;
a plurality of first signal lines disposed on the substrate, wherein the first signal lines are insulated from each other; and
a plurality of second signal lines disposed on the substrate, wherein the second signal lines are insulated from each other,
wherein the second signal lines and the first signal lines are extended in a same direction, insulated from each other, and alternately disposed,
wherein a first signal line group comprising one first signal line and one second signal line is disposed between adjacent rows of subpixels in the at least one first subpixel array, and wherein a portion of the one first signal line and the one second signal line on the substrate overlap in a first region in which a corresponding transparent subpixel is located; and an optical component disposed on the back, and comprising:

a light-receiving surface facing the display, wherein a portion of the optical component on the display is located in a second region in which the at least one first subpixel array is located.

* * * * *